United States Patent
Iwata

(10) Patent No.: US 6,947,315 B2
(45) Date of Patent: Sep. 20, 2005

(54) MAGNETIC RANDOM ACCESS MEMORY DEVICE HAVING WRITE TEST MODE

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 10/702,662

(22) Filed: Nov. 7, 2003

(65) Prior Publication Data

US 2004/0196693 A1 Oct. 7, 2004

(30) Foreign Application Priority Data

Apr. 4, 2003 (JP) ........................................ 2003-101715

(51) Int. Cl.[7] .............................................. G11C 11/00
(52) U.S. Cl. ........................ 365/158; 365/171; 365/173
(58) Field of Search ................................. 365/158, 171, 365/173, 189.01, 230.06

(56) References Cited

U.S. PATENT DOCUMENTS

| | | | |
|---|---|---|---|
| 6,097,626 A | 8/2000 | Brug et al. | |
| 6,111,783 A | 8/2000 | Tran et al. | |
| 6,163,477 A | 12/2000 | Tran | |
| 6,252,795 B1 | 6/2001 | Hansen et al. | |
| 6,272,040 B1 | 8/2001 | Salter et al. | |
| 6,314,020 B1 | 11/2001 | Hansen et al. | |
| 6,711,053 B1 * | 3/2004 | Tang | 365/158 |

OTHER PUBLICATIONS

M. Durlam, et al., "Nonvolatile RAM based on Magnetic Tunnel Junction Elements", 2000 IEEE ISSCC Digest of Technical Papers, ISSCC 2000/ Session 7/ TD: Emerging Memory & Device Technologies/ Paper TA 7.3, Feb. 2000, pp. 130–131, 96–97, 410–411.

Roy Scheuerlein, et al., "A 10ns Read and Write Non–Volatile Memory Array Using a Magnetic Tunnel Junction and FET Switch in each Cell", 2000 IEEE ISSCC Digest of Technical Papers, ISSCC 2000/ Session 7/ TD: Emerging Memory & Device Technologies/ Paper TA 7.2, Feb. 2000, pp. 128–129, 94–95, 409–410.

* cited by examiner

Primary Examiner—David Lam
(74) Attorney, Agent, or Firm—Oblon, Spivak, McClelland, Maier & Neustadt, P.C.

(57) ABSTRACT

Magnetoresistive elements as memory cells are two-dimensionally arranged. To write data in magnetoresistive elements, selected memory cells are subjected to current magnetic fields generated by a current in a row direction and current magnetic fields generated by a current in a column direction. A setting circuit holds set values used to set a write current, in order to vary the magnitudes of magnetic field in the row and column direction between a write test mode period and a normal operation period. In the write test mode, the value of a write current flowing through write interconnects is set on the basis of the set values held in the setting circuit.

30 Claims, 35 Drawing Sheets

PARALLEL
(SMALLER RESISTANCE)

ANTI-PARALLEL
(LARGER RESISTANCE)

TO FIRST MRAM DATA REWRITE CONTROLLER

MAGNETIC RANDOM ACCESS MEMORY DEVICE HAVING WRITE TEST MODE

CROSS-REFERENCE TO RELATED APPLICATIONS

This application is based upon and claims the benefit of priority from the prior Japanese Patent Application No. 2003-101715, filed Apr. 4, 2003, the entire contents of which are incorporated herein by reference.

BACKGROUND OF THE INVENTION

1. Field of the Invention

The present invention relates to an MRAM (Magnetic Random Access Memory) device, and in particular, to a write test mode in an MRAM device which uses magnetic memory cells each composed of an element that stores "1"/"0" information on the basis of the tunneling magnetoresistive effect.

2. Description of the Related Art

In recent years, a large number of memories have been proposed which store information on the basis of new principles. One of them is a non-volatile and high-speed MRAM device having magnetic memory cells arranged in a matrix and each composed of a magnetic tunnel junction (hereinafter referred to as an "MTJ") element that stores "1"/"0" information using the tunneling magnetoresistive effect. Such an MRAM device is disclosed in, for example, Roy Scheuerlein et. al. "A 10 ns Read and Write Non-Volatile Memory Array Using a Magnetic Tunnel Junction and FET Switch in each Cell", ISSCC2000 Technical Digest pp. 128 to pp. 129.

In the conventional MRAM device, chips or cell arrays may have different MTJ element switching characteristics or different asteroid curves owing to manufacturing variations. Owing to these various switching characteristics, writes may be disabled if the asteroid curves for the MTJ elements are distorted, i.e. if the asteroid curves are asymmetric with respect to the X and Y axes by the positional relationship between write lines and the MTJ elements, the asymmetric MTJ plane shape with respect to the X and Y axes, the each thickness variation of the MTJ component materials, etc.

Furthermore, with the conventional MRAM device, cells that have barely passed a write test may reject writes during actual operations. Desirably, the cells that barely pass a write test can be detected during the test.

BRIEF SUMMARY OF THE INVENTION

According to an aspect of the present invention, there is provided a magnetic random access memory device including a first memory cell array in which a plurality of memory cells two-dimensionally arranged in a row direction and a column direction and each composed of a magnetoresistive effect element, a write circuit that writes data in the memory cells by causing a first current to flow along the row direction of the first memory cell array to generate magnetic fields in the row direction and causing a second current to flow along the column direction of the first memory cell array to generate magnetic fields in the column direction, and a control circuit connected to the write circuit to control the write circuit so that, one of a plurality of set values for the first current flowing along the row direction and one of a plurality of set values for the second current flowing along the column direction are selected so as to allow the first and second currents to flow in accordance with the selected set values, respectively.

DETAILED DESCRIPTION OF THE INVENTION

Embodiments of the present invention will be described below with reference to the drawings.

Figure 1:
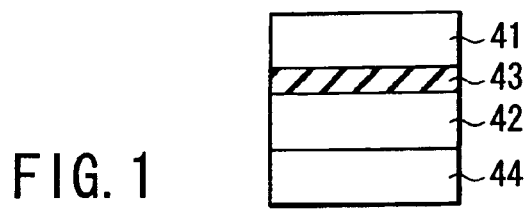
FIG. 1 is a sectional view schematically showing the structure of an MTJ element in an MRAM device.

FIG. 1 schematically shows the sectional structure of an MTJ element used in an MRAM device.

The MTJ element has a structure in which one nonmagnetic layer (tunnel barrier layer) 43 sandwiched between two magnetic layers (a ferromagnetic layer) 41 and 42. The MTJ element stores "1" or "0" information depending on whether the orientations of magnetization in the two magnetic layers 41 and 42 are parallel or anti-parallel.

Typically, an anti-ferromagnetic layer 44 is arranged adjacent to one of the two magnetic layers 41 and 42, e.g. the magnetic layer 42. The anti-ferromagnetic layer 44 is a member that fixes the orientation of the magnetization in the magnetic layer 42 so as to allow information to be easily rewritten by changing only the orientation of the magnetization in the magnetic layer 41. Here, the magnetic layer 41 with variable magnetization is called a "free layer (or recording layer)". The magnetic layer 42 with fixed magnetization is called a "fixed layer (or pinned layer)".

Figure 2A:
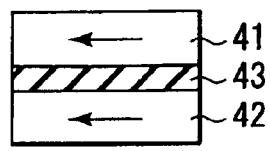
FIGS. 2A and 2B are sectional views illustrating two states of the orientation of magnetization in two magnetic layers in the MTJ element in FIG. 1.
Figure 2B:
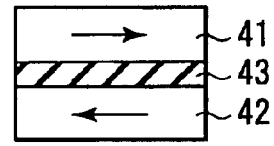

FIGS. 2A and 2B show two states of the orientations of magnetization in the two magnetic layers 41 and 42 in the MTJ element shown in FIG. 1.

If the orientations of magnetization (the directions of arrows in the figure) in the two magnetic layers 41 and 42 are parallel (the same) as shown in FIG. 2A, the tunnel resistance of the tunnel barrier film 43, sandwiched between the magnetic layers 41 and 42, is lowest (a tunnel current is highest).

If the orientations of magnetization in the two magnetic layers 41 and 42 are anti-parallel as shown in FIG. 2B, the tunnel resistance of the tunnel barrier film 43, sandwiched between the magnetic layers 41 and 42, is highest (a tunnel current is lowest).

In the MRAM device, the two states in which the MTJ element has different resistance values correspond to the state in which "1" information is stored (a "1" state) and the state in which "0" information is stored (a "0" state), respectively.

Figure 3:
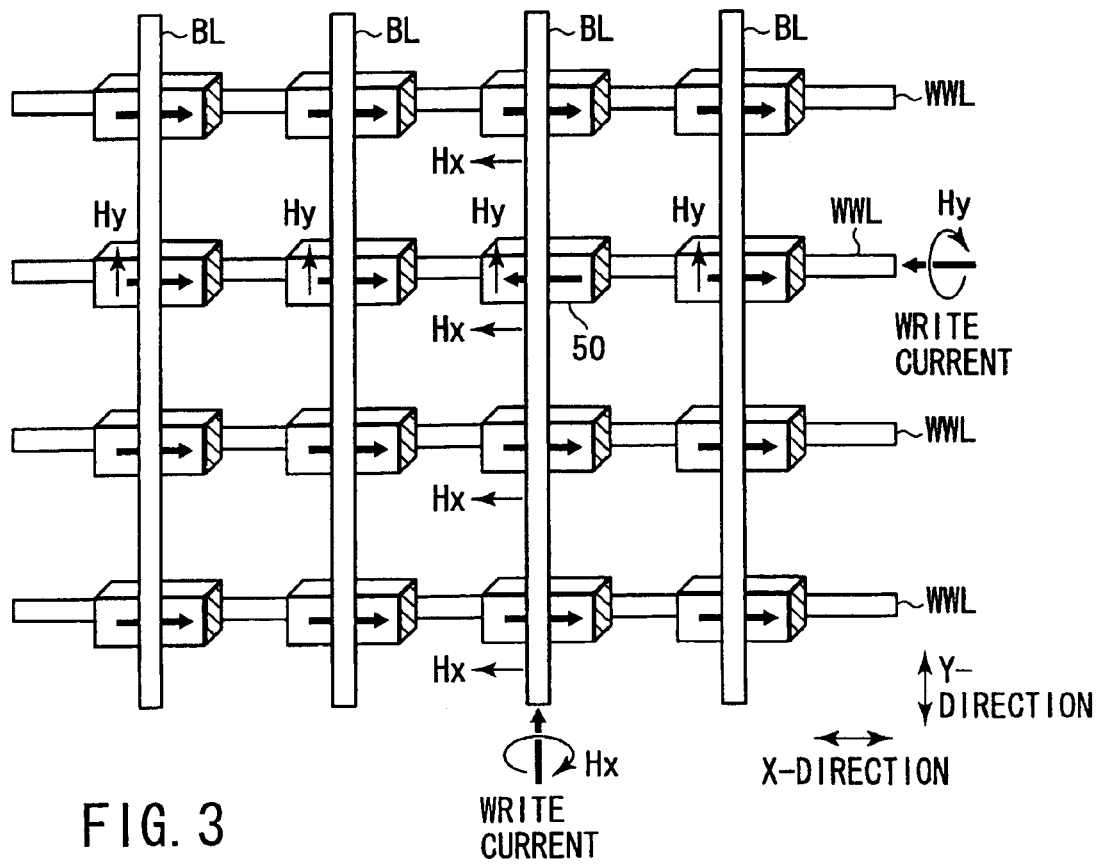
FIG. 3 is a perspective view schematically showing an example of a planar layout of a cell array of MRAMs.

FIG. 3 schematically shows an example of a planar layout of a cell array in which a plurality of MRAMs is arranged.

A plurality of write/read bit lines BL and a plurality of write word lines WWL are disposed so as to cross at right angles. MTJ elements 50 are disposed at the respective intersection points between the bit lines and the write word lines. Each MTJ element 50 is shaped like a rectangle the long sides of which extend along the write word lines WWL and the short sides of which extend along the bit lines BL. Magnetization is directed along the long sides of the rectangle. Each bit line BL is connected to the fixed layers of a plurality of MTJ elements 50 in the same row (or column). Each write word line WWL is arranged adjacent and close to the free layers of a plurality of MTJ elements in the same column (or row).

Figure 4:
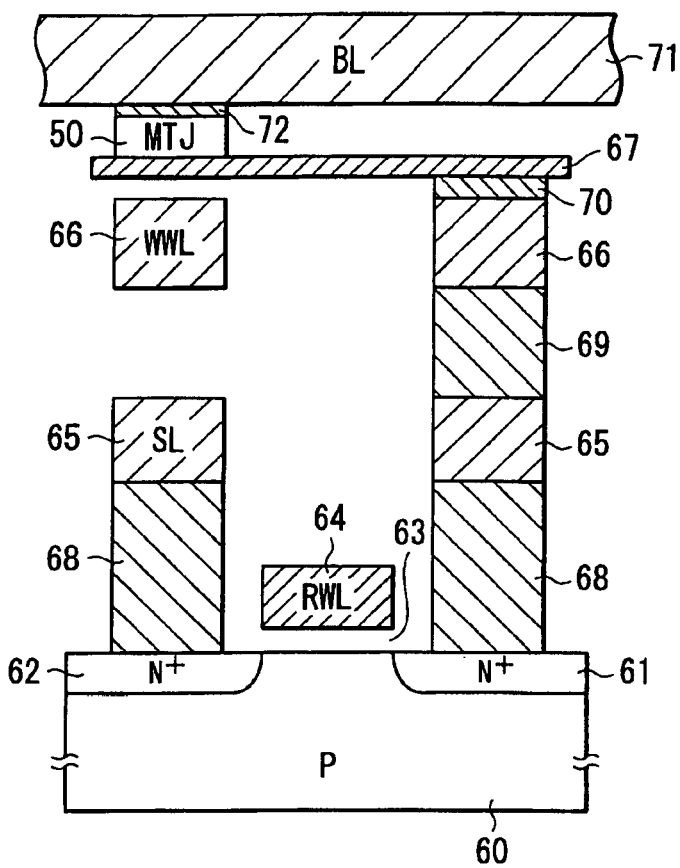
FIG. 4 sectional view showing an example of the structure of one memory cell in a cross section perpendicular to write lines in FIG. 3.

FIG. 4 is a sectional view showing an example of the structure of one memory cell in a cross section perpendicular to the write word lines. In this case, the memory cell is constructed by connecting an NMOS transistor as a read cell selection switch element in series with each MTJ element 50 in FIG. 3.

In FIG. 4, an impurity diffusion layer ($N^+$) that composes a drain region 61 or a source region 62 is formed in a surface layer of a semiconductor substrate (for example, a P-type Si substrate). A gate electrode 64 is formed on a channel region via a gate oxide film 63. Reference numerals 65 and 66 denote a first metal interconnect layer and a second metal interconnect layer, respectively. Reference numeral 67 denotes an MTJ connecting interconnect composed of a third metal interconnect layer. Reference numeral 68 denotes a contact that electrically connects the first metal interconnect layer 65 to the impurity diffusion layer ($N^+$). Reference numeral 69 denotes a contact that electrically connects the second metal interconnect layer 66 to the first metal interconnect layer 65. Reference numeral 70 denotes a contact that electrically connects the third metal interconnect layer 67 to the second metal interconnect layer 66. Reference numerals 50 and 71 denote an MTJ element and a fourth interconnect layer, respectively. Reference numeral 72 denotes a contact that electrically connects a fourth metal interconnect layer 71 to the MTJ element 50. An interlayer insulating film is formed between each pair of interconnect layers.

In FIG. 4, in connection with the applications of interconnects, reference characters BL, WWL, SL, and RWL denote a write/read bit line, a write word line, a source line, and a read word line, respectively. The source line SL is connected to a ground potential.

Now, with reference to FIGS. 3 and 4, description will be given of the principle of an operation of writing data in the MTJ element 50.

A write to the MTJ element 50 is achieved by conducting currents through the corresponding write word line WWL and bit line BL and using magnetic fields generated by the currents conducting through both interconnects to make the orientations of magnetization in the MTJ element 50 parallel or anti-parallel.

Specifically, when information is written in the MTJ element 50, a current flowing in a first direction or second direction opposite to the first direction depending on write data is conducted through the bit lines BL to generate a magnetic field Hx. On the other hand, only a current flowing through a fixed direction is conducted through the write word lines WWL to generate a magnetic field Hy. Thus, a combined magnetic field is generated to write information in the selected MTJ element 50. On this occasion, when a current flowing in the first direction is conducted through the bit line BL, the orientations in magnetization in the MTJ element are parallel. When a current flowing in the second direction is conducted through the bit line BL, the orientations in magnetization in the MTJ element are anti-parallel.

To read information from the selected MTJ element 50, the corresponding read word line RWL is activated to turn on only the switch element connected to the selected MTJ element. Thus, a current path is created. Then, a current is conducted through the selected bit line BL to the ground potential. As a result, only through the selected MTJ element 50, a current based on its resistance values flows. Information is read by detecting the current value.

Then, with reference to FIGS. 5 and 6, brief description will be given of a mechanism that varies the orientations of magnetization in the MTJ element.

Figure 5:
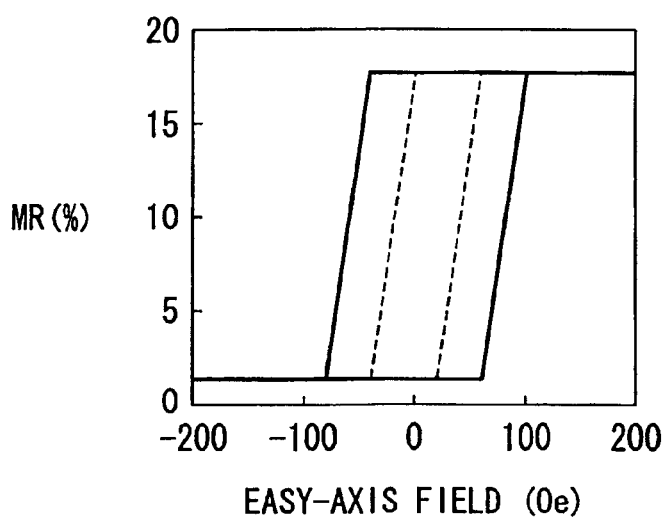
FIG. 5 is a characteristic diagram showing a TMR characteristics curve for the MTJ element.

FIG. 5 shows a TMR characteristics curve of the magnetic field applied of the MTJ element and the resistance value of the MTJ element. FIG. 6 shows an asteroid curve of the MTJ element.

As shown in the curve in FIG. 5, when the magnetic field Hx is applied to the MTJ element in an easy-axis direction, the resistance value of the MTJ element changes, by, e.g., approximately 17%. This change rate, i.e., a ratio of the resistance difference between two states and the parallel state resistance is referred to as an "MR ratio". The MR ratio varies depending on the properties of the magnetic layer in the MTJ element. At present an MTJ element has the MR ratio of approximately 50% is available. The MTJ element is subjected to a magnetic field obtained by combining the magnetic field Hx in the easy-axis direction with the magnetic field Hy in the hard-axis direction.

As shown by the solid and dotted lines in FIG. 5, the magnitude of the magnetic field Hx in the easy-axis direction required to change the resistance value of the MTJ element also varies depend on the magnitude of the magnetic field Hy in the hard-axis direction. In the memory cells arranged as an array, this phenomenon is utilized to write data only in the MTJ element arranged at the intersection point between the selected write word line WWL and the selected bit line BL.

Figure 6:
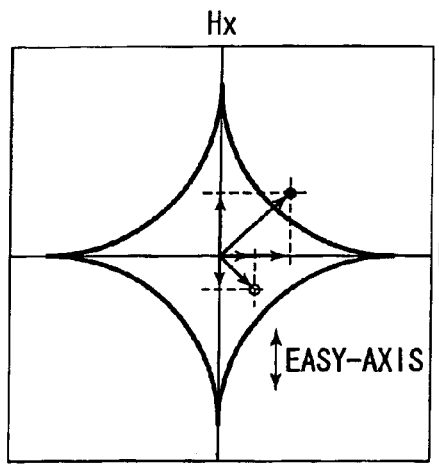
FIG. 6 is a characteristic diagram showing a symmetrical asteroid curve for the MTJ element.

Specifically, as shown in FIG. 6, the orientation of the magnetization in the magnetic field of the MTJ element can be switched if the magnitude of the combined magnetic field of the magnetic field Hx in the easy-axis direction and the magnetic field Hy in the hard-axis direction is located outside the asteroid curve, e.g. at the solid point in the figure.

In contrast, the orientation of the magnetization in the magnetic field of the MTJ element cannot be switched if the magnitude of the combined magnetic field of the magnetic field Hx in the easy-axis direction and the magnetic field Hy in the hard-axis direction is located inside the asteroid curve, e.g. at the hollow point in the figure.

Consequently, data writes to the MTJ element can be controlled by varying the magnitude of the combined magnetic field of the magnetic field Hx in the easy-axis direction and the magnetic field Hy in the hard-axis direction and varying the position of the magnitude of the combined magnetic field.

On the other hand, with only the magnetic field Hx in the easy-axis direction, i.e. only the magnetic field Hx induced by the write bit line current or only the magnetic field Hy in the hard-axis direction, i.e. only the magnetic field Hy induced by the write word line current, the magnitude of the magnetic field is not located outside the asteroid curve. Consequently, writes are disabled.

Data can be easily read from the MTJ element by conducting a current through the MTJ element and detecting the resistance value of the MTJ element. For example, switch elements are connected in series with the MTJ elements. Then, only the switch element connected to the selected read word line is turned on to create a current path. As a result, a current flows only through the selected MTJ element. Therefore, data can be read from this MTJ element.

For write operations in the MRAM, it is necessary to write always accurately write data in the MTJ element, i.e. to stabilize a write characteristic. The stabilized write characteristic is important particularly if the data stored in the MTJ element is different from the write data. In such a case, the magnetization state of the storage layer of the MTJ element, i.e. the orientation of the magnetization must be stably switched.

As shown in FIG. 6, if the asteroid curve is symmetric with respect to the X and Y axes, the orientation of the magnetization in the free layer (storage layer) of the MTJ element can be switched using a specified combined magnetic field required to switch the magnetization, regardless of the direction of the switching (upward or downward).

However, it is practically difficult that for all memory cell arrays in all manufactured chips, i.e. chips taken from the same or different wafers or for all MTJ elements within each memory cell array, the MTJ elements have the same asteroid curve, i.e. same size and an asteroid curve symmetric with respect to the X and Y axes.

Actually, for example, as shown in FIGS. 7 to 10, the asteroid curve for the MTJ element varies with chips, memory cell arrays, word lines/bit lines, or MTJ elements. That is, the asteroid curves are asymmetric with respect to the X and Y axes.

In this case, when the combined magnetic field Hx+Hy, used to switch the magnetization, has a fixed magnitude, the magnitude of the combined magnetic field Hx+Hy cannot lie outside of the asteroid curve depending on the direction in which the orientation of the magnetization is switched. Accordingly, the orientation of the magnetization in the MTJ element may not be switched.

The cause of the asymmetry of the asteroid curve for the MTJ element with respect to the X and Y axes may be various variations resulting from a manufacturing process, for example, variations in the shape of the MTJ element and in the thickness/composition of the magnetic layer of the MTJ element as described below in detail.

Even if all MTJ elements are designed to have the same shape, their shapes are actually slightly different from one another because of manufacturing variations.

The shape of the MTJ element determines the magnitude of a magnetic domain and the intensity of a demagnetizing field, i.e. a magnetic field which is generated within a magnetic substance and which acts in an orientation opposite to that of external magnetic fields. Thus, if the MTJ elements have different shapes, the magnitude of the magnetic domain or the intensity of the demagnetizing field varies with the MTJ elements. That is, the intensity of the magnetic field required to switch the orientation of the magnetization in the MTJ element varies with the MTJ elements. Accordingly, the asteroid curves for the MTJ elements are asymmetric with respect to the X and Y axes.

As the thickness of the magnetic layer (free layer or fixed layer) increases, a more intense magnetic field is required to switch the orientation of the magnetization. That is, a variation in the thickness of the magnetic layer among the MTJ elements may make the corresponding asteroid curves asymmetric with respect to the X and Y axes.

At present, a magnetic material constituting the free layer (storage layer) in the MTJ element is commonly composed of an alloy consisting of metal included an iron group (Fe, Ni, Co, and the like). However, the alloy may vary in composition.

If the alloy constituting the free layer of the MTJ element varies in composition, the MTJ elements have different types of saturation magnetization. Further, the alloy constituting the free layer of the MTJ element commonly has a polycrystal structure. When the crystal axis has a marked magnetic anisotropy, it is very difficult to make the asteroid curves for all the MTJ elements symmetric with respect to the X and Y axes.

Even if the asteroid curves for all the MTJ elements are symmetric with respect to the X and Y axes, if the positional relationship between the write line and the MTJ element varies with the MTJ elements, then writes may be disabled. That is, even if the required combined magnetic field is applied to the MTJ element, the orientation of the magnetization in the free layer of the MTJ element may not be switched.

Specifically, even if in a design stage, the minimum value of a write current that generates a magnetic field required to switch the orientation of the magnetization is determined on the basis of the ideal shape of the MTJ element and the ideal positional relationship between the write line and the MTJ element, writes may be disabled if in a manufacturing stage, the misalignment of a mask varies of the positional relationship between the write line and the MTJ element.

As described above, with the MRAM device, the asteroid curves getting by applying uniform magnetic fields for some MTJ elements are asymmetric with respect to the X and Y axes owing to a variation in the shape of the MTJ element or in its thickness/composition. Further, even if the asteroid curves getting by applying uniform magnetic fields are symmetric with respect to the X and Y axes, writes may be disabled owing to a variation in the positional relationship between the write line and the MTJ element. Such a phenomenon occurred frequency in the beginning of the development of the MRAM.

If for example, the write current is increased to increase the magnitude of the generated magnetic field in order to solve the above problem, a write can be successfully executed on a selected cell. However, this may induce miswrites to adjacent cells. This will be described below with reference to FIGS. 7 to 15, showing actual asteroid curves for the MTJ element.

Figure 7:
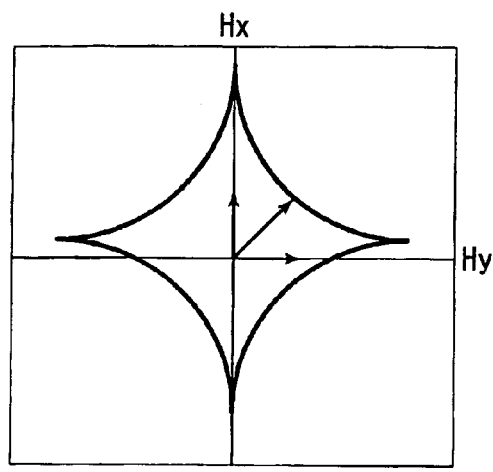
FIG. 7 is a characteristic diagram showing, as an example of an actual asteroid curve for the MTJ element, an asymmetrical asteroid curve that is offset in an easy axis direction.
Figure 11:
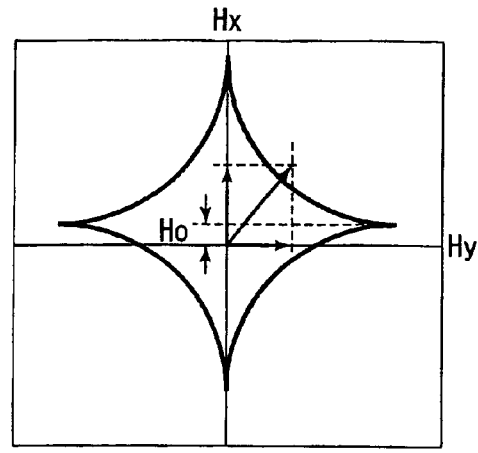
FIG. 11 is a characteristic diagram showing an asymmetrical asteroid curve that is offset in the easy axis direction, wherein a write current is increased so as to cancel an amount of magnetic fields corresponding to the offset.

If the asteroid curve is shifted in the easy-axis direction and is asymmetric as shown in FIG. 7, a write to a selected cell can be successfully accomplished by increasing the write current so as to cancel an amount of magnetic field corresponding to this offset to increase the magnitude of the generated magnetic field as shown in FIG. 11.

Figure 8:
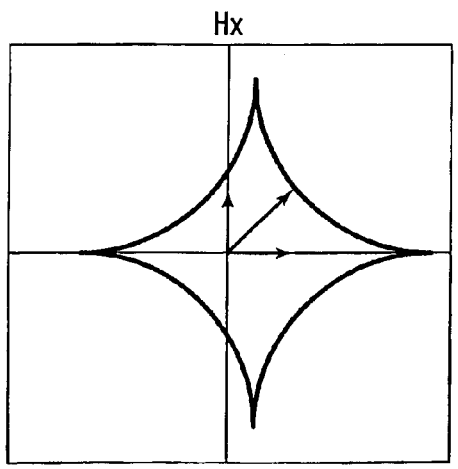
FIG. 8 is a characteristic diagram showing, as an example of an actual asteroid curve for the MTJ element, an asymmetrical asteroid curve that is offset in a hard axis direction.
Figure 12:
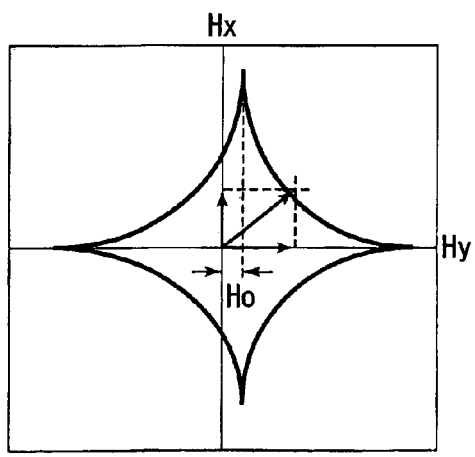
FIG. 12 is a characteristic diagram showing an asymmetrical asteroid curve that is offset in both the easy and hard axis directions, wherein the write current is increased so as to increase the magnitude of the magnetic fields in both directions.

If the asteroid curve is shifted in the hard-axis direction and is asymmetric as shown in FIG. 8, a write to a selected cell can be successfully accomplished by increasing the write current so as to cancel an amount of magnetic field corresponding to this offset to increase the magnitude of the generated magnetic field as shown in FIG. 12.

Figure 9:
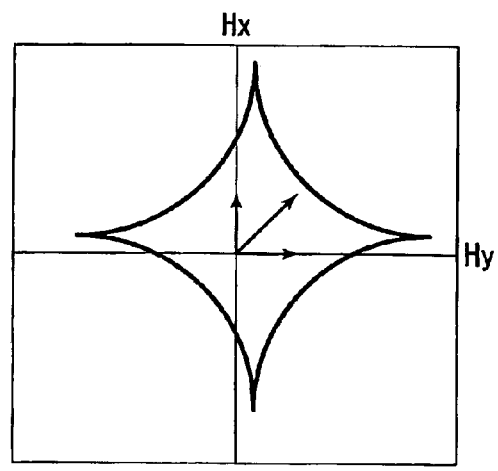
FIG. 9 is a characteristic diagram showing, as an example of an actual asteroid curve for the MTJ element, an asymmetrical asteroid curve that is offset in both the easy and hard axis directions.

If the asteroid curve is shifted in both the easy-axis and hard-axis directions and is asymmetric as shown in FIG. 9, a write to a selected cell can be successfully accomplished by increasing the write current so as to cancel an amount of magnetic field corresponding to this offset to increase the magnitude of the generated magnetic field as shown in FIGS. 11 and 12.

Figure 10:
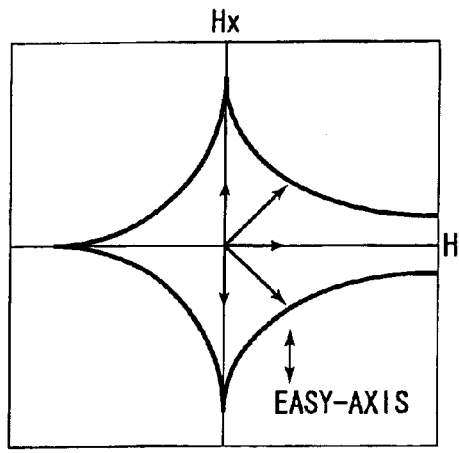
FIG. 10 is a characteristic diagram showing a distorted asymmetrical asteroid curve as an example of an actual asteroid curves for the MTJ element.
Figure 13:
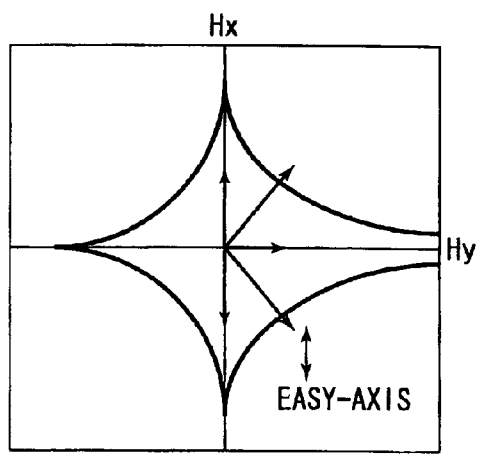
FIG. 13 is a characteristic diagram showing an asymmetrical asteroid curve distorted in the hard axis direction, wherein the write current is increased so as to increase the magnitude of the magnetic field in the easy axis direction.

If the asteroid curve is distorted so as to open in the hard-axis direction and is asymmetric as shown in FIG. 10, a write to a selected cell can be successfully accomplished by increasing the write current so as to increase the magnitude of the magnetic field in the easy-axis direction, thus increasing the magnitude of the generated magnetic field, as shown in FIG. 13.

Figure 14:
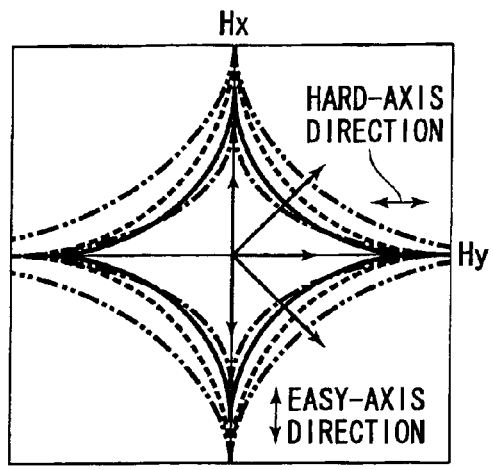
FIG. 14 is a characteristic diagram showing symmetrical asteroid curves which are not offset in the easy or hard axis direction but which vary in size and shape, wherein the write current is increased to increase the magnitude of a magnetic field generated.

On the other hand, if the asteroid curve is not offset in the easy-axis or hard-axis direction and is symmetric with variations in the size and shape of the curve as shown in FIG. 14, a write to a selected cell can be successfully accomplished by increasing the write current and thus the magnitude of the generated magnetic field.

Figure 15:
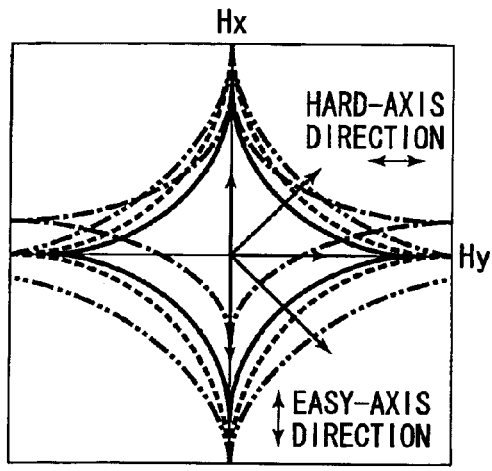
FIG. 15 is a characteristic diagram showing asymmetrical asteroid curves which are offset in the easy axis and vary in size and shape or which are distorted so as to be open in the hard axis direction, wherein the write current is increased to increase the magnitude of a magnetic field generated.

On the other hand, if the asteroid curve is offset in the easy-axis direction and is asymmetric owing to variations in the size and shape of the curve or such a distortion as makes the curve open in the hard-axis direction as shown in FIG. 15, a write to a selected cell can be successfully accomplished by increasing the write current and thus the magnitude of the generated magnetic field.

Furthermore, for cells with asteroid curves such as those by the alternate long and short dash lines in FIGS. 14 and 15, the magnetic field Hy in the hard-axis direction or the magnetic field Hx in the easy-axis direction alone causes the magnitude of the generated magnetic field to lie outside the asteroid curve to switch the magnetization. That is, the magnetic field resulting from only the word line current or the bit line current causes a write. Accordingly, a write state is established by selecting only one of the word and bit lines.

Here, it is assumed that a cell such as the one shown in FIG. 3 is arranged on a two-dimensional array. Then, for some cells of the cell array, no currents flow through the corresponding write bit line BL, i.e. the write bit line BL has not been selected, but a current flows through the corresponding write word line WWL. In this case, when a magnetic field with its magnitude located outside the asteroid curve is generated using only the current through the write word line WWL, data may disadvantageously be written in half-selected cells not selected using the write bit line BL.

As described above, the write current has its upper and lower limits. No problems occur unless the upper limit value for the magnetic field required for a write exceeds the lower limit value for the magnetic field that may induce miswrites as shown in FIG. 16.

Figure 16:
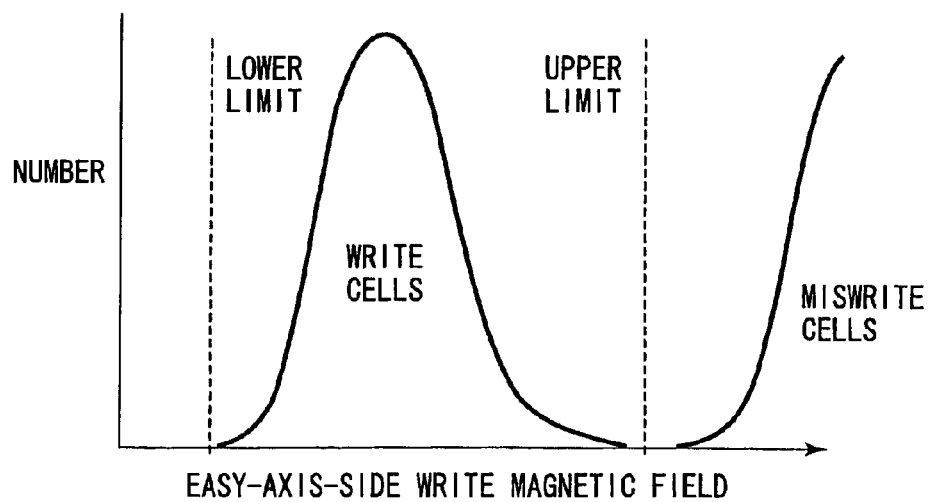
FIG. 16 is a graph showing an example of the relationship between the distribution of the number of cells and both an upper and lower limit values for a write magnetic field for the MTJ element, wherein the maximum value for a magnetic field required for a write is smaller than the minimum value for a magnetic field that induces a miswrite.

FIG. 16 show an example of the relationship between the distribution of the-number of cells and both the upper and lower limit values for the write magnetic field for the MTJ element, wherein the maximum value for the magnetic field required for a write is smaller than the minimum value for the magnetic field that induce a miswrite.

Figure 17:
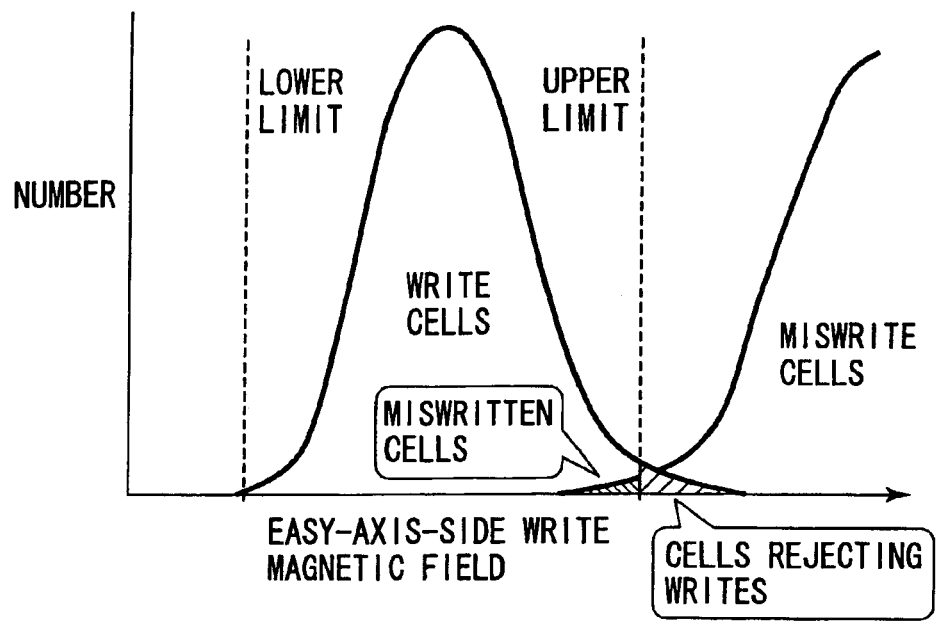
FIG. 17 is a graph showing an example of the relationship between the distribution of the number of cells and both the upper and lower limit values for the write magnetic field for the MTJ element, wherein some cells reject writes or undergo miswrites if a value for the write magnetic field is set between the maximum value for the magnetic field required for a write and the minimum value for the magnetic field that induces a miswrite.

FIG. 17 is a graph showing an example of the relationship between the distribution of the number of cells and both the upper and lower limit values for the write magnetic field for the MTJ element, wherein some cells reject writes or undergo miswrites if a value for the write magnetic field is set between the maximum value for the magnetic field required for a write and the minimum value for the magnetic field that induce a miswrite.

In the case shown in FIG. 17, when the write current value is set (for example, an intermediate value) between the upper limit of the magnetic field required for a write and the lower limit of the magnetic field that induces a miswrite, some cells reject writes or undergo miswrites because of the misalignment between the MTJ element and the interconnect for the write current or a manufacturing variation in the shape of the MTJ element or the like. These cells may be replaced with redundant cells as in the case with conventional memories.

However, if only one set value is used for the write current and if different environments are used for write tests and for actual operations, then the write current may vary between a write test period and an actual operation period. For example, if a spike-like decrease occurs in power voltage during a write, the write current decreases. This disables writes to cells that have barely passed the write test.

Figure 18:
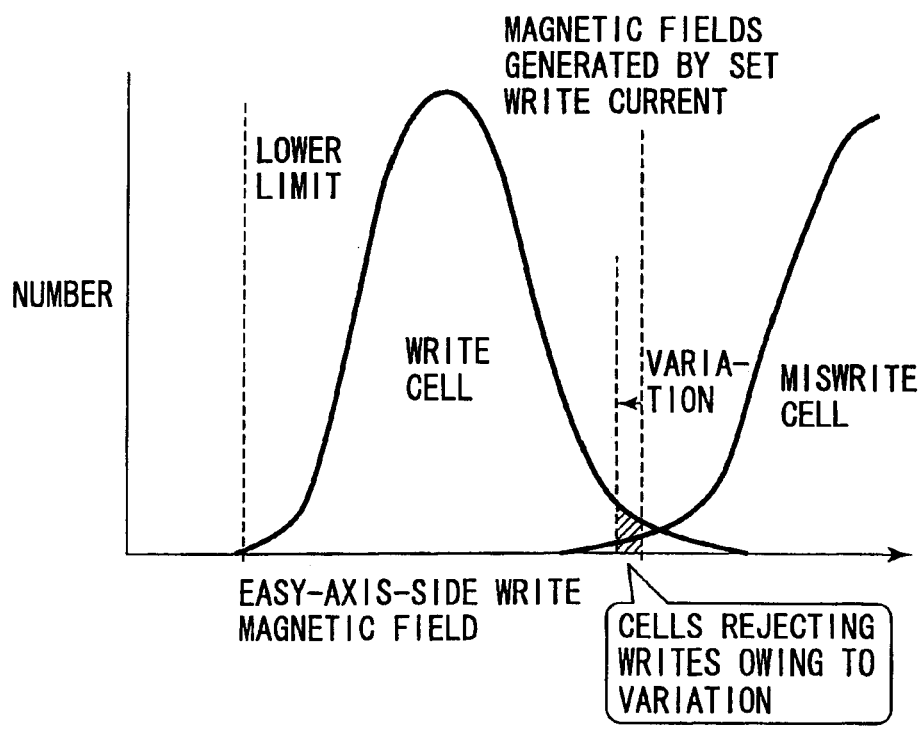
FIG. 18 is a graph showing an example of the relationship between the distribution of the number of cells and both the upper and lower limit values for the write magnetic field for the MTJ element, wherein some cells reject writes if the value for the write magnetic field set for a write test is different from the value for the write magnetic field used during actual operations.

FIG. 18 is a graph showing an example of the relationship between the distribution of the number of cells and both the upper and lower limit values for the write magnetic field for the MTJ element, wherein some cells reject writes if the write magnetic field value set for a write test is different from the write magnetic field value used during actual operations.

MRAM Device According to a First Embodiment

Figure 19:
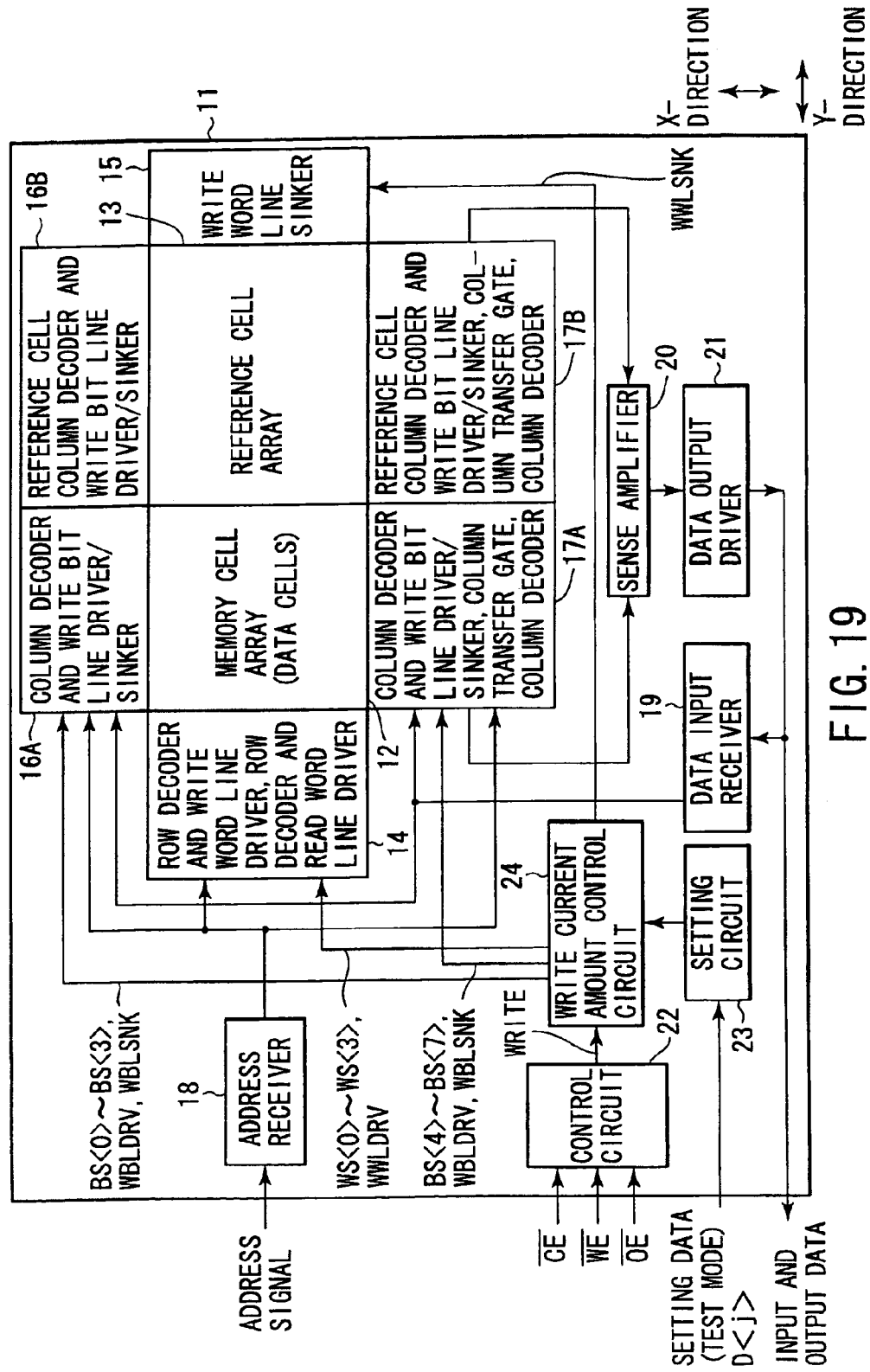
FIG. 19 is a block diagram showing an example of the whole configuration of an MRAM device according to a first embodiment of the present invention.

FIG. 19 shows an example of the whole configuration of an MRAM device according to a first embodiment of the present invention.

An MRAM 11, shown in FIG. 19, may in itself constitute one memory chip or may be one block within a chip which block has a particular function. A memory cell array, i.e. a data cell array 12 has a function of actually storing data. A reference cell array 13 has a function of determining a reference used to determine a value for read data, during a read operation.

A row decoder and driver (row decoder and write word line driver, and row decoder and read word line driver) 14 is arranged at one of the two ends of a cell array in the Y direction, i.e. the easy-axis direction, the cell array being composed of the memory cell array 12 and the reference cell array 13. A write word line sinker 15 is arranged at the other end.

The row decoder and driver 14 has a function of operating during a write to select one of a plurality of write word lines, for a example, on the basis of a row address signal and supplying a write current to the selected write word line. The write word line sinker 15 has a function of operating during a write to, for example, absorb a write current supplied to the selected write word line.

The row decoder and driver 14 has a function of operating during a read to select one of a plurality of read word lines, for example, on the basis of a row address signal and supplying a read current to the selected read word line. A sense amplifier 20 detects this read current to determine read data. In this connection, the plurality of word lines may be integrated with the write word lines.

A column decoder and write bit line driver/sinker 16A is arranged at one of the two ends of the memory array 12 in the X direction, i.e. the hard-axis direction. On the other hand, a column decoder and write bit line driver/sinker (including a column transfer gate and a column decoder) 17A is arranged at the other end.

The column decoder and write bit drivers/sinkers 16A and 17A have a function of operating during a write to select one of a plurality of write bit lines (or data select lines) on the basis of a column address signal and supplying the selected write bit line with a write current having an orientation based on, for example, write data. The column transfer gate and column decoder has a function of operating during a read to connect electrically a data selection line selected by the column address signal to the sense amplifier 20.

A reference cell column decoder and write bit line driver/sinker 16B is arranged at one of the two ends of the reference cell array 13 in the X direction. On the other hand, a reference cell column decoder and write bit line driver/sinkers (including a column transfer gate and a column decoder) 17B is arranged at the other end.

The reference cell column decoder and write bit line drivers/sinkers 16B and 17B have a function storing reference data in the reference cell array 13. The column transfer gate and the column decoder has a function of operating during a read to read reference data from the reference cell array and transfer the data to the sense amplifier 20.

An address receiver 18 receives an address signal and transfers, for example, a row address signal to the row decoder and driver 14, while transferring a column address signal to the column decoder and write bit line drivers/sinkers 16A and 17A. A data input receiver 19 transfers write data to the column decoder and write bit line drivers/sinkers 16A and 17A. Further, a data output driver 21 outputs read data detected by the sense amplifier 20 to equipment located outside the MRAM chip.

A control circuit 22 receives a chip enable signal /CE, a write enable signal /WE, and an output enable signal /OE to control the operation of the whole MRAM. For a write operation, the control circuit 22 provides a write signal WRITE to a write current amount control circuit 24. Further, for a write test operation, the control circuit 22 further generates test mode signals (for example, bMODE1 or MODE2). Those test mode signals are provided to the row decoder and driver 14 and the column decoder and write bit line drivers/sinkers 16A and 17A through the write current amount control circuit 24 or without passing through the write current amount control circuit 24.

On receiving the write signal WRITE, the write current amount control circuit 24 generates a write word line drive signal WWLDRV, a write word line sink signal WWLSNK, a write bit line drive signal WBLDRV, and a write bit line sink signal WBLSNK.

The write word line drive signal WWLDRV is supplied to the row decoder and driver 14. The write word line sink signal WWLSNK is supplied to the write word line sinker 15. The write bit line drive signal WBLDRV and the write bit line sink signal WBLSNK are supplied to the column decoder and write bit line drivers/sinkers 16A and 17A.

A setting circuit 23 has programming element in which setting data used to determine the amount of write word/bit line current is programmed. The programming elements may be composed of, for example, laser blow fuses, MTJ elements, or anti-fuses that destroys a tunnel barrier in MTJ elements.

During a write operation, the setting circuit 23 generates write word line current amount signals WS<0> to WS<3> and write bit line current amount signals BS<0> to BS<7>.

The write word line current amount signals WS<0> to WS<3> are provided to the row decoder and driver 14 through the write current amount control circuit 24 or without passing through the write current amount control circuit 24.

The write bit line current amount signals BS<0> to BS<3> are provided to the column decoder and write bit line driver/sinker 16A through the write current amount control circuit 24 or without passing through the write current amount control circuit 24. The write bit line current amount signals BS<4> to BS<7> are provided to the column decoder and write bit line driver/sinker 17A through the write current amount control circuit 24 or without passing through the write current amount control circuit 24.

The row decoder and driver 14 determines the value of a write current flowing through a write word line selected by a row address signal on the basis of the write word line current amount signals WS<0> to WS<3> when the write word line drive signal WWLDRV is "H", and the write word line sink signal WWLSNK is "H".

The column decoder and write bit line drivers/sinkers 16A and 17A determine the value of a write current flowing through a write bit line selected by a column address signal on the basis of the write word line current amount signals BS<0> to BS<7> when the write bit line drive signal WBLDRV is "H", and the write bit line sink signal WBLSNK is "H".

When a write current is conducted from the write bit line driver/sinker 16A to the write bit line driver/sinker 17A, the write bit line current amount signals BS<0> to BS<3> determine the value of this write bit line current.

When a write current is conducted from the write bit line driver/sinker 17A to the write bit line driver/sinker 16A, the write bit line current amount signals BS<4> to BS<7> determine the value of this write bit line current.

In connection with a current absorption timing for a write current, the potentials across the write word/bit lines can be completely zeroed by, for example, allowing the sink signals WWWSNK and WBLSNK to change from "H" to "L" after the drive signals WWLDRV and WBLDRV have changed from "H" to "L".

In a characteristic examination test mode for an MRAM device configured as described above, a test that examines the characteristics of writes to MTJ elements can be based on, for example, setting data D<j> input through a data input and output terminal. This test is used to determine the write characteristics of the MTJ elements in the memory cell array 12 and thus the values of the write word/bit line currents for normal write operations (the intensity of the combined magnetic field Hx, Hy). In this test mode, the setting data D<j> may be input through an address terminal.

In accordance with the results of the characteristic examination test mode, an operation is subsequently performed to program the setting data. The programming operation programs the results of the characteristic examination test mode, i.e. the values of the write word/bit line currents in the programming elements in the setting circuit 23.

For a programming operation, a program signal changes to "H" to control the value for the setting data D<j>, input through the data input and output terminal or the address terminal. The program signal further programs the values of the write word/bit line currents for normal write operations in the programming elements in the setting circuit 23.

Now, detailed description will be given of the configuration and operation of each portion in FIG. 19.

<Specific Examples of the WL Driver/Sinker and BL Driver/Sinker>

The MRAM device according to the first embodiment has a plurality of set values for the write current. It varies the write current value by using the WL driver/sinker section and the BL driver/sinker section to vary the total of channel widths of driver side MOS transistors. An example will be described below.

(Row Decoder and Write Word Line Driver/Sinker)

Figure 20:
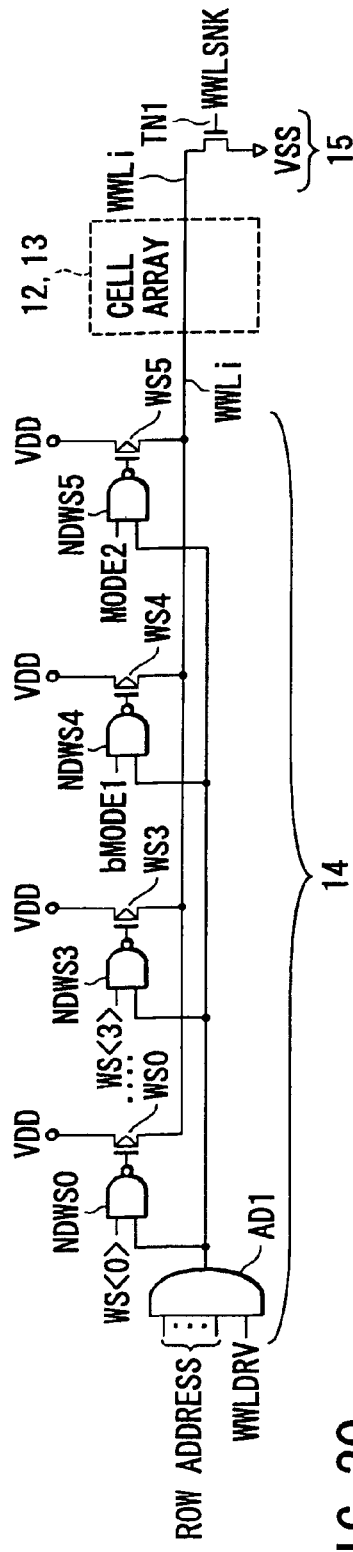
FIG. 20 is a circuit diagram showing an example of circuits in a row decoder and write word line driver/sinker in FIG. 19.

FIG. 20 shows a specific example of circuits in one row of the row decoder and write word driver 14/sinker 15 in FIG. 19.

One row of the row decoder and write word line driver 14 is composed of an AND gate circuit AD1, a plurality of NAND gate circuits NDWSi (i=0 to 5; only 0, 3, 4, and 5 are representatively shown in the figure), and P channel MOS transistors WSi.

The write word line drive signal WWLDRV and a row address signal composed of a plurality of bits are input to the AND gate circuit AD1. The row address signal varies with rows i.

A write word line current amount signal WS<i> is input to one of the two input terminals of each of some NAND gate circuits NDWSi (NDWS0 to NDWS3). An output signal from the AND gate circuit AD1 is input to the other input terminal of these NAND gate circuits. The test mode signal bMODE1 is input to one of the two input terminals of the NAND gate circuit NDWS4. An output signal from the AND gate circuit AD1 is input to the other input terminal of the NAND gate circuit NDWS4. A mode signal MODE2 is input to one of the two input terminals of the NAND gate circuit NDWS5. The output signal from the AND gate circuit AD1 is input to the other input terminal of the NAND gate circuit NDWS5.

A gate of the P channel MOS transistor WSi is connected to an output terminal of the NAND gate circuit NDWSi. Its source is connected to a power terminal VDD. Its drain is connected to one end of a write word line WWLi (i=1, . . . ).

One row of the write word line sinker 15 is composed of an N channel MOS transistor TN1. A source of the N channel MOS transistor TN1 is connected to a ground terminal VSS. Its drain is connected to the other end of the write word line WWLi. The write word line sink signal WWLSNK is input to a gate of the N channel MOS transistor TN1.

For a write operation, the write word line drive signal WWLDRV changes to "H". For the selected row i, all the bits of the row address signal change to "H". That is, for the selected row i, an output signal from the AND circuit AD1 changes to "H". Accordingly, in accordance with the values for the write word line current amount signals WS<0> to WS<3>, a write word line current with a predetermined value is supplied to the write word line WWLi.

For normal operations, the test mode signals bMODE1="H" and MODE2="L", and a PMOS transistor WS4 is turned on, whereas a PMOS transistor WS5 is turned off. A current through the PMOS transistor WS4 is added to the write word line current.

For a write test, the test mode signals bMODE1 and MODE2 can be used to switch the value of the write word line current. That is, in a test mode in which a margin for the write current is examined, the test mode signal bMODE1 changes to "L" with the test mode signal MODE2 remaining "L". This reduces the total of the channel widths of the driver side MOS transistors, while reducing the write current compared to normal operations. In a test mode in which a margin for a miswrite current is examined, the test mode signal MODE2 changes to "H" with the test mode signal bMODE1 remaining "H". This increases the total of the channel widths of the driver side MOS transistors, while increasing the write current compared to normal operations.

When the write word line sink signal WWLSNK changes to "H", the N channel MOS transistor TN1 is turned on. Thus, a write current flowing through the write word line WWLi is absorbed by a ground node VSS via the N channel MOS transistor TN1.

According to this row decoder and write word line driver/sinker, the amount of write current through the write word line WWLi in the selected row i can be controlled by controlling the values for the write word line current amount signals WS<0> to WS<3>.

Further, by setting the write word line drive signal WWLDRV to "L" and then setting the write word line sink signal WWLSNK to "L", the potential across the write word line WWLi can be completely zeroed after a write operation. This is convenient for initialization.

In this connection, several control methods can be used to control the value of the write word line current. First, this value can be controlled by setting the sizes of the plurality of P channel MOS transistors, e.g. their channel widths, in other words, their driving capabilities to the same value and using the write word line current amount signals WS<0> to WS<3> to change the number of P channel MOS transistors WSi to be turned on.

Second, this value can be controlled by setting the sizes of the plurality of P channel MOS transistors, e.g. their channel widths, in other words, their driving capabilities to different values and using the write word line current amount signals WS<0> to WS<3> to turn on one of the P channel MOS transistors WS0 to WS3 selectively.

Third, the write current value can be controlled by combining the above first and second control methods, i.e. setting the sizes of the P channel MOS transistors to different values and changing the number of P channel MOS transistors WSi to be turned on.

(Column Decoder and Write Bit Line Driver/Sinker)

Figure 21:
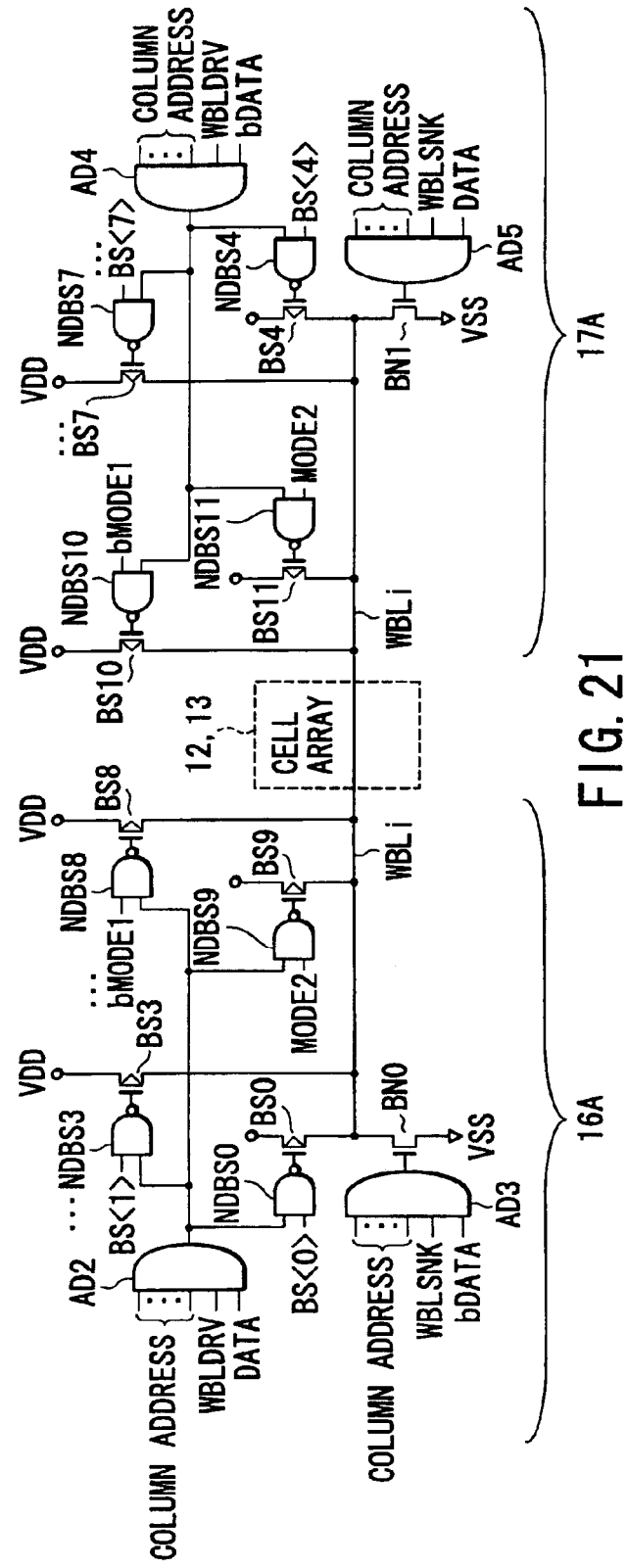
FIG. 21 is a circuit diagram showing an example of circuits in a column decoder and write bit line driver/sinker in FIG. 19.

FIG. 21 shows a specific example of circuits in one column of the column decoder and write bit line drivers/sinkers 16A and 17A in FIG. 19.

One column of the column decoder and write bit line driver/sinker 16A is composed of-AND gate circuits AD2 and AD3, NAND gate circuits NDBSi (i=0 to 3, 8, and 9; only 0, 3, 8, and 9 are representatively shown in the figure), P channel MOS transistors BSi, and an N channel MOS transistor BN0.

The write bit line drive signal WBLDRV, a column address signal composed of a plurality of bits, and write data DATA are input to the AND gate circuit AD2. The column address signal varies with columns i.

A write bit line current amount signal BS<i> is input to one of the two input terminals of each of some NAND gate circuits NDBSi (NDBS0 to NDBS7). An output signal from the AND gate circuit AD2 is input to the other input terminal of these NAND gate circuits.

The test mode signal bMODE1 is input to one of the two input terminals of the NAND gate circuit NDBS8. The output signal from the AND gate circuit AD2 is input to the other input terminal of the NAND gate circuit NDBS8. The test mode signal MODE2 is input to one of the two input terminals of the NAND gate circuit NDBS9. The output signal from the AND gate circuit AD2 is input to the other input terminal of the NAND gate circuit NDBS9.

A gate of the P channel MOS transistor BSi is connected to an output terminal of the NAND gate circuit NDBSi. Its source is connected to the power terminal VDD. All the P channel MOS transistors BSi have their drains connected to one end of a write bit line WBLi (i=1, . . . ).

The write bit line sink signal WBLSNK, a column address signal composed of a plurality of bits, and an inversion data bDATA of the write data are input to the AND gate circuit AD3.

A gate of the N channel MOS transistor BN0 is connected to an output terminal of the AND gate circuit AD3. Its source is connected to the ground terminal VSS. Its drain is connected to one end of the write bit line WBLi (i=1, . . . ).

One column of the column decoder and write bit line driver/sinker 17A is composed of AND gate circuits AD4 and AD5, NAND gate circuits NDBSi (i=4 to 7, 10, and 11; only 4, 7, 10, and 11 are representatively shown in the figure), the P channel MOS transistors BS4 to BS7, and an N channel MOS transistor BN1.

The write bit line drive signal WBLDRV, a column address signal composed of a plurality of bits, and the inversion data bDATA of the write data are input to the AND gate circuit AD4.

The write bit line current amount signal BS<i> is input to one of the two input terminals of each of some NAND gate circuits NDBSi (NDBS4 to NDBS7). An output signal from the AND gate circuit AD4 is input to the other input terminal of these NAND gate circuits NDBSi.

The test mode signal bMODE1 is input to one of the two input terminals of the NAND gate circuit NDBS10. The output signal from the AND gate circuit AD4 is input to the other input terminal of the NAND gate circuit NDBS10. The test mode signal MODE2 is input to one of the two input terminals of the NAND gate circuit NDBS11. The output signal from the AND gate circuit AD4 is input to the other input terminal of the NAND gate circuit NDBS11.

A gate of the P channel MOS transistor BSi is connected to an output terminal of the NAND gate circuit NDBSi. Its source is connected to the power terminal VDD. All the P channel MOS transistors BSi have their drains connected to the other end of the write bit line WBLi (i=1, . . . ).

The write bit line sink signal WBLSNK, a column address signal composed of a plurality of bits, and the write data DATA are input to the AND gate circuit AD5.

A gate of the N channel MOS transistor BN1 is connected to an output terminal of the AND gate circuit AD5. Its source is connected to the ground terminal VSS. Its drain is connected to the other end of the write bit line WBLi (i=1, . . . ).

For a write operation, both the write bit line drive signal WBLDRV and the write bit line sink signal WBLSNK change to "H". For the selected column i, all the bits of the column address signal change to "H".

Accordingly, for the selected column i, the write bit line current amount signals BS<0> to BS<3> determine the value of a write current flowing from the column decoder and write bit line driver/sinker 16A to the column decoder and write bit line driver/sinker 17A.

Further, the write bit line current amount signals BS<4> to BS<7> determine the value of a write current flowing from the column decoder and write bit line driver/sinker 17A to the column decoder and write bit line driver/sinker 16A.

For normal operations, the test mode signals bMODE1= "H" and MODE2="L", and PMOS transistors BS8 and BS10 are turned on, whereas PMOS transistors BS9 and BS11 are turned off. A current through the PMOS transistor BS8 or BS10 is added to the write bit line current. For a write test, the test mode signals bMODE1 and MODE2 can be used to switch the value of the write bit line current.

The value of the write data DATA determines the orientation of a write current flowing through the write bit line WBLi. For example, if the write data DATA is "1" (="H"), the write bit line current amount signals BS<0> to BS<3> turn on at least one of the P channel MOS transistors BS0 to BS3. The N channel MOS transistor BN1 is also turned on. Thus, a write current flows from the column decoder and write bit line driver/sinker 16A to the column decoder and write bit line driver/sinker 17A.

On the other hand, if the write data DATA is "0" (="L"), the write bit line current amount signals BS<4> to BS<7> turn on at least one of the P channel MOS transistors BS4 to BS7. The N channel MOS transistor BN0 is also turned on. Thus, a write current flows from the column decoder and write bit line driver/sinker 17A to the column decoder and write bit line driver/sinker 16A.

According to the column decoder and write bit line driver/sinker, the amount of write current through the write bit line WBLi in the selected column i can be controlled by controlling the values for the write bit line current amount signals BS<0> to BS<7>.

Further, by setting the write bit line drive signal WBLDRV to "L" and then setting the write bit line sink signal WBLSNK to "L", the potential across the write bit line WBLi can be completely zeroed after a write operation. This is convenient for initialization.

In this connection, several control methods can be used to control the value (magnitude) of the write bit line current. First, this value can be controlled by setting the sizes of the plurality of P channel MOS transistors BSi, e.g. their channel widths, in other words, their driving capabilities to the same value and using the write bit line current amount signals BS<0> to BS<7> to change the number of those of the P channel MOS transistors BS0 to BS7 which are to be turned on.

Second, this value can be controlled by setting the sizes of the plurality of P channel MOS transistors BSi, e.g. their channel widths, in other words, their driving capabilities to different values and using the write bit line current amount signals BS<0> to BS<7> to turn on one of the P channel MOS transistors BS0 to BS7 selectively.

Third, the write current value can be controlled by combining the above first and second control methods, i.e. setting the sizes of the P channel MOS transistors to different values and changing the number of P channel MOS transistors WSi to be turned on.

(Write Current Amount Control Circuit).

Now, description will be given of a specific example of the write current amount control circuit 24, which generates the write word line drive signal WWLDRV, the write word line sink signal WWLSNK, the write bit line drive signal WBLDRV, and the write bit line sink signal WBLSNK.

Figure 22:
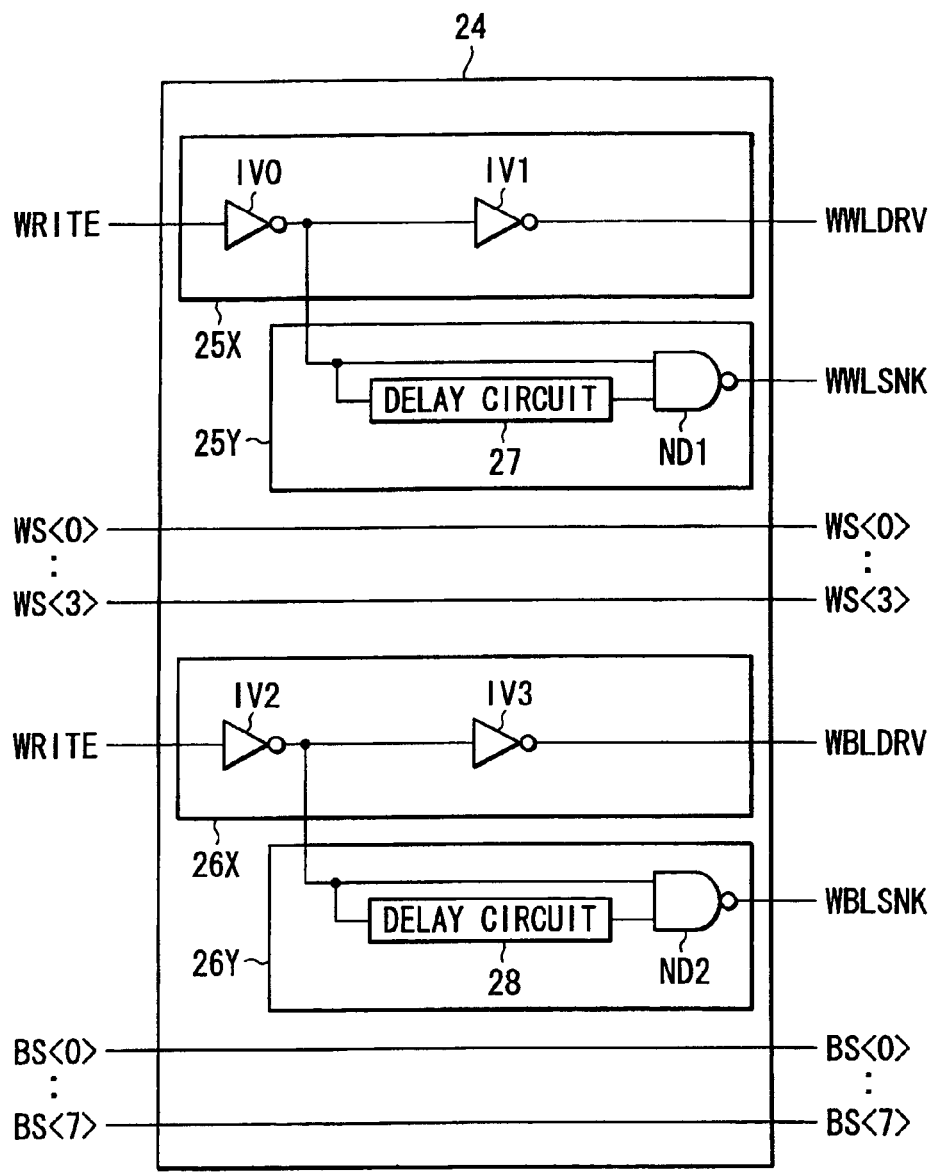
FIG. 22 is a circuit diagram showing an example of a write current amount control circuit in FIG. 19.

FIG. 22 shows an example of the configuration of the write current amount control circuit 24 in FIG. 19.

The write current amount control circuit 24 is composed of a WWLDRV generating circuit 25X, a WWLSNK generating circuit 25Y, a WBLDRV generating circuit 26X, and a WBLSNK generating circuit 26Y.

The WWLDRV generating circuit 25X is composed of inverter circuits IV0 and IV1 to generate a write word line drive signal WWLDRV on the basis of a write signal WRITE. The WWLSNK generating circuit 25Y is composed of a NAND gate circuit ND1 and a delay circuit 27 to generate a write word line sink signal WWLSNK on the basis of the write signal WRITE.

The WBLDRV generating circuit 26X is composed of inverter circuits IV2 and IV3 to generate a write bit line drive signal WBLDRV on the basis of the write signal WRITE. The WBLSNK generating circuit 26Y is composed of a NAND gate circuit ND2 and a delay circuit 28 to generate a write bit line sink signal WBLSNK on the basis of the write signal WRITE.

The write signal WRITE changes to "H" for a write operation. When the write signal WRITE changes from "L" to "H", the write word/bit line drive signal WWLDRV and WBLDRV, the write word line sink signal WWLSNK, and the write bit line sink signal WBLSNK change almost simultaneously from "L" to "H".

The delay circuits 27 and 28 determine the time (interval) after the write signal WRITE has changed from "H" to "L" and the write word/bit line drive signals WWLDRV and WBLDRV have changed from "H" to "L" and before the write word line sink signal WWLSNK and the write bit line sink signal WBLSNL change from "H" to "L". After a write operation has been completed, the potential across the write word line WWLi is zeroed during this interval.

Examples of Operation Waveforms

Figure 23:
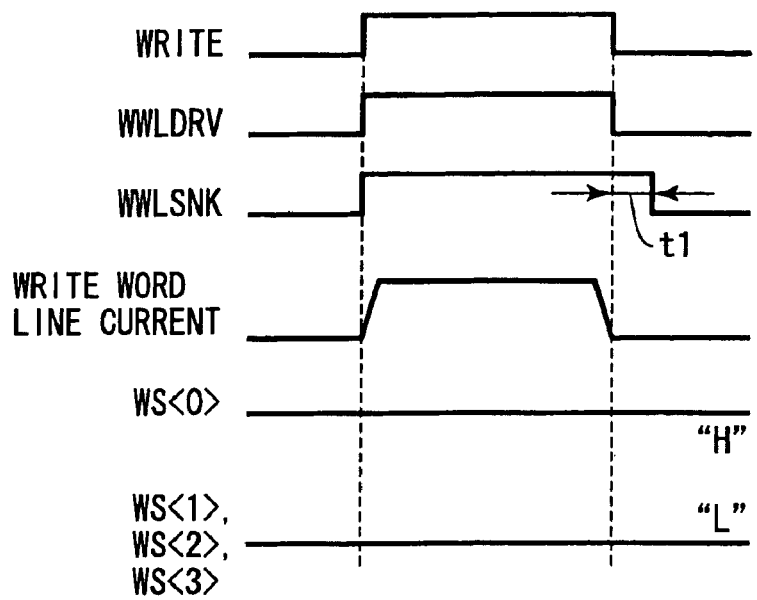
FIG. 23 is a waveform diagram showing an example of operations of the write word line driver/sinker in FIG. 20.

FIG. 23 shows examples of operation waveforms of the write word line driver 14 and sinker 15, shown in FIG. 20.

The write signal WRITE changes to "H". Then, in response to this, the write word line drive signal WWLDRV and the write word line sink signal WWLSNK change to "H". At this time, a write word line current flows through the write word line WWLi, the current having an operation waveform in accordance with the write word line current amount signals WS<0> to WS<3>.

The write signal WRITE changes to "L". Then, in response to this, first, the write word line drive signal WWLDRV changes to "L". Then, after a specified time t1 dependent on the delay time set by the delay circuit 27 in FIG. 22 has elapsed, the write word line sink signal WWLSNK changes to "L". After a write operation has been completed, the potential across the write word line WWLi is zeroed during the specified time t1.

Figure 24:
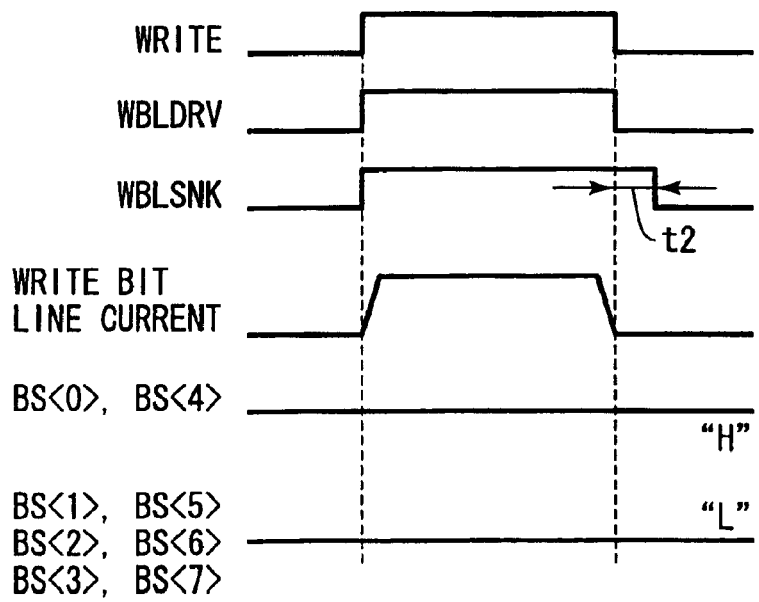
FIG. 24 is a waveform diagram showing an example of operations of the write bit line driver/sinker in FIG. 21.

FIG. 24 shows examples of operation waveforms of the write bit line drivers/sinkers 16A and 17A, shown in FIG. 21.

The write signal WRITE changes to "H". Then, in response to this, the write bit line drive signal WBLDRV and the write bit line sink signal WBLSNK change to "H". At this time, a write bit line current flows through the write bit line WBLi, the current being orientated in accordance with the write data DATA and having an operation waveform in accordance with the write bit line current amount signals BS<0> to BS<3> and BS<4> to BS<7>.

The write signal WRITE changes to "L". Then, in response to this, first, the write bit line drive signal WBLDRV changes to "L". Then, after a specified time t2 dependent on the delay time set by the delay circuit 28 in FIG. 22 has elapsed, the write bit line sink signal WBLSNK changes to "L". After a write operation has been completed, the potential across the write bit line WBLi is zeroed during the specified time t2.

(Setting Circuit)

Figure 25:
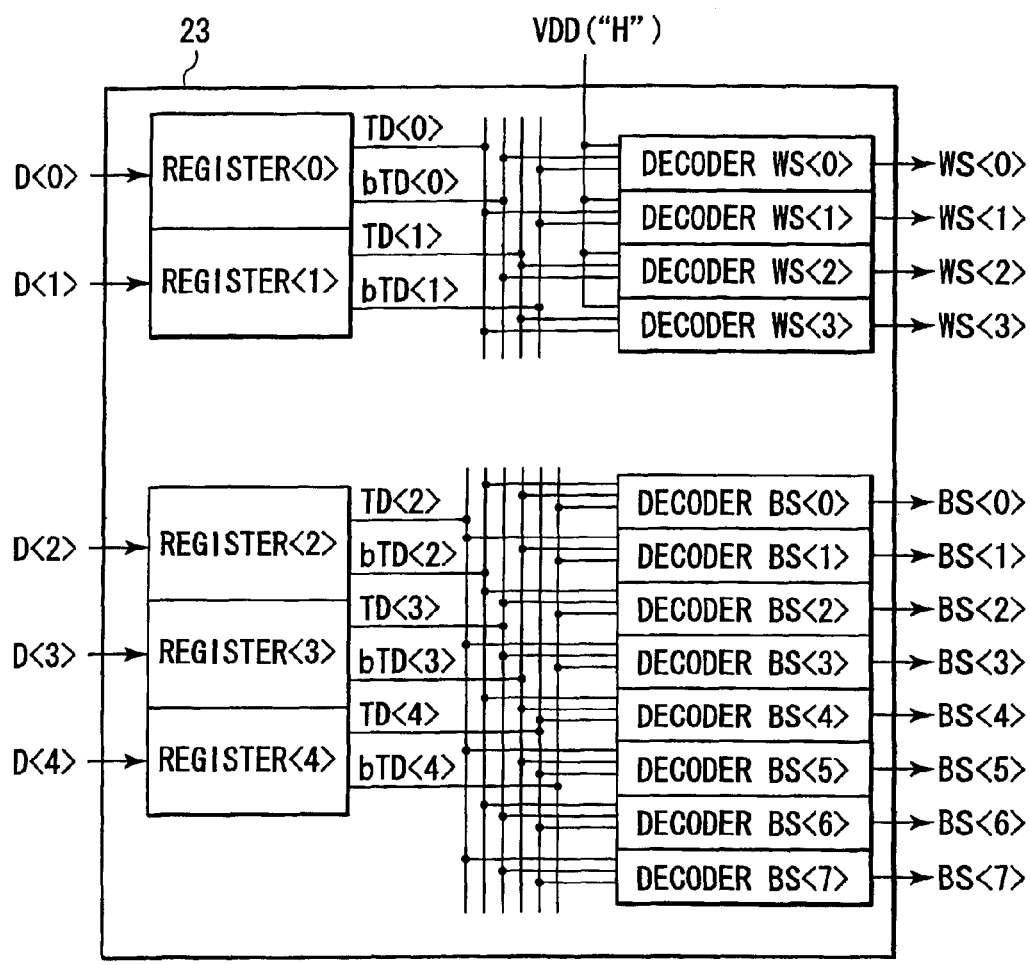
FIG. 25 is a block diagram showing an example of a setting circuit in FIG. 19.

FIG. 25 shows an example of the setting circuit 23 in FIG. 19.

The setting circuit 23 is composed of a first circuit portion that generates write word line current amount signals WS<0> to WS<3> and a second circuit portion that generates write bit line current amount signals BS<0> to BS<7>.

The first circuit portion has registers <0> and <1> in which setting data determining the amount of write word line current is programmed as well as decoders WS<0> to WS<3> that decode output signals TD<0>, TD<1>, bTD<0>, and bTD<1> from the registers <0> and <1> to output write word line current amount signals WS<0> to WS<3>, respectively.

The second circuit portion has registers <2> to <4> in which setting data determining the amount of write bit line current is programmed as well as decoders BS<0> to BS<7> that decode output signals TD<2> to TD<4> and bTD<2> to bTD<4> from the registers <2> to <4> to output write bit line current amount signals BS<0> to BS<7>, respectively.

In the present example, it is assumed that the write word line/bit line currents are set for each chip or cell array. If the write word line/bit line currents are set for each chip, only one setting circuit 32 is provided in the chip. If a plurality of cell arrays are present in the chip and the write word line/bit line currents are set for each cell array, then as many setting circuits 23 as the cell arrays are provided in the chip.

The setting data determining the amount of write word line current is programmed in the registers <0> and <1>. As described previously with reference to FIG. 20, the amount of write word line current is controlled by the write word line current amount signals WS<0> to WS<3>. In the present example, the 2-bit setting data registered in the registers <0> and <1> changes one of the write word line current amount signals WS<0> to WS<3> to "H". That is, four amounts of current can be realized by varying the sizes of the P channel MOS transistors WS0 to WS3 in FIG. 20.

Alternatively, the 2-bit setting data registered in the registers <0> and <1> may be used to control the number of write word line current amount signals WS<0> to WS<3> to change to "H". In this case, four amounts of current can be realized even if the P channel MOS transistors WS0 to WS3 in FIG. 20 have the same size.

Reference characters D<0> and D<1> denote setting data input by outside the MRAM chip, in the test mode. In the test mode, the amount of write word line current can be determined on the basis of this setting data so as to test the characteristics of the MTJ element.

Reference characters D<0> and D<1> also denote setting data input by equipment located outside the MRAM chip, for registration. When the setting data is registered, it can be electrically programmed in storage elements in the registers <0> and <1> on the basis of the setting data itself.

The setting data determining the amount of write bit line current is programmed in the registers <2> to <4>. As described previously with reference to FIG. 21, the amount of write bit line current is controlled by the write bit line current amount signals BS<0> to BS<3>. In the present example, the 3-bit setting data registered in the registers <2> to <4> changes one of the write bit line current amount signals BS<0> to BS<7> to "H".

That is, four amounts of write bit line current conducting from the write bit line driver 16A to the write bit line sinker 17A can be provided by varying the sizes of the P channel MOS transistors BS0 to BS3 in FIG. 21. Further, four amounts of write bit line current conducting from the write bit line driver 17A to the write bit line sinker 16A can be provided by varying the sizes of the P channel MOS transistors BS4 to BS7.

Alternatively, the 3-bit setting data registered in the registers <2> to <4> may be used to control the number of write bit line current amount signals BS<0> to BS<7> to change to "H". In this case, four amounts of current can be realized even if the P channel MOS transistors BS0 to BS7 in FIG. 21 have the same size.

Reference characters D<2> to D<4> denote setting data input by equipment located outside the MRAM chip, in the test mode. In the test mode, the amount of write bit line current can be determined on the basis of this setting data so as to test the characteristics of the MTJ element.

Reference characters D<2> to D<4> also denote setting data input by equipment located outside the MRAM chip, for registration. When the setting data is registered, it can be electrically programmed in storage elements in the registers <2> to <4> on the basis of the setting data itself.

(Example of a Circuit in the Register <j>)

Figure 26:
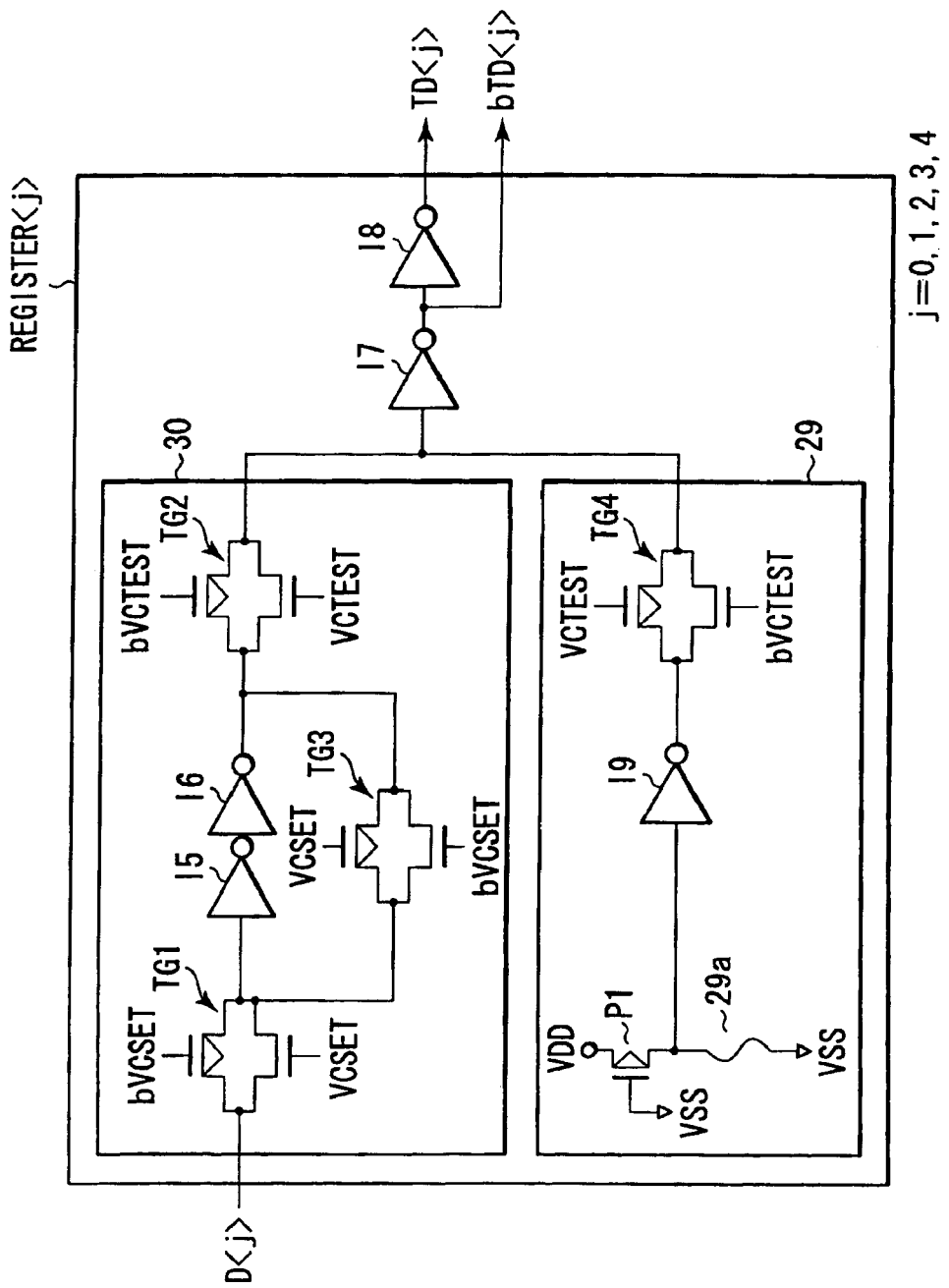
FIG. 26 is a circuit diagram showing an example of the configuration of a register <j> in the setting circuit in FIG. 25.

FIG. 26 shows an example of a circuit in the register <j> in the setting circuit 23, shown in FIG. 25. The register <j> (j=0, 1, 2, 3, or 4) is composed of a program data output circuit 29 that outputs programmed setting data as output signals TD<j> and bTD<j> and an input data transfer circuit 30 that outputs setting data input by equipment located outside the MRAM chip as the output signals TD<j> and bTD<j>.

The program data output circuit 29 has a laser blow fuse 29a used to store setting data. One bit data is stored depending on whether or not the laser blow fuse 29a has been blows out. A P channel MOS transistor P1 and the laser blow fuse 29a are connected in series between the power terminal VDD and the ground terminal VSS. A gate of the P channel MOS transistor P1 is connected to the ground terminal VSS, so that the P channel MOS transistor P1 is always on.

The connection node between the P channel MOS transistor P1 and the laser blow fuse 29a is connected to an input end of an inverter I7 via an inverter I9 and a transfer gate TG4. An output signal from the inverter I7 becomes bTD<j> and an output signal from the inverter I8 becomes TD<j>.

The input data transfer circuit 30 is composed of transfer gates TG1 to TG3 and inverters I5 and I6. The inverters I5 and I6 and the transfer gate TG3 constitute a latch circuit.

For a write operation in the normal operation mode, a test signal VCTEST changes to "L", while a test signal bVCTEST changes to "H". Thus, the transfer gate TG4 is turned on, while the transfer gates TG1 and TG2 are turned off.

Consequently, the setting data programmed in the laser blow fuse 29a is output as the output signals TD<j> and bTD<j> via the transfer gate TG4 and the inverters I7 to I9.

For a write operation in the characteristic examination test mode, the test signal VCTEST changes to "H", while the test signal bVCTEST changes to "L". Thus, the transfer gate TG2 is turned on, while the transfer gate TG4 is turned off.

Consequently, the setting data D<j> is input through an external terminal (a data input terminal, an address terminal, or the like), latched in a latch circuit composed of the transfer gate TG3 and the inverters I5 and I6, and then output from the transfer gate TG2 as the output signals TD<j> and bTD<j>.

For data used in the characteristic examination test mode, the setting data D<j> is input through the external terminal using setting signals VCSET and bVCSET and latched in the latch circuit. That is, the setting signal VCSET changes to "H", while the setting signal bVCSET changes to "L". Thus, the transfer gate TG1 is turned on, while the transfer gate TG3 is turned off. The setting data D<j> can be input through the external terminal. Subsequently, the setting signal VCSET changes to "L", while the setting signal bVCSET changes to "H". Thus, the transfer gate TG1 is turned off, while the transfer gate TG3 is turned on. The setting data D<j> input through the external terminal is latched in the latch circuit. Subsequently, write tests can be carried out on the basis of the setting data latched in the latch circuit.

Instead of the laser blow fuse, the storage element storing the setting data may be, for example, an MTJ element that stores data based on a magnetization state or an MTJ element that stores data depending on whether or not the tunnel barrier is dielectrically broken down.

(Another Example of a Circuit in the Register <j>)

Figure 27:
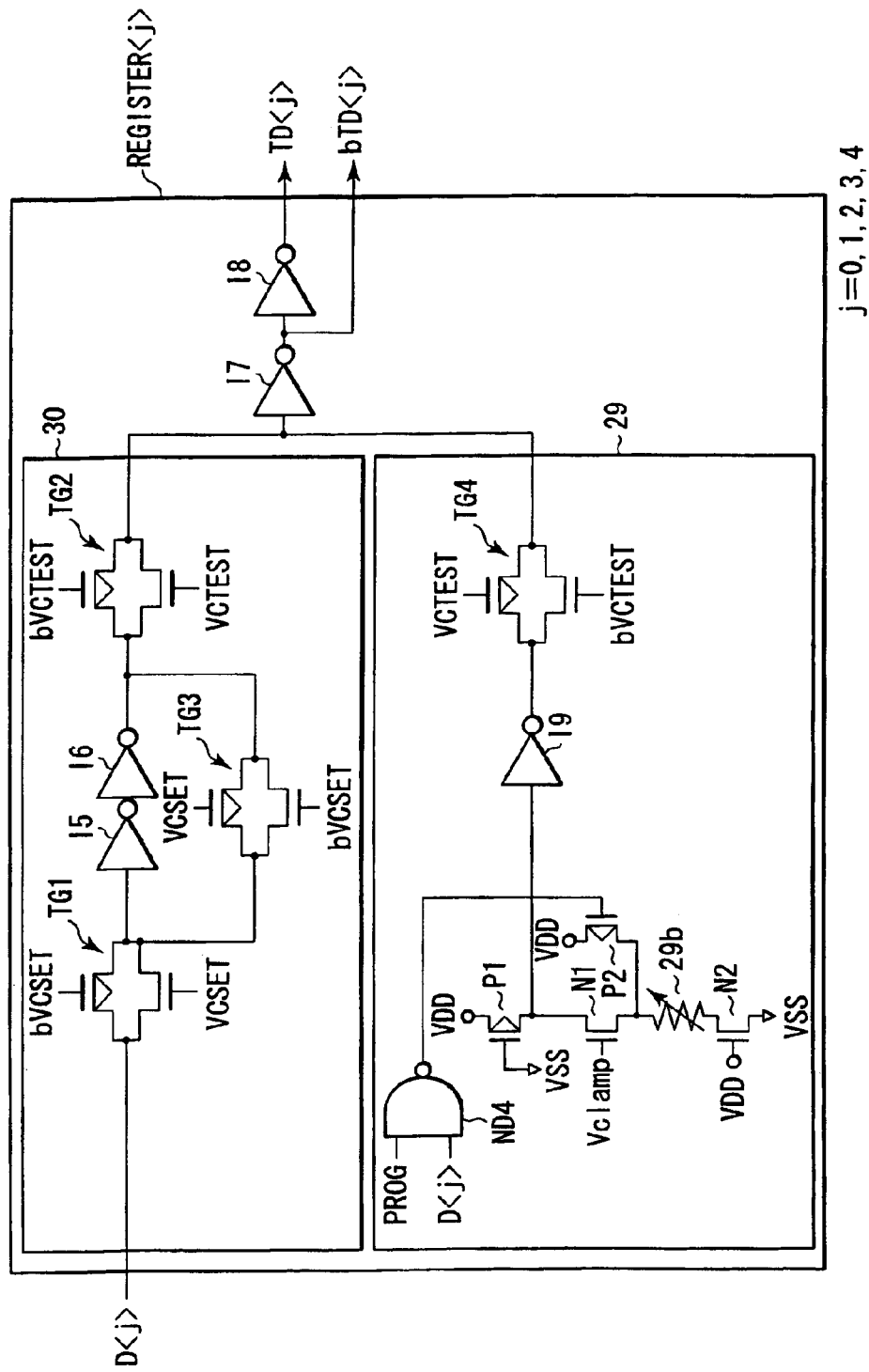
FIG. 27 is a circuit diagram showing another example of the configuration of the register <j> in the setting circuit in FIG. 25.

FIG. 27 shows another example of a circuit in the register <j> in the setting circuit 23, shown in FIG. 25. Compared to the register <j> shown in FIG. 26, the register <j> in the present example is characterized by the configuration of the program data output circuit 29. Specifically, the register <j> in FIG. 26 uses the laser blow fuse 29a as an element storing setting data, whereas the register <j> in the present example uses an MTJ element 29b as an element storing setting data.

The program data output circuit 29 has the MTJ element 29b that stores setting data. The MTJ element can store setting data on the basis of its magnetization state, i.e. the relationship between the magnetization direction of the fixed layer and the magnetization direction of the storage layer (parallel or anti-parallel). However, such a method is not used in the present example.

This is because once setting data is written in the MTJ element, its value is no longer rewritten.

Accordingly, setting data is programmed in the MTJ element storing setting data depending on whether or not the tunnel barrier is dielectrically broken down rather than on the basis of the relationship between the magnetization direction of the fixed layer and the magnetization direction of the storage layer.

With a setting data programming method utilizing the dielectric breakdown of the MTJ element, setting data can be semipermanently stored.

One end of the MTJ element 29b is connected to the power terminal VDD via an N channel MOS transistor N1 and the P channel MOS transistor P1, which are connected in series. The other end of the MTJ element 29b is connected to the ground terminal VSS via an N channel MOS transistor N2. The first end of the MTJ element 29b is connected to the power terminal VDD also via a P channel MOS transistor P2.

The gate of the P channel MOS transistor P1 is connected to the ground terminal VSS. A gate of the N channel MOS transistor N2 is connected to the power terminal VDD. These MOS transistors P1 and N2 are always on.

A clamp potential Vclamp is input to a gate of the N channel MOS transistor N1. By setting the clamp potential Vclamp at an appropriate value, it is possible to prevent a high voltage from being applied to between electrodes of the MTJ element 29b.

A program signal PROG and the setting data D<j> are input to a NAND gate circuit ND4. An output from the NAND gate circuit ND4 is input to a gate of the P channel MOS transistor P2. For programming, the P channel MOS transistor P2 is controllably turned on or off in accordance with the setting data D<j> to program the data in the MTJ element 29b.

(Example of a Circuit in Each of the Decoders WS<0> to WS<3> and BS<0> to BS<7>)

Figure 28:
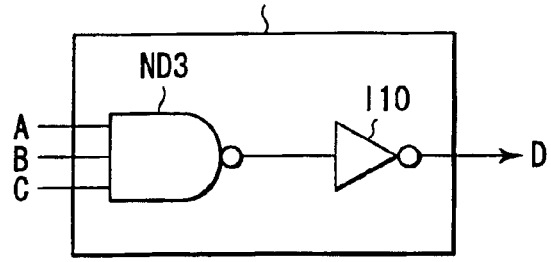
FIG. 28 is a circuit diagram showing an example of a circuit in a decoder WS<0> to WS<3> or BS<0> to BS<7> in the setting circuit in FIG. 25.

FIG. 28 shows an example of a circuit in each of the decoders WS<0> to WS<3> and BS<0> to BS<7> in the setting circuit 23, shown in FIG. 25.

The decoders WS<0> to WS<3> and BS<0> to BS<7> are each composed of a NAND gate circuit ND3 and an inverter I10.

Three input signals A, B, and C are input to the NAND gate circuit ND3. An output signal from the NAND gate circuit ND3 is input to the inverter I10. An output signal D from the inverter I10 becomes a write word/bit line current amount signal WS<0> to WS<3> or BS<0> to BS<7>.

Table 1 indicates decoding carried out by the decoders WS<0> to WS<3> and BS<0> to BS<7> (the relationships between input signals and output signals).

TABLE 1

| Input | | | Output |
| --- | --- | --- | --- |
| A | B | C | D |
| bTD<0> | bTD<1> | VDD | WS<0> |
| TD<0> | bTD<1> | VDD | WS<1> |
| bTD<0> | TD<1> | VDD | WS<2> |
| TD<0> | TD<1> | VDD | WS<3> |
| bTD<2> | bTD<3> | bTD<4> | BS<0> |
| TD<2> | bTD<3> | bTD<4> | BS<1> |
| bTD<2> | TD<3> | bTD<4> | BS<2> |
| TD<2> | TD<3> | bTD<4> | BS<3> |
| bTD<2> | bTD<3> | TD<4> | BS<4> |
| TD<2> | bTD<3> | TD<4> | BS<5> |
| bTD<2> | TD<3> | TD<4> | BS<6> |
| TD<2> | TD<3> | TD<4> | BS<7> |

The characteristics of the above MRAM device according to the first embodiment will describe in brief. As in the case with the "Magnetic Random Access Memory" in Jpn. Pat. Appln. KOKAI Publication No. 2002-179914, the values of the write word line currents through the circuits shown in FIGS. 20 and 21 can be set for each chip or memory cell array by setting the decoders WS<0> to WS<3> and BS<0> to BS<7> in accordance with a program. Further, the amount of write word line current and the amount of write bit line current can be independently determined. Furthermore, the amount of write bit line current can be individually determined for the value of the write data, i.e. the orientation of the write current. This enables the magnetization in the storage layer in the MTJ element to be reliably switched. Therefore, the write characteristics can be improved.

Moreover, in the present embodiment, the test mode signals bMODE1 and MODE2 can set the value of the write current for a write test. In test the mode in which the margin for the write current is examined, the test mode signal bMODE1 changes to "L" with the test mode signal MODE2 remaining "H". This reduces the total of the channel widths of the driver side MOS transistors, while reducing the write current compared to normal operations. In the test mode in which the margin for the miswrite current is examined, the test mode signal MODE2 changes to "H" with the test mode signal bMODE1 remaining "H". This increases the total of the channel widths of the driver side MOS transistors, while increasing the write current compared to normal operations.

That is, according to the MRAM device according to the first embodiment, a plurality of set values are used for the write current so that the value of the write current can be varied in the write test mode. Thus, in the write test mode, by setting the write current at a value smaller than the one for normal operations, it is possible to detect memory cells that barely pass write tests with the set value for normal operations. Further, in the miswrite test mode, by setting the write current at a value larger than the one for normal operations, it is possible to detect memory cells that barely pass miswrite tests with the set value for normal operations.

(MRAM Device According to a Second Embodiment)

Now, an MRAM device according to a second embodiment will be described.

<WL Driver/Sinker and BL Driver/Sinker>

An MRAM device according to the second embodiment has a plurality of set values for the write current so that in the write test mode, the write current value can be varied by varying a current value for a current source circuit that determines the values of currents through the WL driver/sinker and BL driver/sinker. An example of such an MRAM device will be described below.

Figure 29:
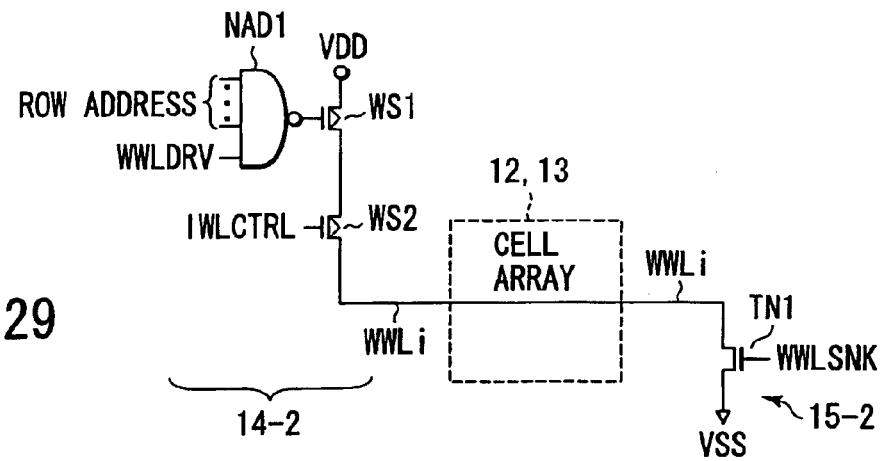
FIG. 29 is a circuit diagram showing an example of circuits in a row decoder and write word line driver/sinker in an MRAM device according to a second embodiment of the present invention.

FIG. 29 shows a specific example of circuits in one row of the row decoder and write word line driver 14/sinker 15 in FIG. 19.

One row of a row decoder and write word line driver 14-2 is composed of a NAND gate circuit NAD1 and P channel MOS transistors WS1 and WS2.

The write word line drive signal WWLDRV and a row address signal composed of a plurality of bits are input to the NAND gate circuit NAD1. The row address signal varies with the rows i.

A gate of the P channel MOS transistor WS1 is connected to an output terminal of the NAND gate circuit NAD1. Its source is connected to the power terminal VDD. Its drain is connected to the source of the P channel MOS transistor WS2. A write word line current amount control signal IWLCTRL is input to a gate of the P channel MOS transistor WS2. The source of the P channel MOS transistor WS2 is connected to one end of the write word line WWLi (i=1, . . . ).

One row of a write word line sinker 15-2 is composed of the N channel MOS transistor TN1. A source of the N channel MOS transistor TN1 is connected to the ground terminal VSS. Its drain is connected to the other end of the write word line WWLi. The write word line sink signal WWLSNK is input to a gate of the N channel MOS transistor TN1.

For a write operation, the write word line drive signal WWLDRV changes to "H". For the selected row i, all the bits of the row address signal change to "H". That is, for the selected row i, an output signal from the NAND circuit NAD1 changes to "L". Accordingly, in accordance with the voltage level of the control signal IWLCTRL, a write word line current with a predetermined value is supplied to the write word line WWLi.

When the write word line sink signal WWLSNK changes to "H", the N channel MOS transistor TN1 is turned on. Thus, a write current flowing through the write word line WWLi is absorbed by a ground node VSS via the N channel MOS transistor TN1.

According to this row decoder and write word line driver/sinker, the amount of the write current through the write word line WWLi in the selected row i can be controlled by controlling the voltage level of the control signal IWLCTRL.

Further, by setting the write word line drive signal WWLDRV to "L" and then setting the write word line sink signal WWLSNK to "L", the potential across the write word line WWLi can be completely zeroed after a write operation. This is convenient for initialization.

Figure 30:
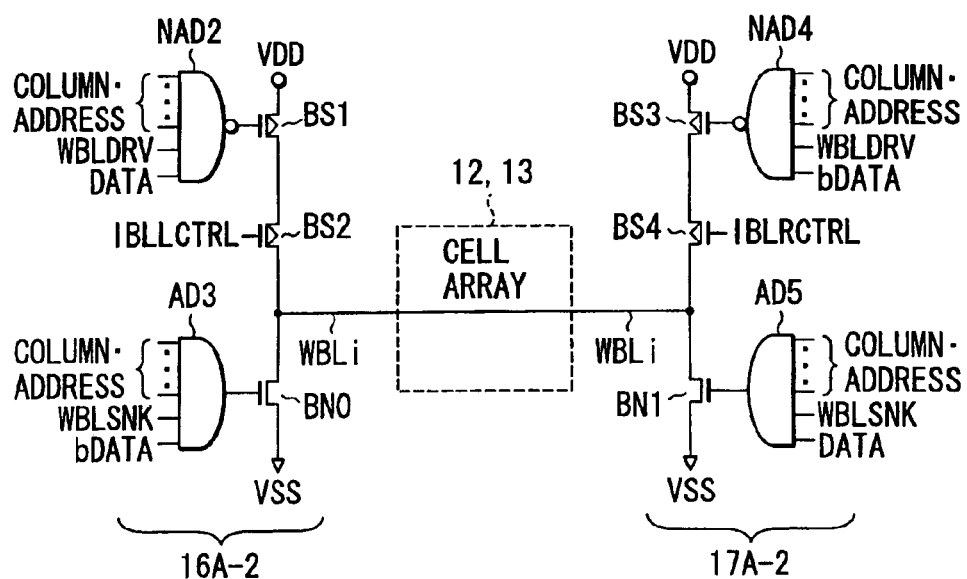
FIG. 30 is a circuit diagram showing an example of circuits in a column decoder and write word line driver/sinker in the MRAM device according to the second embodiment of the present invention.

FIG. 30 shows a specific example of circuits in one column of the column decoder and write bit drivers/sinkers 16A and 17A in FIG. 19.

One column of a column decoder and write bit line driver/sinker 16A-2 is composed of a NAND gate circuit NAD2, the AND gate circuit AD3, the P channel MOS transistors BS1 and BS2, and the N channel MOS transistor BN0.

The write bit line drive signal WBLDRV, a column address signal composed of a plurality of bits, and the write data DATA are input to the NAND gate circuit NAD2. The column address signal varies with the columns i.

The gate of the P channel MOS transistor BS1 is connected to an output terminal of the NAND gate circuit NAD2. Its source is connected to the power terminal VDD. Its drain is connected to the source of the P channel MOS transistor BS2. A write bit line current value control signal IBLLCTRL is input to the gate of the P channel MOS transistor BS2. The source of the P channel MOS transistor BS2 is connected to one end of a write bit line WBLi (i=1, ...).

The write bit line sink signal WBLSNK, a column address signal composed of a plurality of bits, and the inversion data bDATA of the write data are input to the AND gate circuit AD3.

The gate of the N channel MOS transistor BN0 is connected to the output terminal of the AND gate circuit AD3. Its source is connected to the ground terminal VSS. Its drain is connected to one end of a write bit line WBLi (i=1, ...).

One column of a column decoder and write bit line driver/sinker 17A-2 is composed of a NAND gate circuit NAD4, the AND gate circuit AD5, P channel MOS transistors BS3 and BS4, and an N channel MOS transistor BN1.

The write bit line drive signal WBLDRV, a column address signal composed of a plurality of bits, and the inversion data bDATA of the write data are input to the NAND gate circuit NAD4.

The gate of the P channel MOS transistor BS3 is connected to an output terminal of the NAND gate circuit NAD4. Its source is connected to the power terminal VDD. Its drain is connected to the source of the P channel MOS transistor BS4. A write bit line current value control signal IBLRCTRL is input to the gate of the P channel MOS transistor BS4. The source of the P channel MOS transistor BS4 is connected to one end of a write bit line WBLi (i=1, ...).

The write bit line sink signal WBLSNK, a column address signal composed of a plurality of bits, and the write data DATA are input to the AND gate circuit AD5.

The gate of the N channel MOS transistor BN1 is connected to the output terminal of the AND gate circuit AD5. Its source is connected to the ground terminal VSS. Its drain is connected to the other end of the write bit line WBLi (i=1, ...).

For a write operation, both the write bit line drive signal WBLDRV and the write bit line sink signal WBLSNK change to "H". For the selected-column i, all the bits of the column address signal change to "H".

Accordingly, for the selected-column i, a write current having its value determined by the write bit line current value control signal IBLLCTRL flows between the column decoder and write bit line driver/sinker 16A-2 and the column decoder and write bit line driver/sinker 17A-2.

Further, a write current having its value determined by the write bit line current value control signal IBLRCTRL flows from the column decoder and write bit line driver/sinker 17A-2 to the column decoder and write bit line driver/sinker 16A-2.

The value of the write data DATA determines the orientation of a write current flowing through the write bit line WBLi. For example, if the write data DATA is "1" (="H"), the write bit line current value control signal IBLLCTRL determines the value of a current through the P channel MOS transistor BS2. Further, the N channel MOS transistor BN1 is turned on. Thus, a write current flows from the column decoder and write bit line driver/sinker 16A-2 to the column decoder and write bit line driver/sinker 17A-2.

On the other hand, if the write data DATA is "0" (="L"), the write bit line current value control signal IBLRCTRL determines the value of a current through the P channel MOS transistor BS4. Further, the N channel MOS transistor BN0 is turned on. Thus, a write current flows from the column decoder and write bit line driver/sinker 17A-2 to the column decoder and write bit line driver/sinker 16A-2.

According to this column decoder and write bit line driver/sinker, the amount of write current through the write bit line WBLi in the selected column i can be controlled by controlling the values for the control signals IBLLCTRL and IBLRCTRL.

Further, by setting the write bit line drive signal WBLDRV to "L" and then setting the write bit line sink signal WBLSNK to "L", the potential across the write bit line WBLi can be completely zeroed after a write operation. This is convenient for initialization.

A circuit that sets a current drive timing for the WL driver/sinker shown in FIG. 29 is the same as an example of a circuit that sets a current drive timing for the WL driver/sinker shown in FIG. 22 for the first embodiment. In this case, the potentials across the word lines and bit lines are reset to the ground potential Vss of the MRAM chip by setting the period in which WWLDRV="H" to be longer than the period in which WBLSNK="H".

Figure 31:
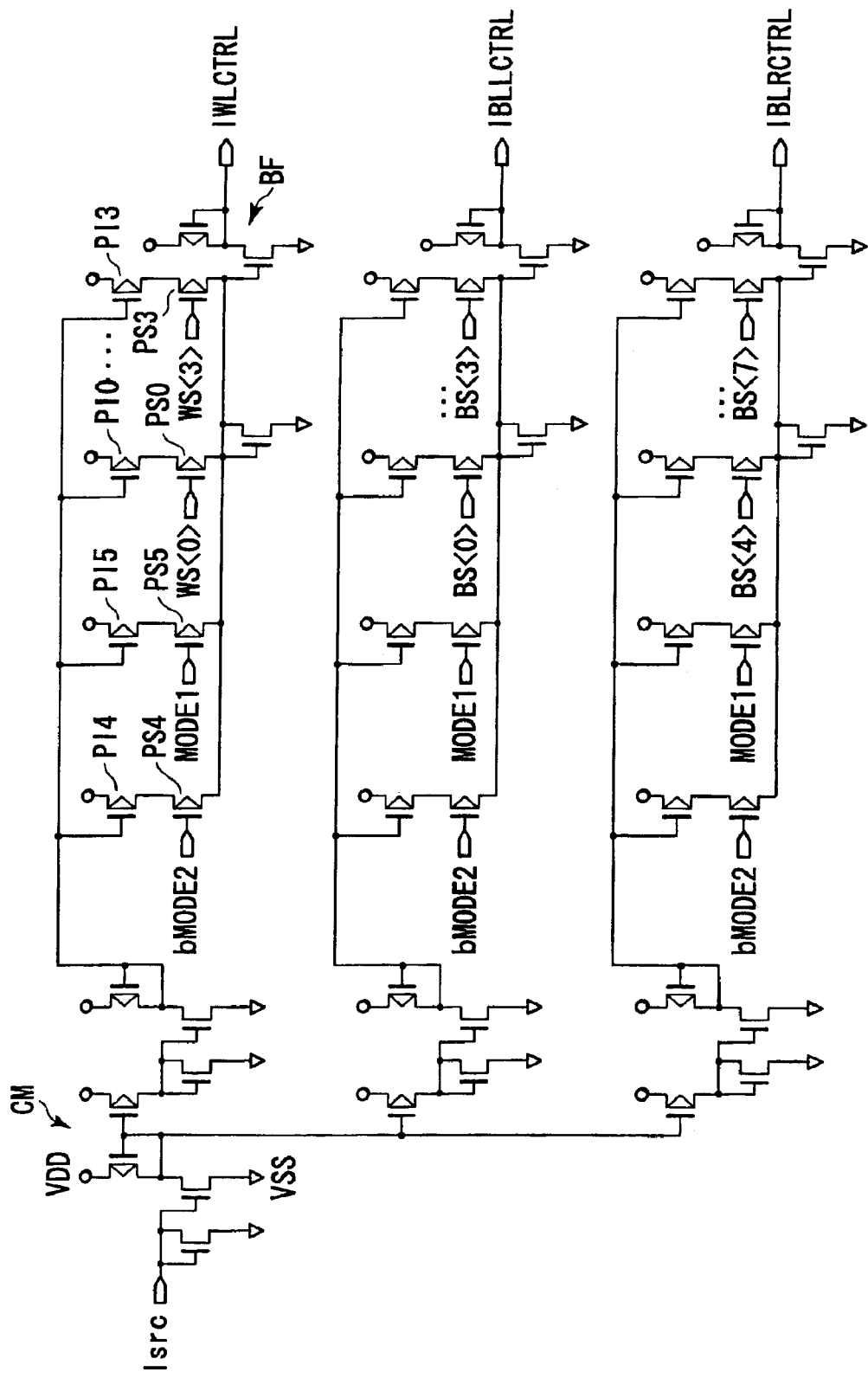
FIG. 31 is a circuit diagram showing an example of a circuit that generates various control signals in FIG. 29.

FIG. 31 shows an example of a circuit that generates the write word line current value control signal in FIG. 29 and the write bit line current value control signals IBLLCTRL and IBLRCTRL in FIG. 30.

Figure 32:
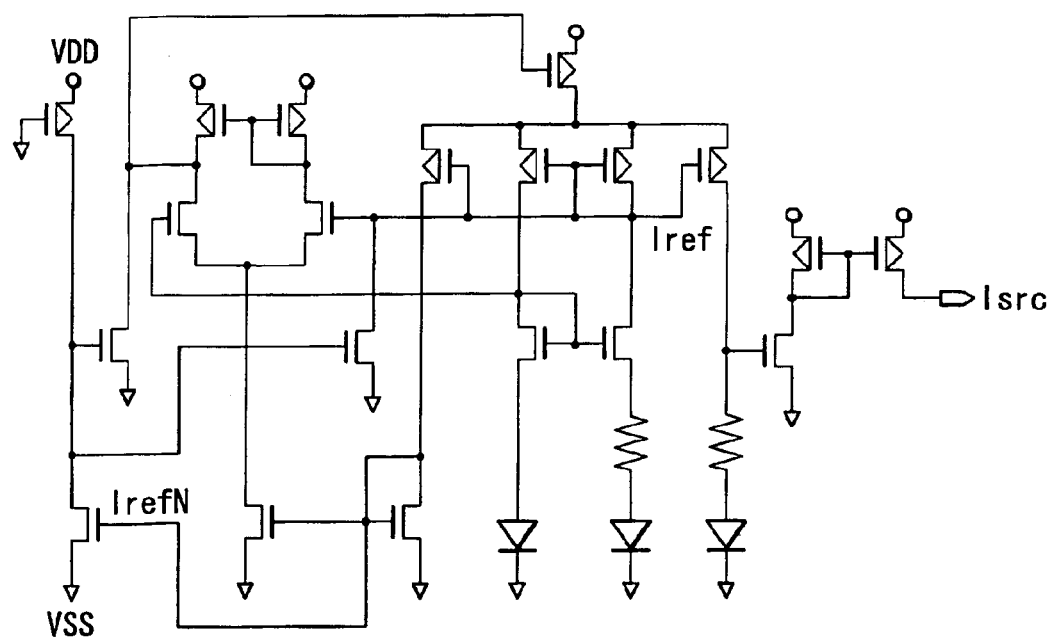
FIG. 32 is a circuit diagram showing an example of a current source circuit that generates a control input current in FIG. 31.

FIG. 32 shows a current source circuit that generates a control input current in FIG. 31.

In FIG. 31, a circuit that sets the potential level of the write word line current value control signal IWLCTRL has a plurality of current source PMOS transistors PIi (i=0 to 5; only 0, 3, 4, and 5 are representatively shown in the figure) that conduct a control input current Isrc reflected by a current mirror circuit CM, as many switch PMOS transistors PSi as the power source PMOS transistors PIi, and a buffer circuit BF.

A source of each current source PMOS transistor PIi is connected to a power node. A source of each switch PMOS transistor PSi is connected to a drain of the corresponding current source PMOS transistor PIi. All the switch PMOS transistors PSi have their drains connected together. A gate of each PMOS transistor PSi is provided with write word line current setting signals WS<0> to WS<3> in association with the test mode signals bMODE2 and MODE1, the write word line current setting signals WS<0> to WS<3> being set by the setting circuit 23, shown in FIG. 19, in accordance with the program. The buffer circuit BF takes out the write word line current value control signal IWLCTRL with a potential level corresponding to the potential at the nodes connected together. During normal operations, bMODE2= "H", MODE1="L", the PMOS transistor PS4 is off, and the PMOS transistor PS5 is on.

In FIG. 31, a circuit that sets the potential level of the write bit line current value control signal IBLLCTRL or a circuit that sets the potential level of the write bit line current value control signal IBLRCTRL is configured similarly to the previously described circuit that sets the potential level of the write word line current value control signal IWLCTRL. In this case, in place of the setting signals WS<0> to WS<3>, the write bit line current setting signals BS<0> to BS<3> or BS<4> to BS<7> are used, which are set by the setting circuit 23, shown in FIG. 19, in accordance with the program.

To control the magnitudes of the above current value control signals IWLCTRL, IBLLCTRL, and IBLRCTRL, for example, the sizes of the plurality of switch P channel MOS transistors PSi, e.g. their channel widths, in other words, their driving capabilities are set to the same value for circuits that generate the current value control signals IWLCTRL, IBLLCTRL, and IBLRCTRL. Then, the write word line current value setting signals WS<0> to WS<3> are used to vary the number of P channel MOS transistors PSi to be turned on. The write bit line current value setting signals BS<0> to BS<3> or BS<4> to BS<7> are used to vary the number of P channel MOS transistors PSi to be turned on.

As described above, by setting the decoders WS<0>, WS<1>, BS<0>, BS<1>, BS<2>, and BS<3> in accordance with the program, the current value control signals IWLCTRL, IBLLCTRL, and IBLRCTRL can be controlled to set the values of the write word line current driven by the circuit in FIG. 29 and of the write bit line current driven by the circuit in FIG. 30 for each chip or memory cell array.

Furthermore, with the MRAM device according to the second embodiment, the test mode signals bMODE2 and MODE1 can set the value of the write current for a write test.

In the test mode in which the margin for the write current is examined, the test mode signal MODE1 changes to "H" with the test mode signal bMODE2 remaining "H". Then, the potentials of the signals IWLCTRL, IBLLCTRL, and IBLRCTRL are raised to reduce the write current compared to normal operations.

In the test mode in which the margin for the miswrite current is examined, the test mode signal bMODE2 changes to "L" with the test mode signal MODE1 remaining "L". Then, the potentials of the signals IWLCTRL, IBLLCTRL, and IBLRCTRL are lowered to increase the write current compared to normal operations.

Specifically, the MRAM device according to the second embodiment has a plurality of set values for the write current so that in the write test mode, the write current value can be varied. Thus, in the write test mode, by setting the write current at a value smaller than the one for normal operations, it is possible to detect memory cells that barely pass write tests with the set value for normal operations. Further, in the miswrite test mode, by setting the write current at a value larger than the one for normal operations, it is possible to detect memory cells that barely pass miswrite tests with the set value for normal operations.

Entry into the test mode in which the margin for the write current is examined, the test mode in which the margin for the miswrite current is examined, and a monitor mode, described later, can be achieved by utilizing a combination of normal memory control signals /CE, /WE, and /OE which is different from that used in the normal mode or inputting external commands to the memory and allowing an internal command decoder to decode this command.

(Example of a Circuit Monitoring the Write Current)

A detailed description will be given of a circuit that monitors the word line current and bit line current during a write in the first and second embodiments.

In the previously described embodiments, if power supplied to the WL and BL drivers has the same potential as that of power supplied to the MRAM chip by a power pad on the MRAM chip and is independently supplied by another power pad, the word and bit line currents for a write can be monitored by detecting the current supplied by the second power pad.

On the other hand, if the power sources for the WL and BL drivers are shared by other circuits, the word and bit line currents for a write can be monitored by using replica circuits for the WL and BL drivers/sinkers.

Figure 33:
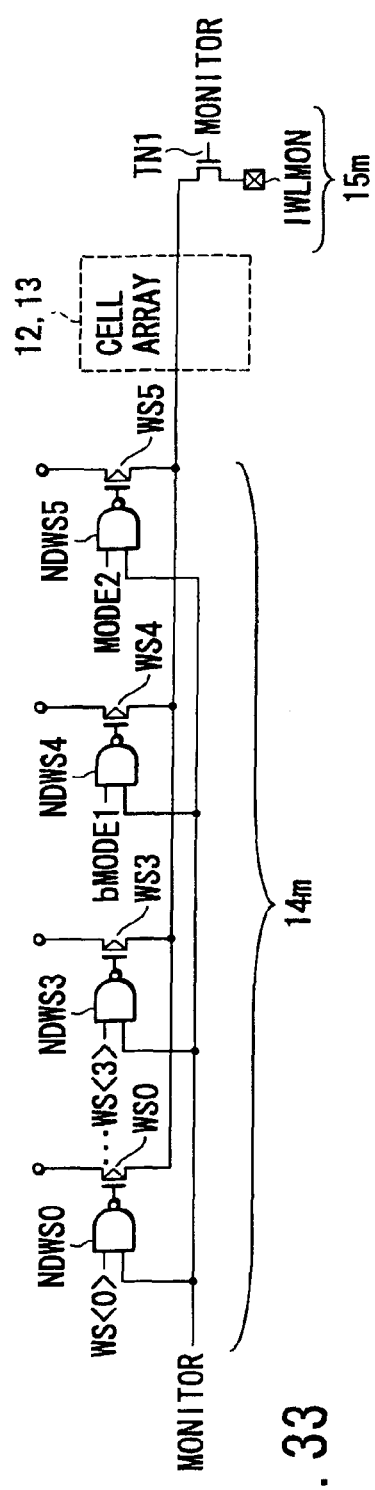
FIG. 33 is a circuit diagram showing an example of circuits in a monitor write WL driver/sinker in the MRAM device according to the second embodiment of the present invention.

FIG. 33 shows an example of circuits in a monitor write WL driver 14m/sinker 15m that are replica circuits corresponding to the write WL driver 14/sinker 15, shown in FIG. 20.

These replica circuits are the same as the write WL driver 14/sinker 15, shown in FIG. 20, except that the AND gate AD1 is omitted, that a monitor mode signal MONITOR is input to one input of each of the NAND gate circuits NDWS0 to NDWS5, that the signal MONITOR is also input to the gate of the sinker NMOS transistor TN1, and that a monitor terminal IWLMON takes out a current through the sinker transistor TN1 as a monitor current. Thus, the components of this circuit are denoted by the same reference numerals as those in FIG. 20. In the monitor mode, MONITOR="H".

Figure 34:
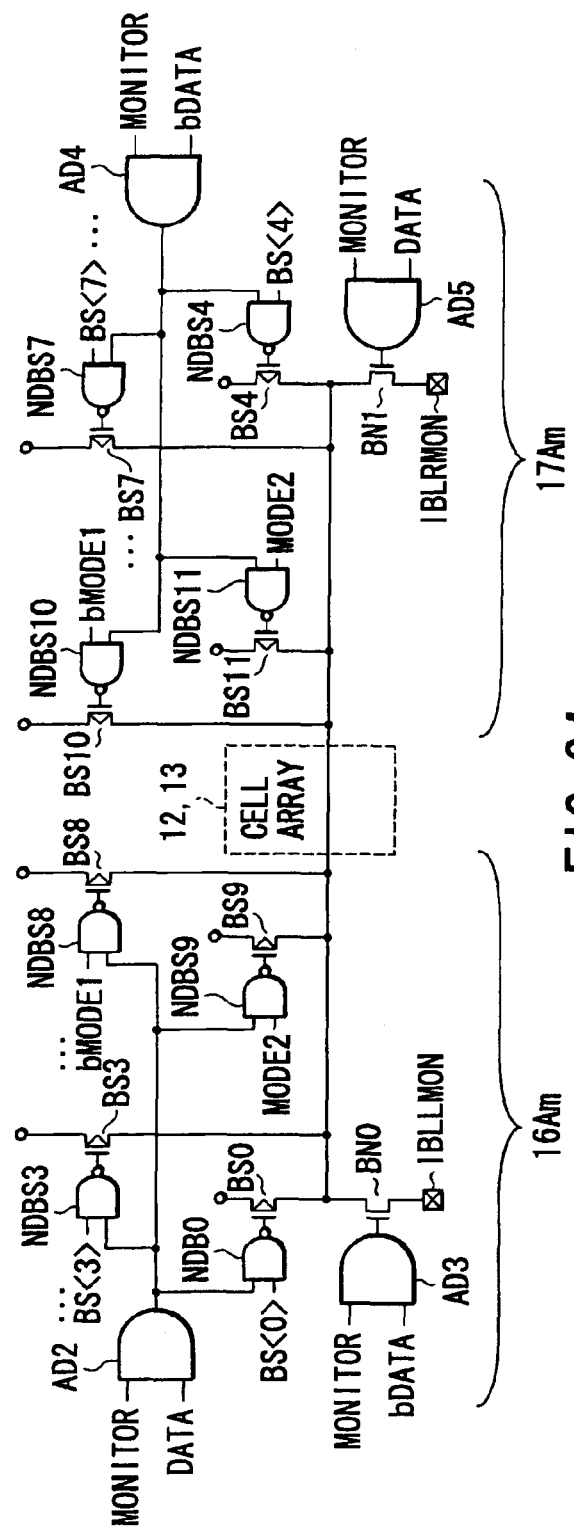
FIG. 34 is a circuit diagram showing an example of circuits in a monitor write BL driver/sinker in the MRAM device according to the second embodiment of the present invention.

FIG. 34 shows an example of circuits in monitor write BL drivers/sinkers 16Am and 17Am that are replica circuits corresponding to the write BL drivers/sinkers 16A and 17A, shown in FIG. 21.

These replica circuits are the same as the write BL drivers/sinkers 16A and 17A, shown in FIG. 21, except that the signals MONITOR and DATA are input to the AND gate AD2, that the signals MONITOR and bDATA are input to the AND gate AD3, that the signals MONITOR and bDATA are input to the AND gate AD4, that the signals MONITOR and DATA are input to the AND gate AD5, and that monitor terminals IBLLMON and IBLRMON take out currents through the sinker transistors BN0 and BN1, respectively, as monitor currents. Thus, the components of this circuit are denoted by the same reference numerals as those in FIG. 21. In the monitor mode, MONITOR="H".

Figure 35:
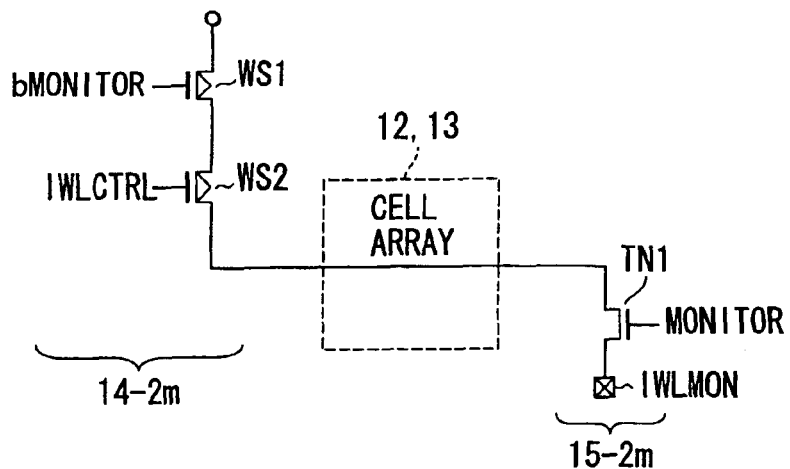
FIG. 35 is a circuit diagram showing an example of circuits in a monitor write WL driver/sinker that are replica circuits corresponding to the write WL driver/sinker in FIG. 29.

FIG. 35 shows an example of circuits in a monitor write WL driver 14-2m/sinker 15-2m that are replica circuits corresponding to the write WL driver 14-2/sinker 15-2, shown in FIG. 29.

These replica circuits are the same as the write WL driver/sinker shown in FIG. 29, except that the AND gate AD1 is omitted, that an inverted monitor control signal bMONITOR is input to the gate of the PMOS transistor WS1, that the signal MONITOR is input to the gate of the sinker NMOS transistor TN1, and that the monitor terminal IWLMON takes out a current through the sinker transistor TN1 as a monitor current. Thus, the components of this circuit are denoted by the same reference numerals as those in FIG. 29. In the monitor mode, MONITOR="H" and bMONITOR="L".

Figure 36:
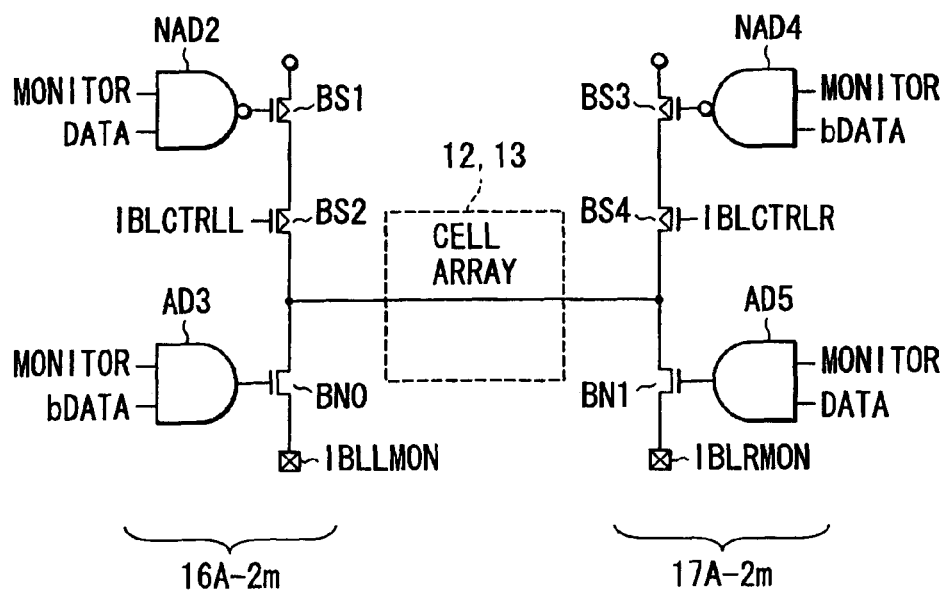
FIG. 36 is a circuit diagram showing an example of circuits in a monitor write BL driver/sinker that are replica circuits corresponding to the write BL driver/sinker in FIG. 30.

FIG. 36 shows an example of circuits in monitor write BL drivers/sinkers 16A-2m and 17A-2m that are replica circuits corresponding to the write BL drivers/sinkers 16A-2 and 17A-2, shown in FIG. 30.

These replica circuits are the same as the write BL drivers/sinkers 16A and 17A, shown in FIG. 30, except that the signals MONITOR and DATA are input to the NAND gate NAD2, that the signals MONITOR and bDATA are input to the AND gate AD3, that the signals MONITOR and bDATA are input to the NAND gate NAD4, that the signals MONITOR and DATA are input to the AND gate AD5, and that the monitor terminals IBLLMON and IBLRMON take out currents through the sinker transistors BN0 and BN1, respectively, as monitor currents. Thus, the components of this circuit are denoted by the same reference numerals as those in FIG. 30. In the monitor mode, MONITOR="H" and bMONITOR="L".

In FIGS. 33 to 36, currents flowing into the monitor terminals IWLMON, IBLLMON, and IBLRMON can be monitored by connecting these terminals to a terminal playing another role and setting this terminal at the same potential as the ground potential Vss of the MRAM chip.

(Example of Arrangement of the Circuit Monitoring the Write Circuit)

When the word and bit line currents for a write are monitored, voltage drops in the word and bit lines associated with interconnect resistance must be taken into account. Thus, the column and row lines driven by the replica circuits are desirably present on the cell array. Further, the replica circuits are desirably arranged at the respective ends of the cell array as in the case with the ordinary WL and BL drivers/sinkers.

Figure 37:
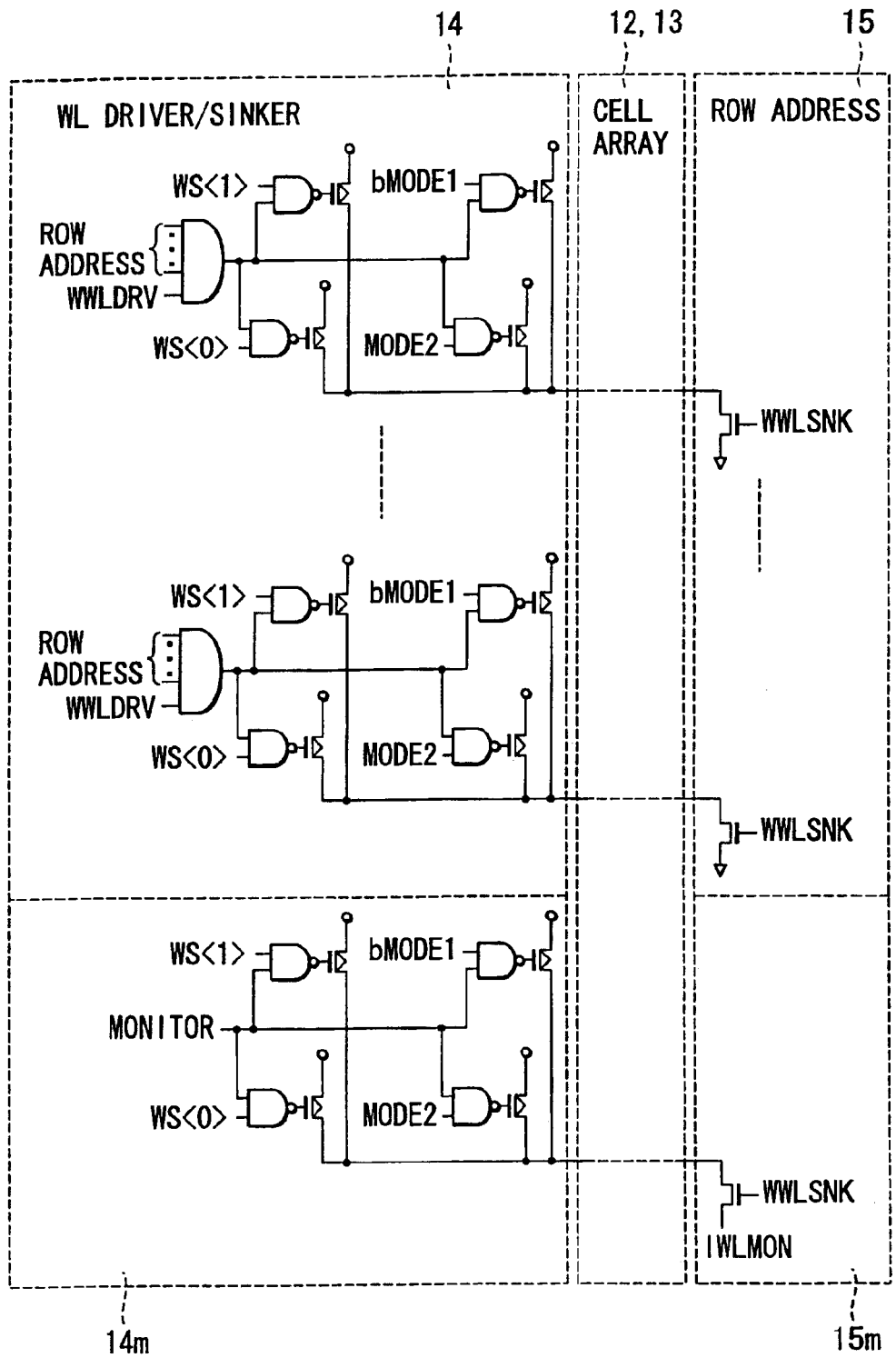
FIG. 37 is a circuit diagram showing both the write WL driver/sinker in FIG. 20 and the monitor write WL driver/sinker in FIG. 33.

FIG. 37 shows the arrangement of the write WL driver 14/driver 15, shown in FIG. 20, and its replica circuit, the monitor write WL driver 14m/sinker 15m, shown in FIG. 33. This figure shows that the replica circuit uses a dummy write WL within the cell array and is arranged at one end of the cell array in its column direction. However, the arrangement of the replica circuit is not limited.

Figure 38:
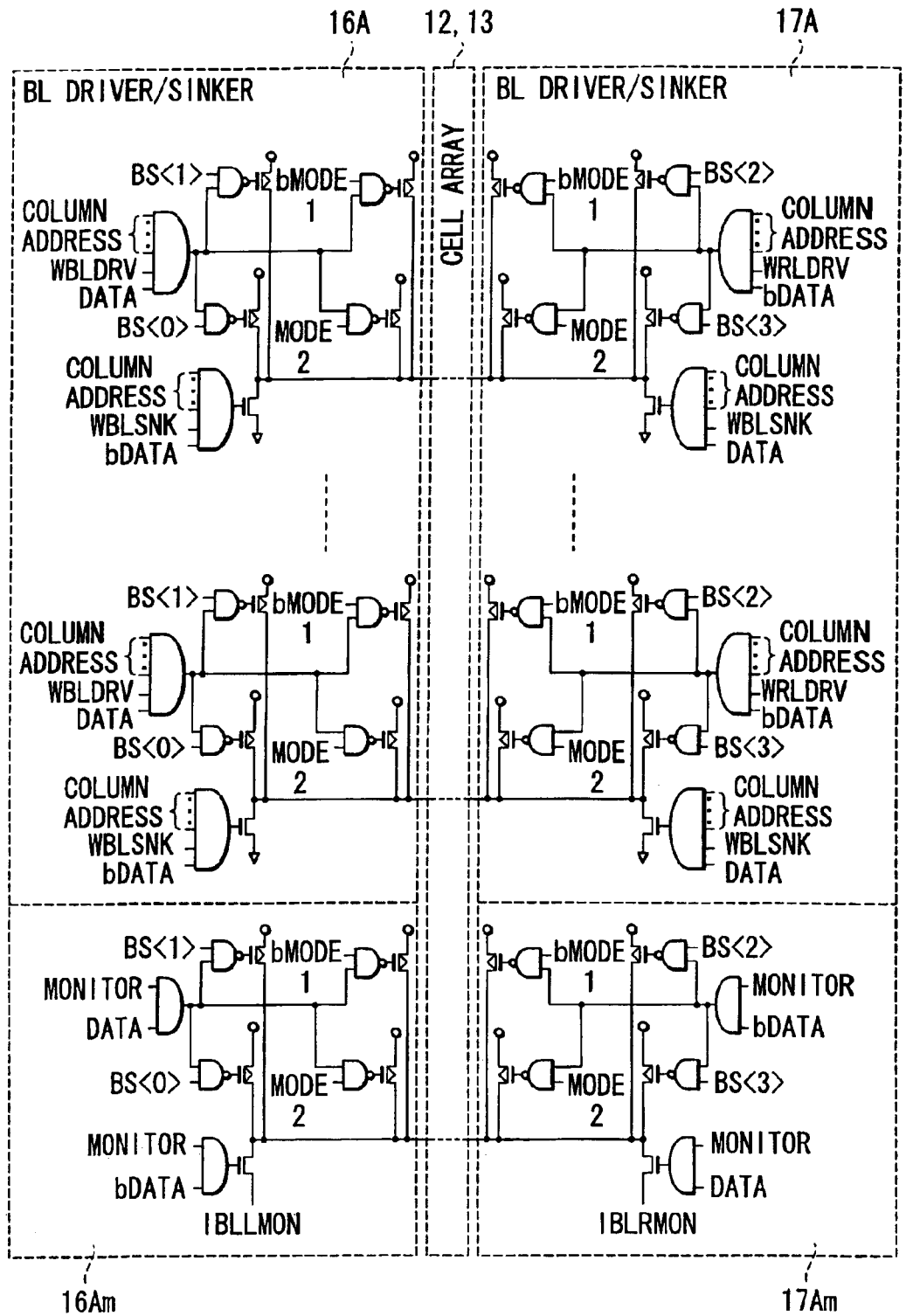
FIG. 38 is a circuit diagram showing both the write BL driver/sinker and the monitor write BL driver/sinker in FIG. 34, in the MRAM device according to the second embodiment.

FIG. 38 shows the arrangement of the write BL drivers/drivers 16A and 17A, shown in FIG. 21, and their replica circuits, the monitor write BL drivers/sinkers 16Am and 17Am, shown in FIG. 34. This figure shows that the replica circuits use a dummy BL within the cell array and are arranged at one end of the cell array in its row direction. However, the arrangement of the replica circuits is not limited.

Figure 39:
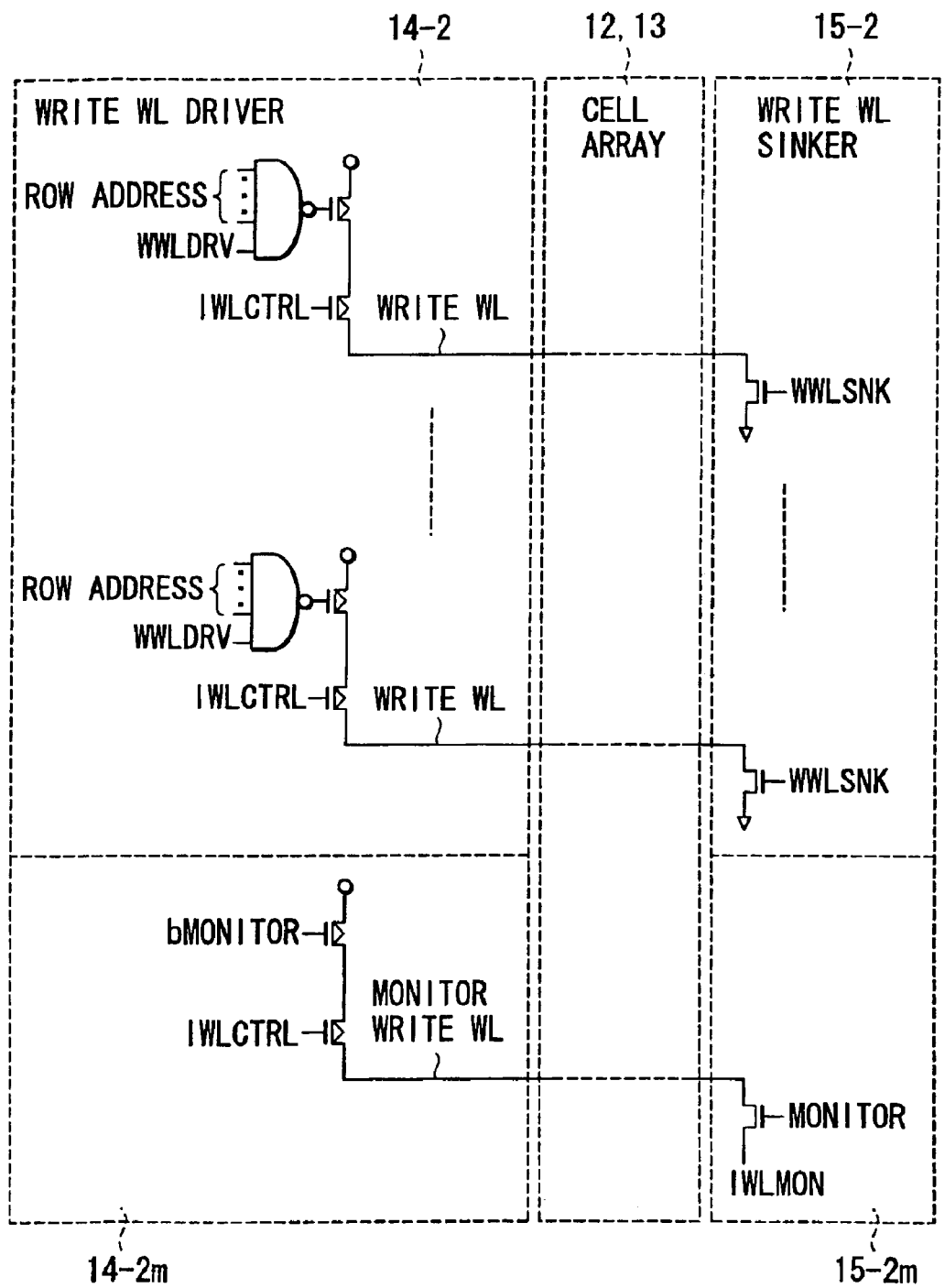
FIG. 39 is a circuit diagram showing both the write WL driver/sinker and the monitor write WL driver/sinker in FIG. 35, in the MRAM device according to the second embodiment.

FIG. 39 shows the arrangement of the write WL driver 14-2/driver 15-2, shown in FIG. 29, and their replica circuits, the monitor write WL driver 14-2m/sinker 15-2m, shown in FIG. 29. This figure shows that the replica circuits use a dummy write WL within the cell array and are arranged at one end of the cell array in its column direction. However, the arrangement of the replica circuits is not limited.

Figure 40:
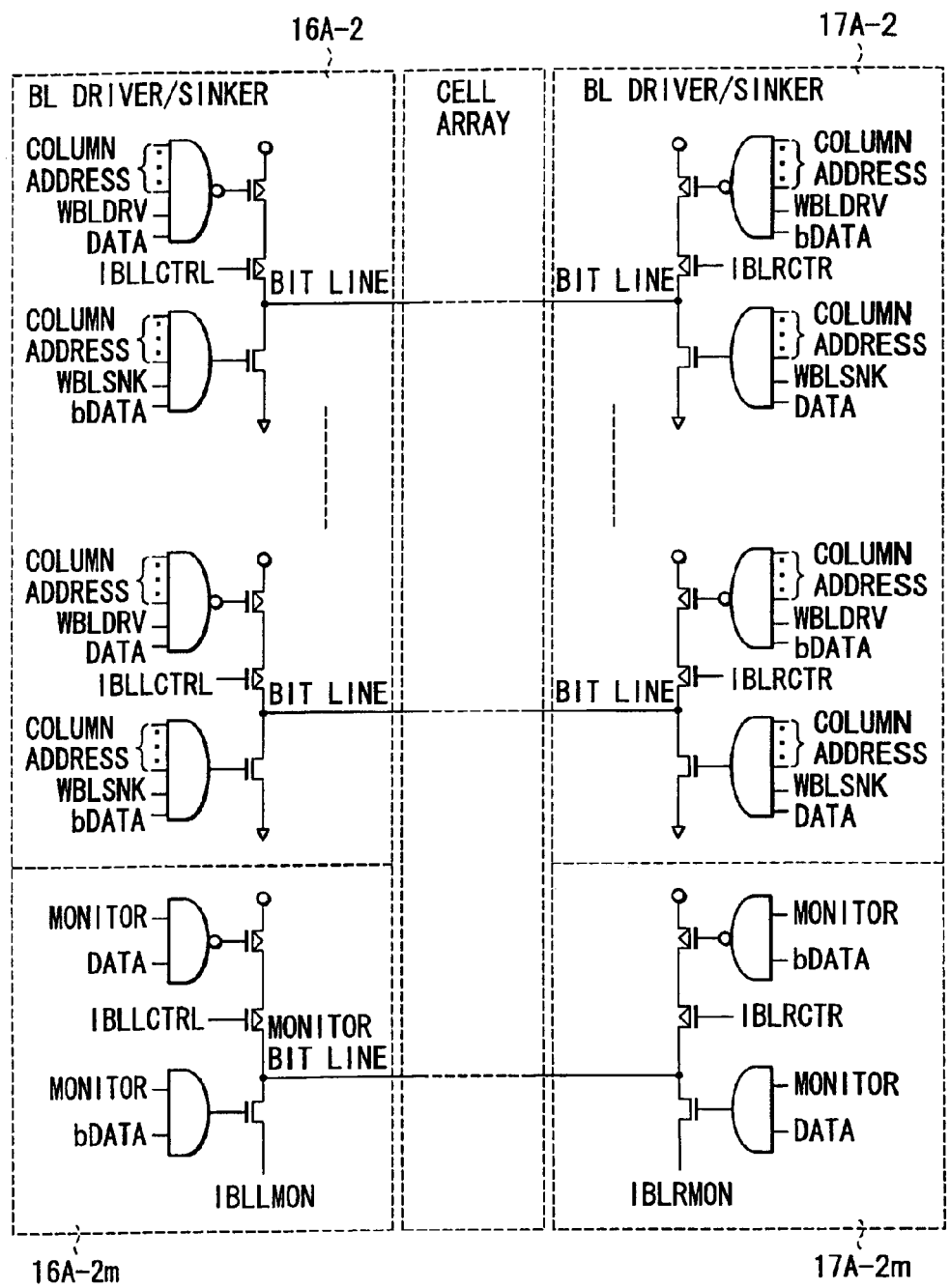
FIG. 40 is a circuit diagram showing both the write BL driver/sinker in FIG. 30 and the monitor write BL driver/sinker in FIG. 36.

FIG. 40 shows the arrangement of the write BL drivers/drivers 16A-2 and 17A-2, shown in FIG. 30, and their replica circuits, the monitor write BL drivers/sinkers 16A-2m and 17A-2m, shown in FIG. 36. This figure shows that the replica circuits use a dummy BL within the cell array and are arranged at one end of the cell array in its row direction. However, the arrangement of the replica circuits is not limited.

(MRAM Device According to a Third Embodiment)

Now, an MRAM device according to a third embodiment will be described.

Figure 41:
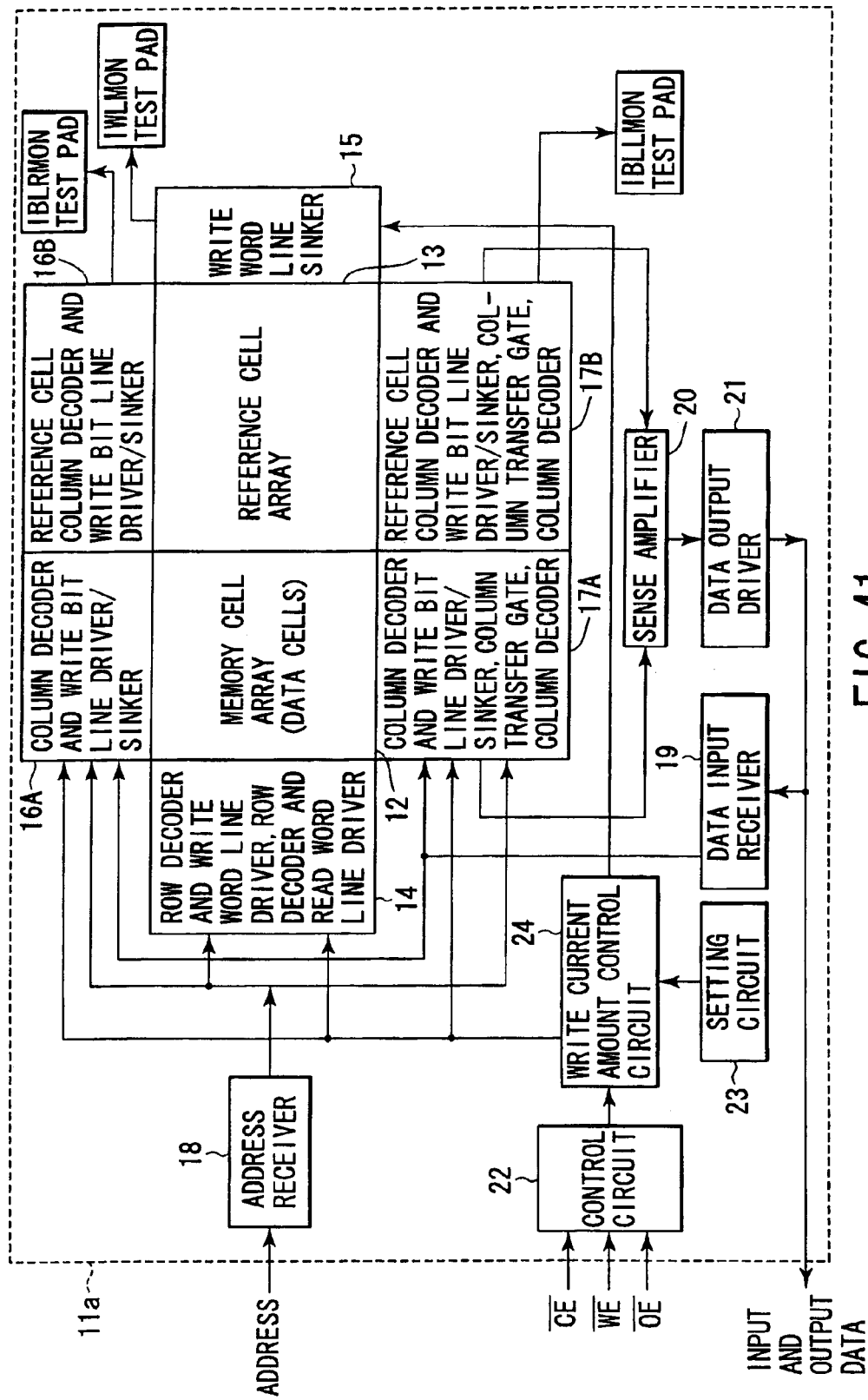
FIG. 41 is a block diagram showing the whole configuration of an MRAM device according to a third embodiment of the present invention.

FIG. 41 shows the whole configuration of the MRAM device wherein the same components as those in FIG. 19 are denoted by the same reference numerals.

In an MRAM 11a, the write WL and dummy (monitor) BL are located within the cell array on the main body in contrast with the MRAM 11, shown in FIG. 19. FIG. 41 shows the whole arrangement in which an IWLMON test pad, an IBLLMON test pad, and an IBLRMON test pad are provided as exclusive monitor terminals.

(Example in Which the Monitor Terminals IWLMON, IBLLMON, AND IBLRMON are provided as exclusive pads)

Figure 42:
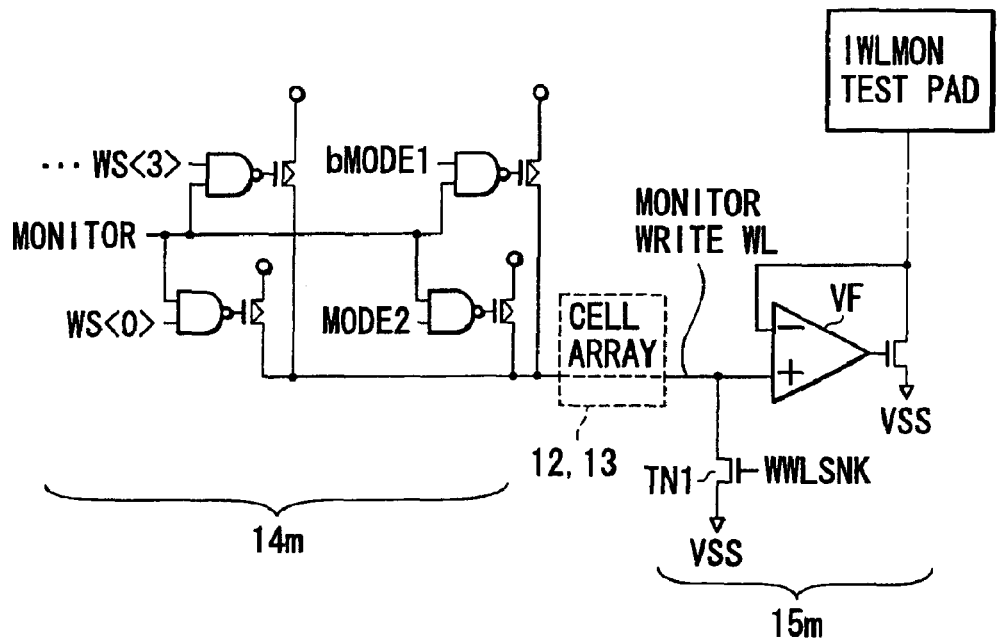
FIG. 42 is a circuit diagram showing an example of a monitor write WL driver/sinker in an MRAM device according to the third embodiment of the present invention.

FIG. 42 shows the configuration of circuits corresponding to the monitor write WL driver 14m/sinker 15m, shown in FIG. 33.

These circuits are the same as those shown in FIG. 33 except that the source of the sinker NMOS transistor TN1 is connected to the ground potential Vss of the MRAM chip and that the potential across the monitor write word line is connected to the IWLMON test pad via a voltage follower circuit VF. Thus, the same components as those in FIG. 33 are denoted by the same reference numerals.

During a write test, a current flowing into the IWLMON test pad can be monitored using a tester or the like. The IWLMON test pad is connected to the Vss pad or opened when the MRAM is mounted in equipment. The monitor write word line may be located within the cell array on the main body or another cell array.

Figure 43:
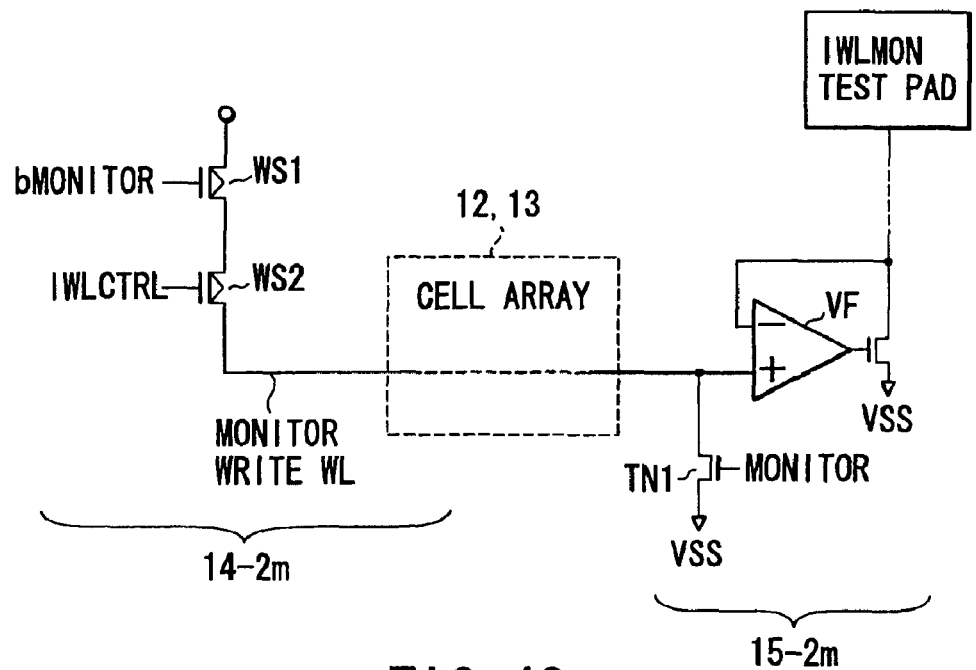
FIG. 43 is a circuit diagram showing another example of the monitor write WL driver/sinker in the MRAM device according to the third embodiment of the present invention.

FIG. 43 shows the configuration of circuits corresponding to the monitor write WL driver 14-2m/sinker 15-2m, shown in FIG. 35.

These circuits are the same as those shown in FIG. 35 except that the source of the sinker NMOS transistor TN1 is connected to the ground potential Vss of the MRAM chip and that the potential across the monitor write word line is connected to the IWLMON test pad via the voltage follower circuit VF. Thus, the same components as those in FIG. 35 are denoted by the same reference numerals.

During a write test, a current flowing into the IWLMON test pad can be monitored using a tester or the like. The IWLMON test pad is connected to the Vss pad or opened when the MRAM is mounted in equipment. The monitor write word line may be located within the cell array on the main body or another cell array.

Figure 44:
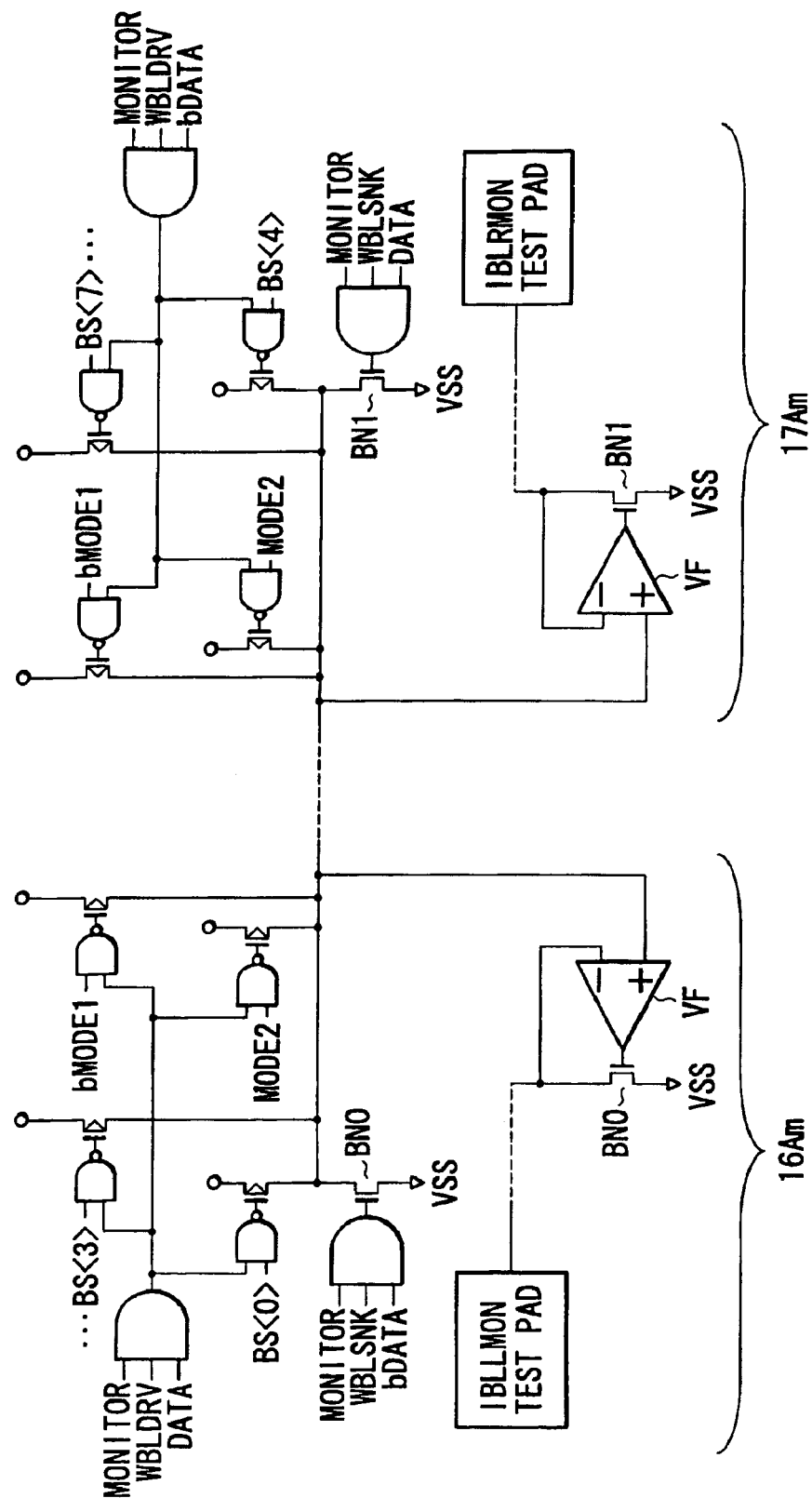
FIG. 44 is a circuit diagram showing an example of a monitor write BL driver/sinker in the MRAM device according to the third embodiment of the present invention.

FIG. 44 shows the configuration of circuits corresponding to the monitor write BL drivers/sinkers 16Am and 17Am, shown in FIG. 34.

These circuits are the same as those shown in FIG. 34 except that the sources of the sinker NMOS transistors BN0 and BN1 are connected to the ground potential Vss of the MRAM chip and that the potential across the monitor write BL is connected to the IBLLMON and IBLRMON test pads via the voltage follower circuit VF. Thus, the same components as those in FIG. 34 are denoted by the same reference numerals.

During a write test, currents flowing into the IBLLMON and IBLRMON test pads can be monitored using a tester or the like. These test pads are connected to the Vss pad or opened when the MRAM is mounted in equipment. The monitor write word line may be located within the cell array on the main body or another cell array.

Figure 45:
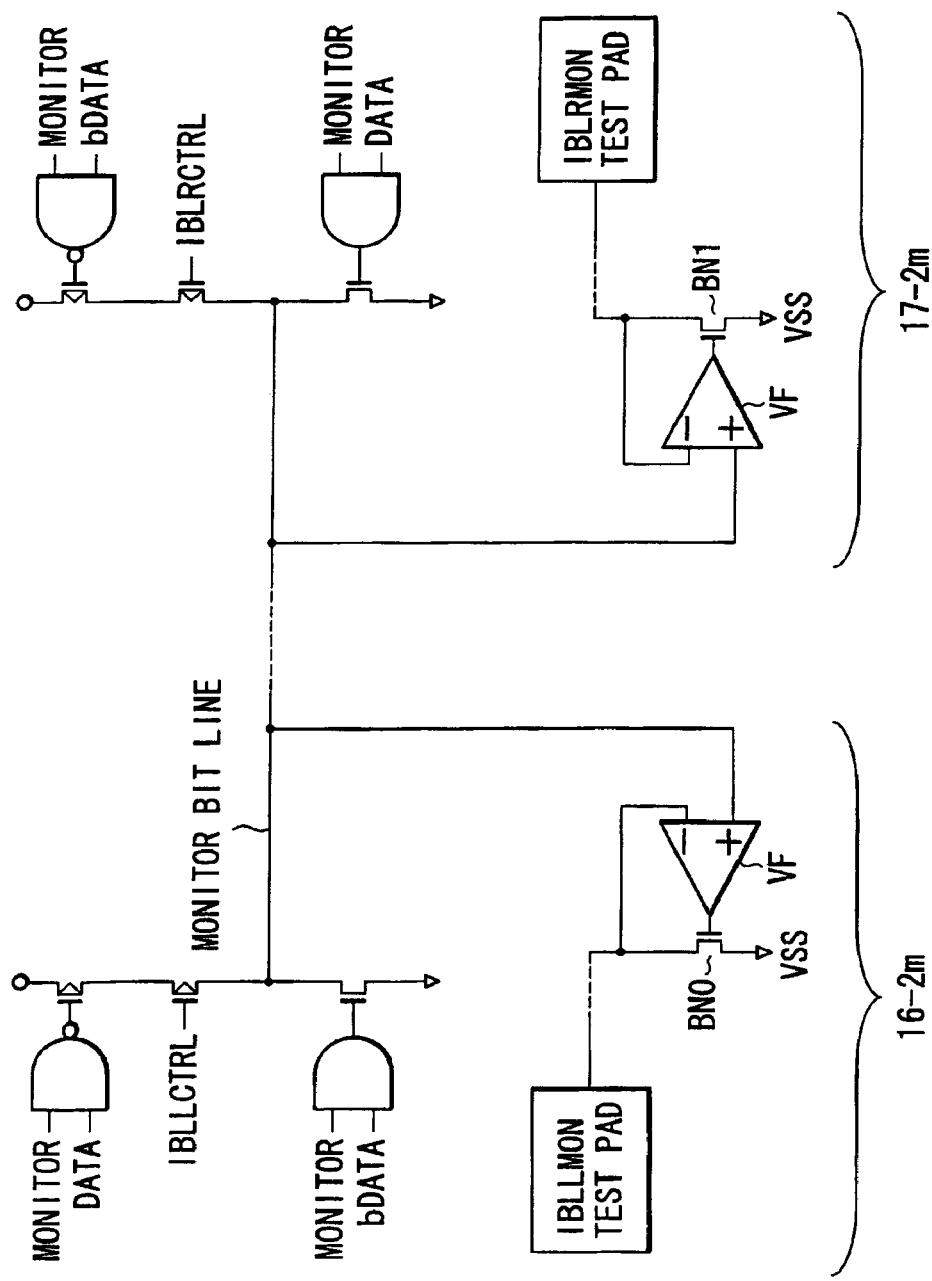
FIG. 45 is a circuit diagram showing another example of the monitor write BL driver/sinker in the MRAM device according to the third embodiment of the present invention.

FIG. 45 shows the configuration of circuits corresponding to the monitor write BL drivers/sinkers 16A-2m and 17A-2m, shown in FIG. 36.

These circuits are the same as those shown in FIG. 36 except that the sources of the sinker NMOS transistors BN0 and BN1 are connected to the ground potential Vss of the MRAM chip and that the potential across the monitor write bit line is connected to the IBLLMON and IBLRMON test pads via the voltage follower circuit VF. Thus, the same components as those in FIG. 36 are denoted by the same reference numerals.

During a write test, currents flowing into the IBLLMON and IBLRMON test pads can be monitored using a tester or the like. These test pads are connected to the Vss pad or opened when the MRAM is mounted in equipment. The monitor write word line may be located within the cell array on the main body or another cell array.

(MRAM Device According to a Fourth Embodiment)

Now, an MRAM device according to a fourth embodiment will be described.

It is possible to arrange, on a cell array independent of the cell array on the main body, the write word line used by the monitor write WL driver/sinker, shown in FIG. 33 or 34, and the dummy bit line used by the monitor write BL driver/sinker, shown in FIG. 34 or 36. In this case, the number of cells corresponding to the write word line and dummy (monitor) bit line is the same as the number of cells in the main body which correspond to the write word lines driven by the write WL driver/sinker and the bit lines driven by the write BL driver/sinker.

Figure 46:
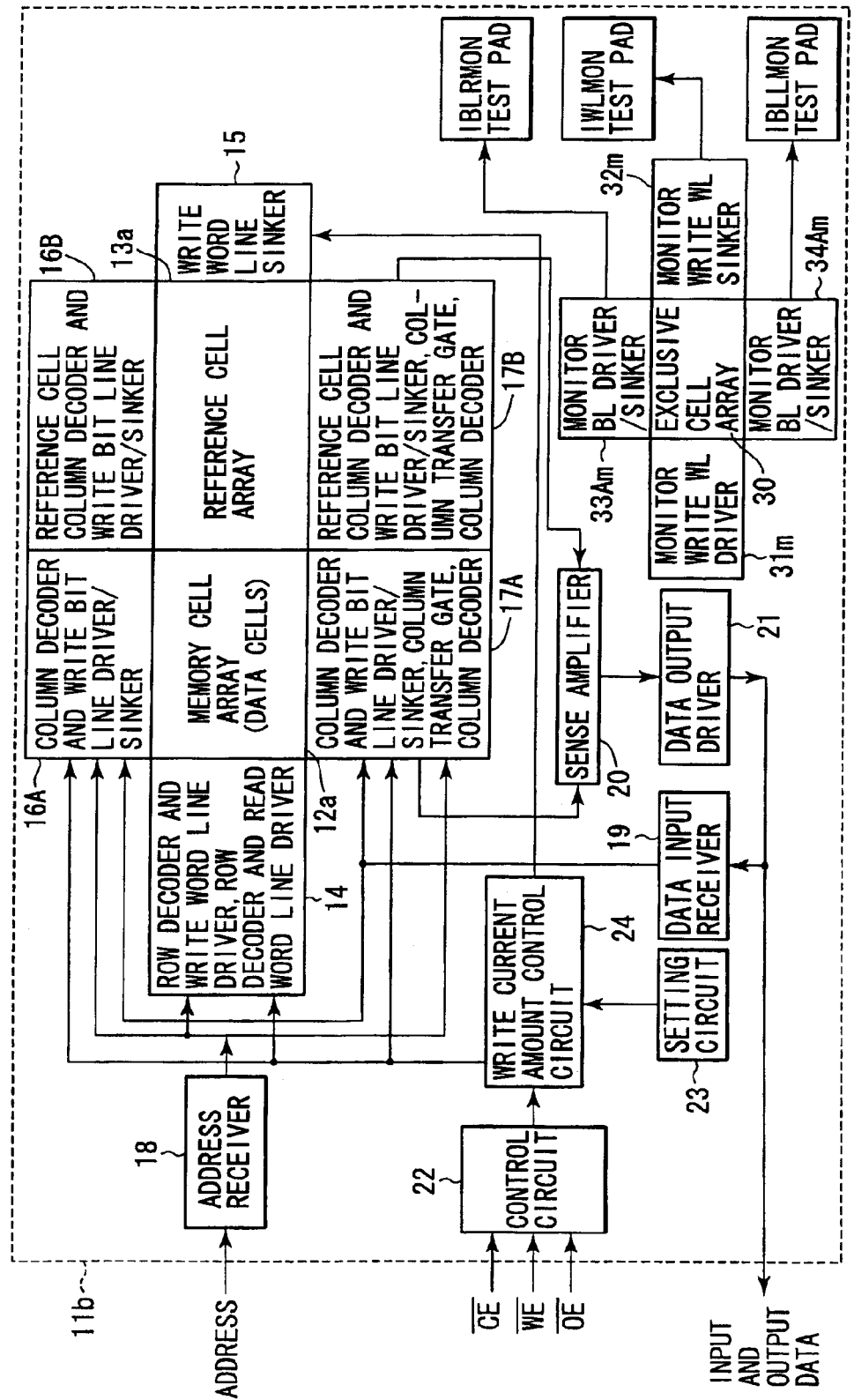
FIG. 46 is a block diagram showing the whole configuration of an MRAM device according to a fourth embodiment of the present invention.

FIG. 46 shows another example of the whole configuration of the MRAM device.

This MRAM 11b is the same as the MRAM 11, shown in FIG. 19, except for points (1) to (3), described below. Thus, the same components as those in FIG. 19 are denoted by the same reference numerals.

(1) The write word line and the dummy bit line are provided on the cell array 30 that is different from cell arrays 12 and 13 on the main body.

(2) A monitor write WL driver 31m/sinker 32m and two monitor write BL drivers/sinkers 33Am and 34Am are provided in association with the cell array 30, exclusively used for monitoring.

(3) The IWLMON test pad, the IBLLMON test pad, and the IBLRMON test pad are provided. These test pads are connected to the Vss pad or opened when the MRAM chip is mounted in equipment.

Figure 47:
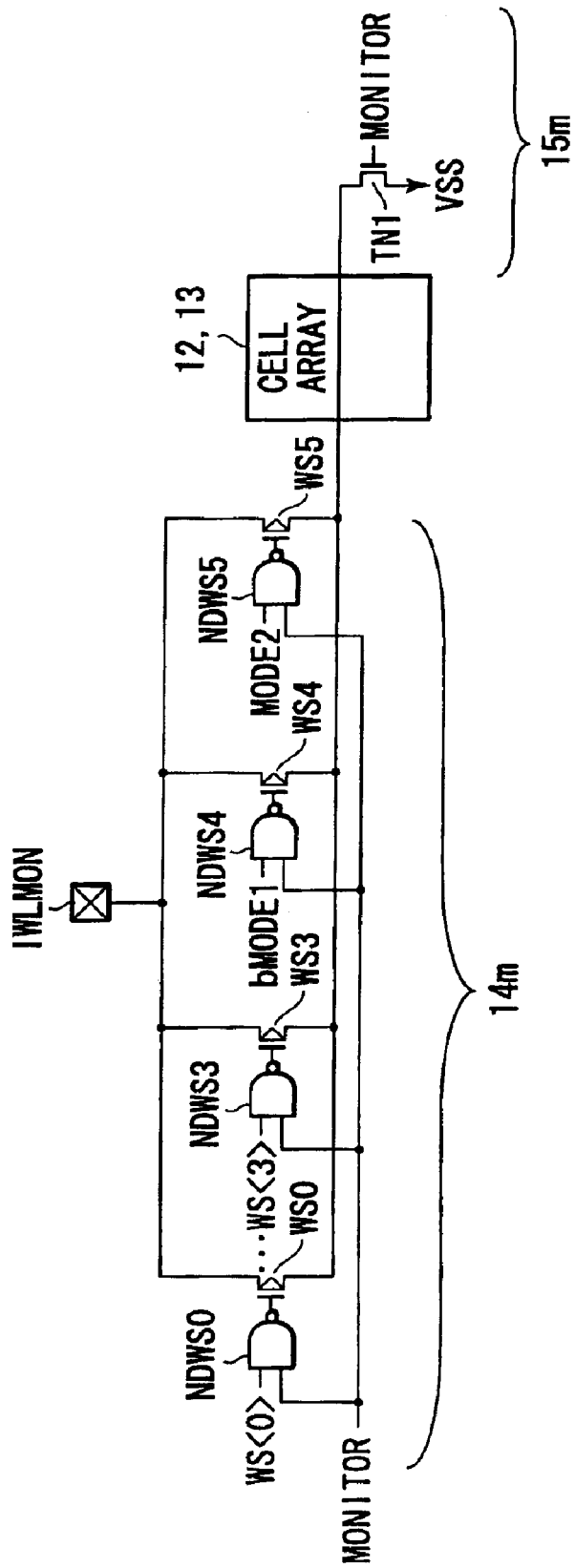
FIG. 47 is a circuit diagram showing an example of a monitor write WL driver/sinker in an MRAM device according to the fourth embodiment of the present invention.

FIG. 47 shows the configuration of circuits corresponding to the monitor write WL driver 14m/sinker 15m as the replica circuits corresponding to the write WL driver 14/sinker 15, shown in FIG. 21.

These replica circuits are the same as the write WL driver 14/sinker 15, shown in FIG. 20, except that the AND gate circuit AD1 is omitted, that the monitor mode signal MONITOR is input to one input of each of the NAND gate circuits NDWS0 to NDWS5, that the signal MONITOR is also input to the gate of the sinker NMOS transistor TN1, and that the sources of the plurality of drive PMOS transistors WS0 to WS5 are connected to the exclusive monitor terminal IWLMON. Thus, the same components as those in FIG. 20 are denoted by the reference numerals. In the monitor mode, MONITOR="H".

Figure 48:
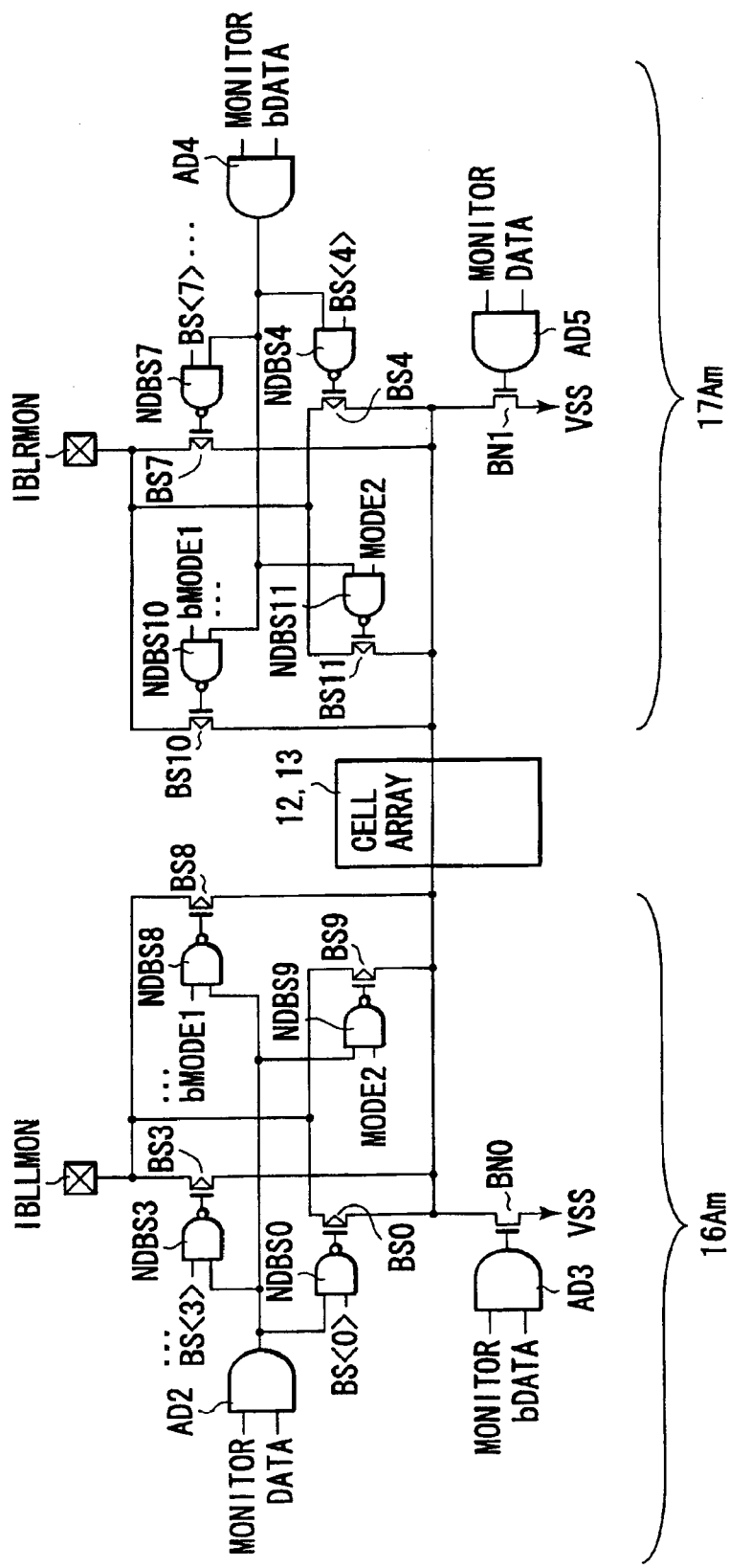
FIG. 48 is a circuit diagram showing an example of a monitor write BL driver/sinker in the MRAM device according to the fourth embodiment of the present invention.

FIG. 48 shows the configuration of circuits corresponding to the monitor write BL drivers/sinkers 16Am and 17Am as the replica circuits corresponding to the write BL drivers/sinkers 16A and 17A, shown in FIG. 21.

These replica circuits are the same as the write BL drivers/sinkers 16A and 17A, shown in FIG. 21, except that the signals MONITOR and DATA are input to the AND gate circuit AD2, that the signals MONITOR and bDATA are input to the AND gate circuit AD3, that the signals MONITOR and bDATA are input to the AND gate circuit AD4, that the signals MONITOR and DATA are input to the AND gate circuit AD5, that the sources of the plurality of drive PMOS transistors BS0 to BS3, BS8, and BS9 in the driver/sinker 16A are connected to the exclusive monitor terminal IBLLMON, and that the sources of the plurality of drive PMOS transistors BS4 to BS7, BS10, and BS11 in the driver/sinker 17A are connected to the exclusive monitor terminal IBLRMON. Thus, the same components as those in FIG. 21 are denoted by the reference numerals. In the monitor mode, MONITOR="H".

Figure 49:
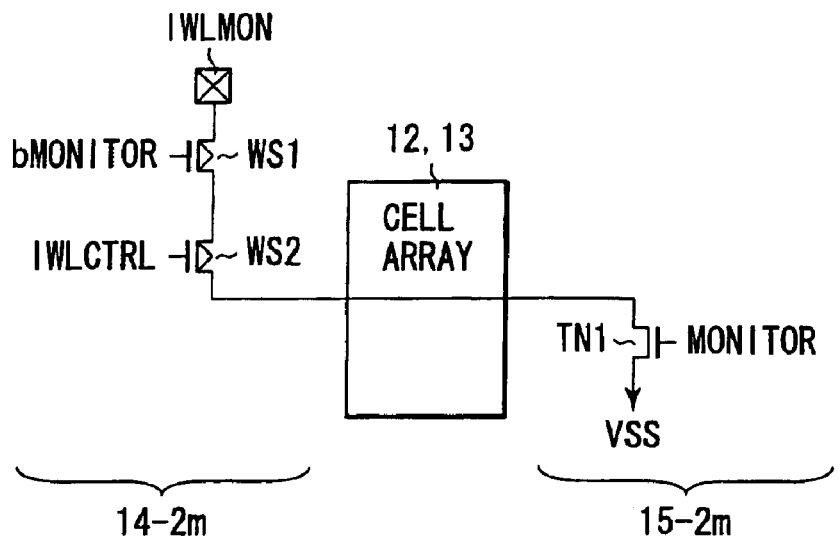
FIG. 49 is a circuit diagram showing another example of the monitor write WL driver/sinker in the MRAM device according to the fourth embodiment of the present invention.

FIG. 49 shows the configuration of circuits corresponding to the monitor write WL driver 14-2m/sinker 15-2m as the replica circuits corresponding to the write WL driver 14-2/sinker 15-2, shown in FIG. 29.

These replica circuits are the same as the write WL driver 14-2m/sinker 15-2m, shown in FIG. 29, except that the AND gate circuit AD1 is omitted, that the inverted monitor control signal bMONITOR is input to the gate of the PMOS transistor WS1, that the signal MONITOR is input to the gate of the sinker NMOS transistor TN1, and that the exclusive monitor terminal IWLMON is connected to the source of the monitor word line selecting PMOS transistors WS1 in the driver 14-2. Thus, the same components as those in FIG. 29 are denoted by the reference numerals. In the monitor mode, MONITOR="H" and bMONITOR="L".

Figure 50:
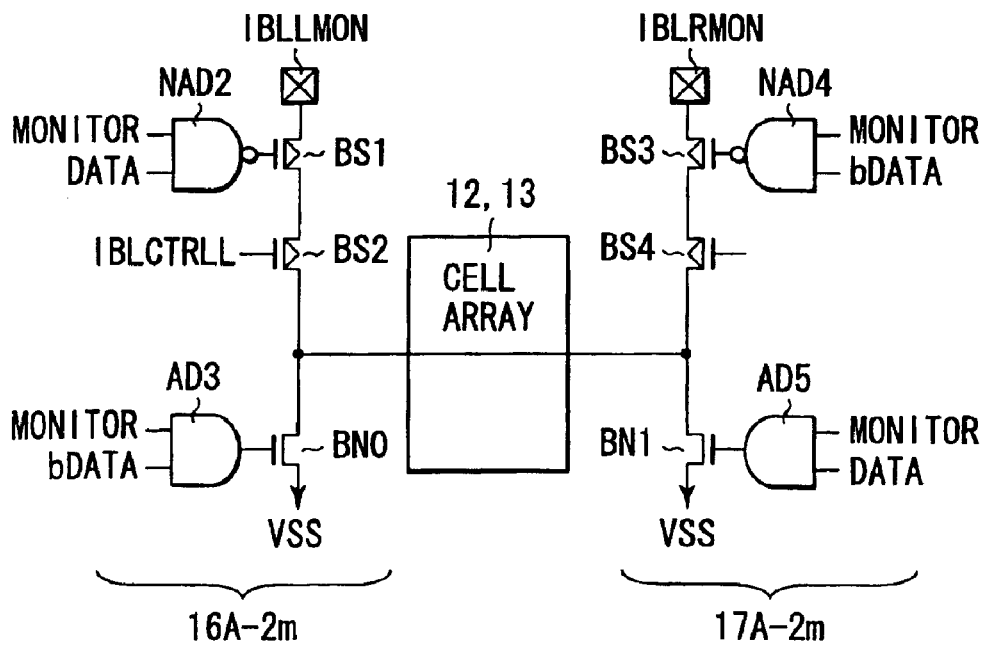
FIG. 50 is a circuit diagram showing another example of the monitor write BL driver/sinker in the MRAM device according to the fourth embodiment of the present invention.

FIG. 50 shows the configuration of circuits corresponding to the monitor write BL drivers/sinkers 16A-2m and 17A-2m as the replica circuits corresponding to the write BL drivers/sinkers 16A-2 and 17A-2, shown in FIG. 30.

These replica circuits are the same as the write BL drivers/sinkers 16A-2 and 17A-2, shown in FIG. 30, except that the signals MONITOR and DATA are input to the NAND gate circuit NAD2, that the signals MONITOR and bDATA are input to the AND gate circuit AD3, that the signals MONITOR and bDATA are input to the AND gate circuit AD4, that the signals MONITOR and DATA are input to the AND gate circuit AD5, that the source of the monitor word line selecting PMOS transistor BS1 in the driver/sinker 16A is connected to the exclusive monitor terminal IBLLMON, and that the source of the monitor word line selecting PMOS transistor BS3 in the driver/sinker 17A is connected to the exclusive monitor terminal IBLRMON. Thus, the same components as those in FIG. 30 are denoted by the reference numerals. In the monitor mode, MONITOR="H" and bMONITOR="L".

(Example of a Test Sequence)

Figure 51:
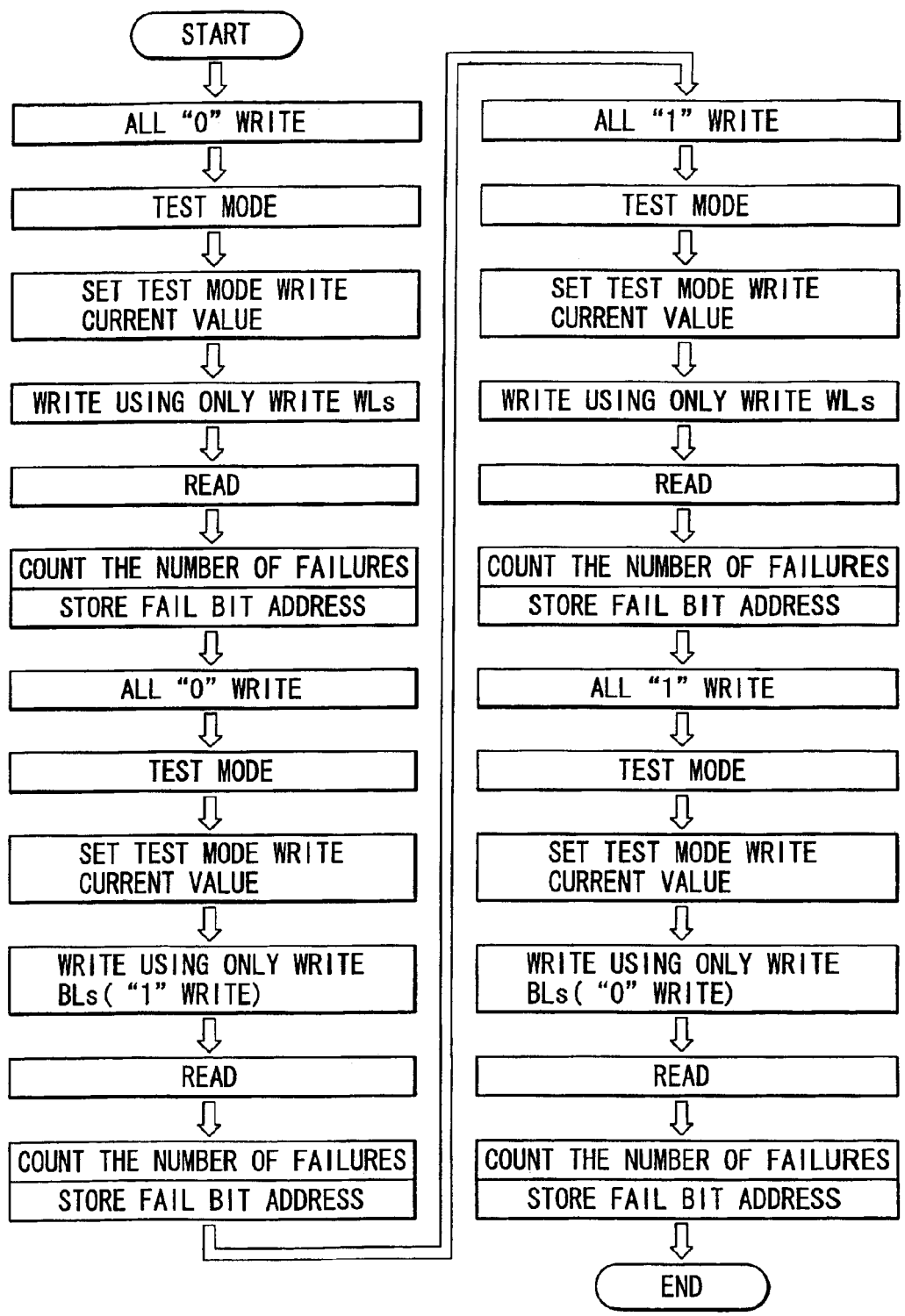
FIG. 51 is a flow chart showing an example of a test sequence for the MRAM devices according to the first, second, third, and fourth embodiments.

FIG. 51 is a flow chart showing an example of a test sequence used if a memory tester or the like is used to carry out a write test in the MRAM devices according to the first, second, third, and fourth embodiments of the present invention.

First, data "0" is written in all the memory cells of the memory cell array (All "0" write). Then, the test mode is activated and the test mode write current value is set. Then, a write is executed using only the write word lines. Then, the data is read from the memory cells. It is checked whether or not there have been any failures. If there are any failures, the number of them is counted and the corresponding fail bit addresses are stored.

Then, data "1" is written in all the memory cells of the memory cell array (All "1" write). Then, the test mode is activated and the test mode write current value is set. Then, a write is executed using only the write word lines. Then, the data is read from the memory cells. It is checked whether or not there have been any failures. If there are any failures, the number of them is counted and the corresponding fail bit addresses are stored.

Then, the data "1" is written in all the cells of the memory cell array again. Then, the test mode is activated and the test mode write current value is set. Then, a write is executed using only the write bit lines for a "0" write. Then, the data is read from the memory cells. It is checked whether or not there have been any failures. If there are any failures, the number of them is counted and the corresponding fail bit addresses are stored.

In the example in the flow chart, the test is carried out using an all "0" write and then an all "1" write. However, this order may be reversed. Further, the write test is executed only on the write word lines and then only on the write bit lines. However, this order may be reversed.

A circuit that realizes the switching of the write current in the write test mode is applicable regardless of the type of the cell array structure of the MRAM device. That is, the circuit is applicable not only to, for example, a cross point type cell array structure but also an MRAM device having a cell array structure in which one read selecting switch is connected to one or more MTJ elements. It is also applicable to an MRAM device not having any read selecting switches, an MRAM device in which read bit lines are provided separately from write bit lines, and an MRAM device in which a plurality of bits are stored in one MTJ element. And the circuit is applicable not restricted the MTJ configuration, for example, the double junction or the synthetic anti-ferromagnetic pinned layer structure or the synthetic anti-ferromagnetic free layer structure, etc.

As described above, with the MRAM devices according to the first, second, third, and fourth embodiments, a plurality of values can be set for the write current in the write test mode. Consequently, the miswrite margin and the write margin can be evaluated by setting current values larger and smaller than that used for normal operations. This improves reliability.

The MRAM devices according to the first, second, third, and fourth embodiments of the present invention can be applied in various manners. Some of these applied examples will be described below.

(Applied Example 1)

Figure 52:
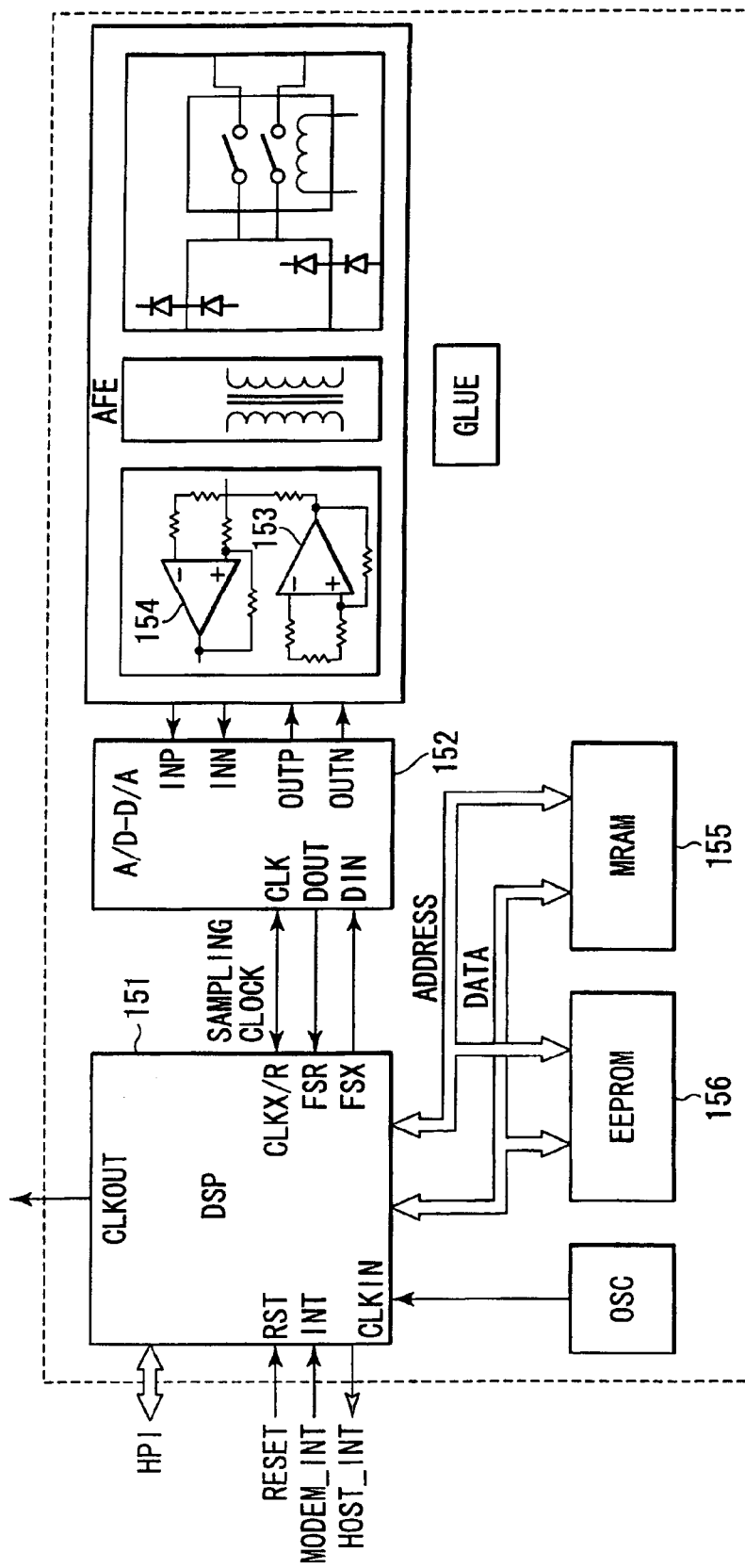
FIG. 52 is a block diagram showing a DLS data path portion of a digital subscriber modem that is a first example of the application of the MRAM devices according to the first, second, third, and fourth embodiments.

As an example in which the MRAM device is applied, FIG. 52 shows a DSL data path portion of a digital subscriber line (DSL) modem. This modem includes a programmable digital signal processor (DSP) 151, an analog to digital converter (ADC) and digital to analog converter (DAC) 152, a transmission driver 153, and a receiver amplifier 154. In FIG. 52, a band pass filter is omitted. Instead, this figure shows an MRAM 155 and an EEPROM 156 according to the present invention as optional memories of the type that can hold a circuit code program.

In the present applied example, the two types of memories, i.e. the MRAM and the EEPROM, are used as a memory for holding the circuit code program. However, the EEPROM may be replaced with an MRAM. That is, the MRAMs alone may be used instead of the two types of memories.

(Applied Example 2)

Figure 53:
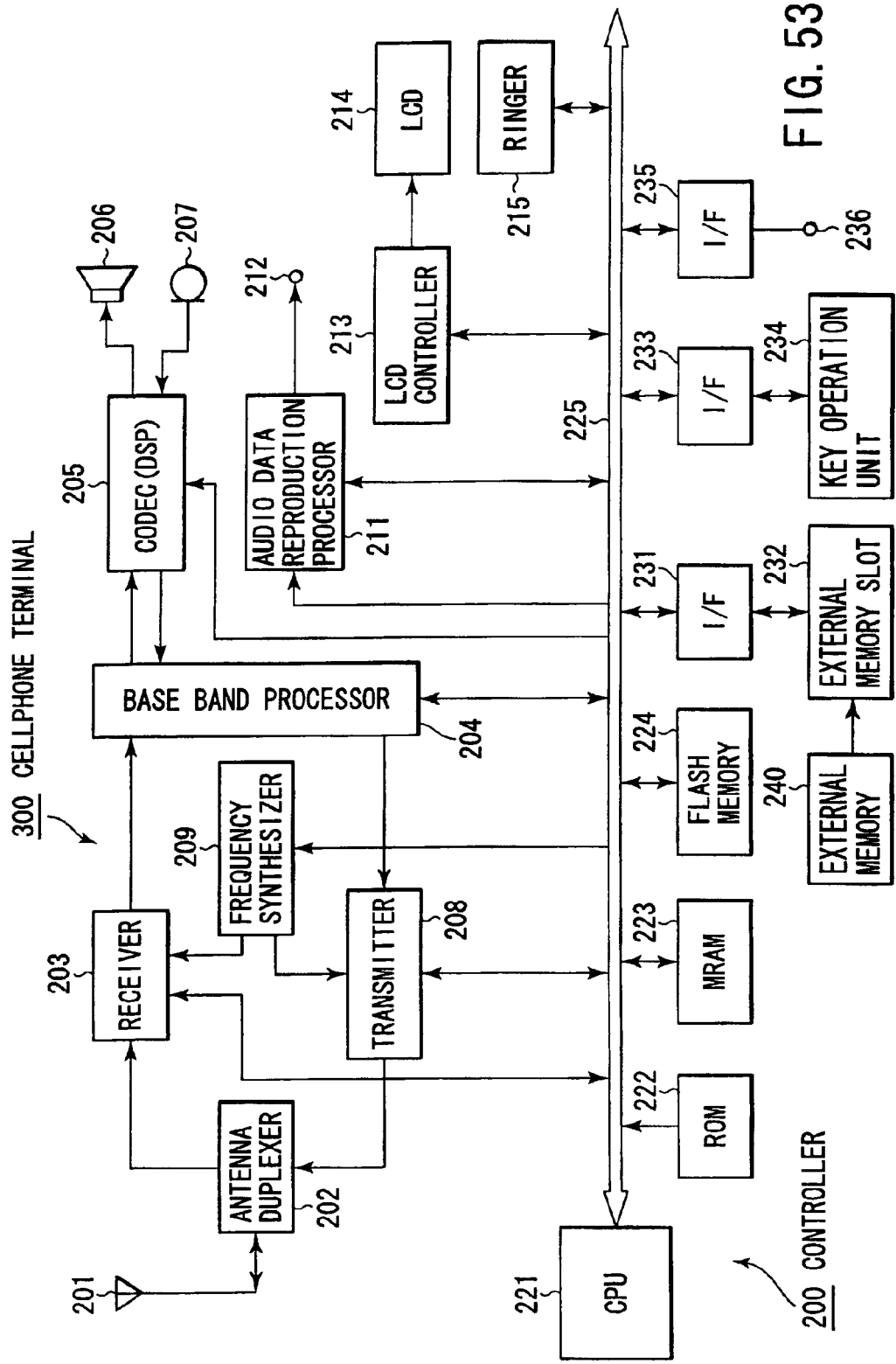
FIG. 53 is a block diagram showing a portion of a cellphone which implements a communication function, the cellphone being a second example of the application of the MRAM devices according to the first, second, third, and fourth embodiments.

As another example in which the MRAM device is applied, FIG. 53 shows a portion of a cellphone terminal 300 which realizes a communication function. As shown in FIG. 53, the portion realizing the communication function comprises a transmission and reception antenna 201, an antenna duplexer 202, a receiver 203, a base band processor 204, a digital signal processor (DSP) used as a sound codec, a speaker 206, a microphone 207, a transmitter 208, and a frequency synchronizer 209.

Further, as shown in FIG. 53, the cellphone terminal 300 is provided with a controller 200 that controls each section of the cellphone terminal. The controller is a microcomputer composed of a CPU 221, a ROM 222, an MRAM 223 according to the present invention, and a flash memory 224 all of which are connected together through a CPU bus 225.

Here, the ROM 222 already stores programs executed in the CPU 221 and required data such as display fonts. Further, the MRAM 223 is mainly used as a work area to store as required data being calculated while the CPU 221 is running a program or to store temporarily data transmitted to or received from a relevant section. Further, if for example, the cellphone terminal 300 is used in such a manner that when the cellphone terminal 300 is powered off, the last set conditions and the like are stored so that the same settings are effected the next time the terminal 300 is powered on, the flash memory 224 stores these setting parameters. That is, the flash memory 224 is non-volatile, so that even when the cellphone terminal is powered off, the data stored in this memory is not lost.

In the present applied example, the ROM 222, the NRAM 223, and the flash memory 224 are used. However, the flash memory 224 may be replaced with the MRAM device according to the present invention. Furthermore, the ROM 222 may also be replaced with the MRAM device according to the present invention.

In FIG. 53, reference numerals 211 and 212 denote an audio data reproduction processor and an external terminal connected to the sound data processing section 211. Reference numerals 213 and 214 denote an LCD controller and an LCD connected to the LCD controller 213. Reference numerals 215 and 231 denote a ringer and an interface provided between the CPU bus 225 and an external memory slot 232. Reference numerals 233 and 235 denote an interface provided between the CPU bus 225 and a key operation unit 234, and an interface provided between the CPU bus 225 and an external terminal 236. An external memory is inserted into an external memory slot 232.

(Applied Example 3)

Figure 54:
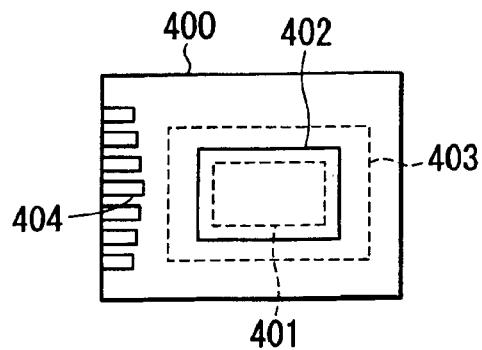
FIG. 54 is a plan view showing an example in which the MRAM devices according to the first, second, third, and fourth embodiments are applied to an MRAM card that houses media contents such as Smart Media.
Figure 58:
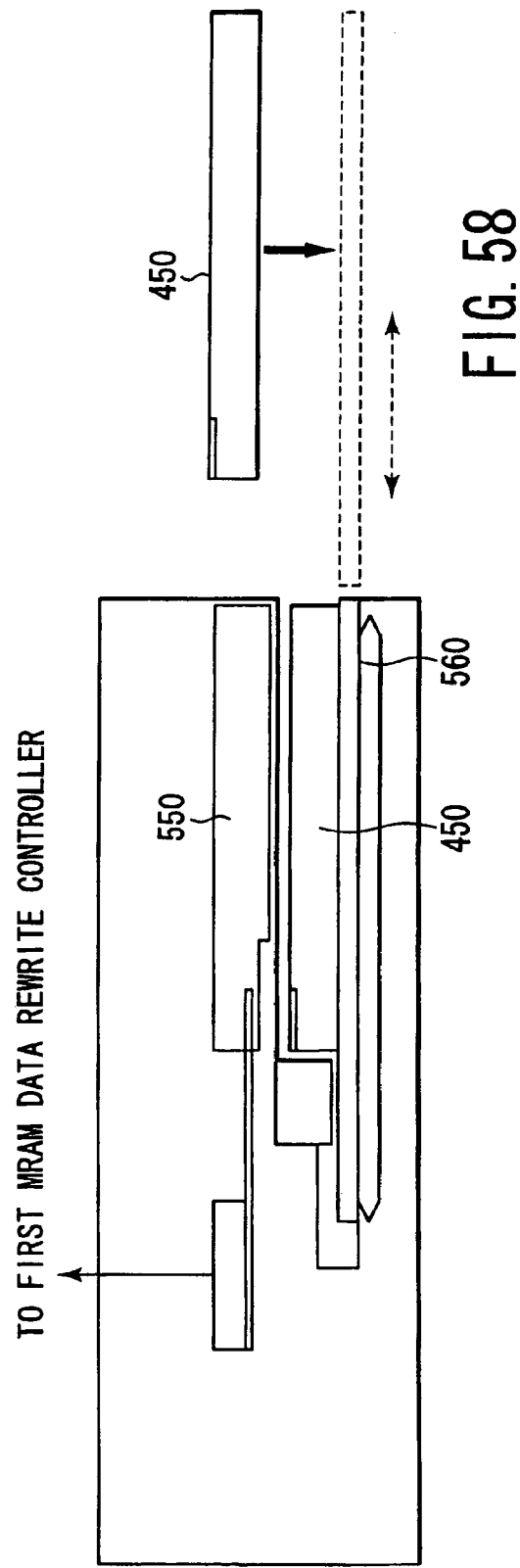
FIG. 58 is a sectional view showing a slide type data transfer apparatus as yet another example of the electronic apparatus that uses the MRAM card in FIG. 54.

FIGS. 54 and 58 shows an example in which the MRAM device according to the present invention is applied to a card (MRAM card) that embodies a removable media such as a Smart Media card.

In the plan view in FIG. 54, reference numerals 400, 401, and 402 denote an MRAM card main body, an MRAM chip, and an opening. Reference numerals 403 and 404 denote a shutter and a plurality of external terminals. The MRAM chip 401 is housed inside the card main body 400 and exposed from the opening 402. When the MRAM card is carried, the MRAM chip 401 is covered with the shutter 403. The shutter 403 is composed of a material that is effective in blocking external magnetic fields, e.g. ceramics. To transfer data, the shutter 403 is opened to expose the MRAM chip 401. The external terminal 404 is used to unload and transmit contents data stored in the MRAM card to external equipment.

Figure 55:
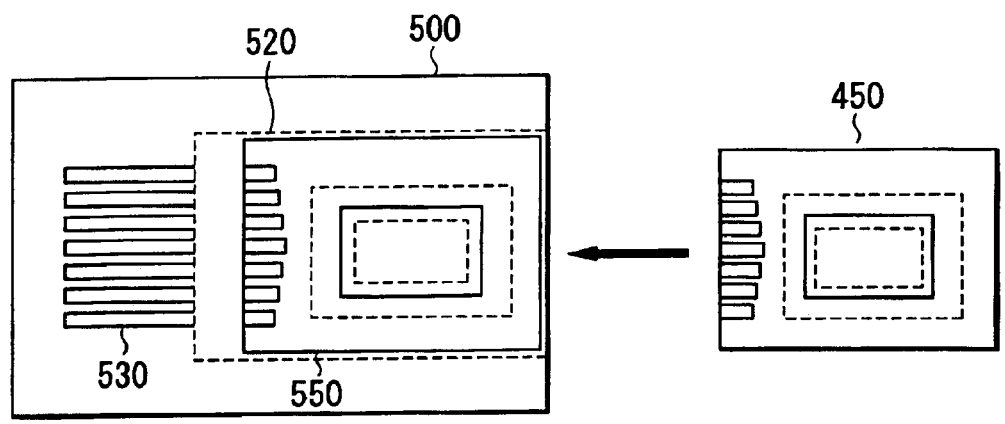
FIG. 55 is a plan view showing an insertion type data transfer apparatus as an example of an electronic apparatus that uses the MRAM card in FIG. 54.
Figure 56:
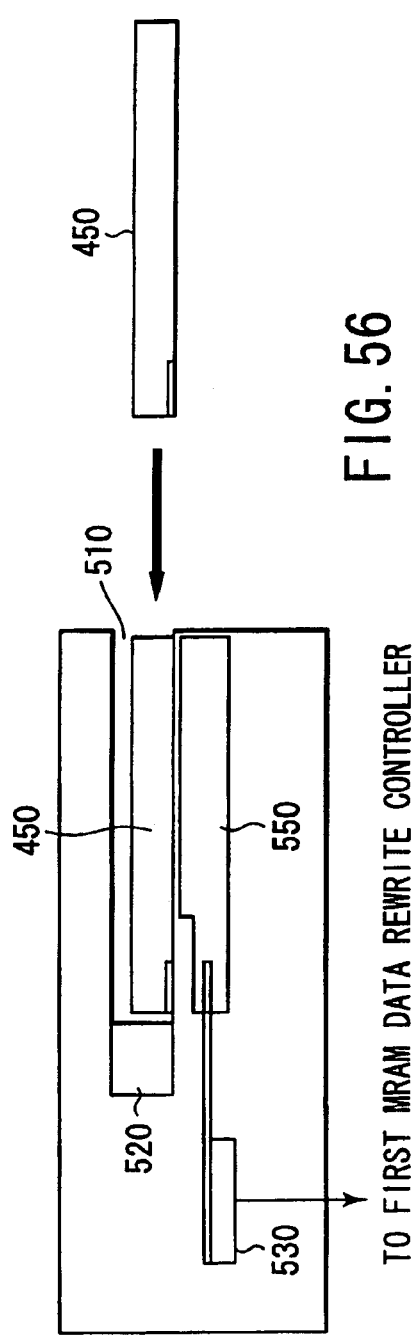
FIG. 56 is a sectional view corresponding to FIG. 54.

FIGS. 55 and 56 are a plan and side views, respectively, of a card insertion type transfer apparatus that transfers data to the MRAM card. A second MRAM card 450 used by an end user is inserted through an insertion section 510 of a transfer apparatus 500 and is pushed until it is stopped by a stopper 520. The stopper 520 is also used as a member for aligning a first MRAM card 550 with the second MRAM card 450. Once the second MRAM card 450 is placed in position, the data stored in the first MRAM card 550 is transferred to the second MRAM card 450.

Figure 57:
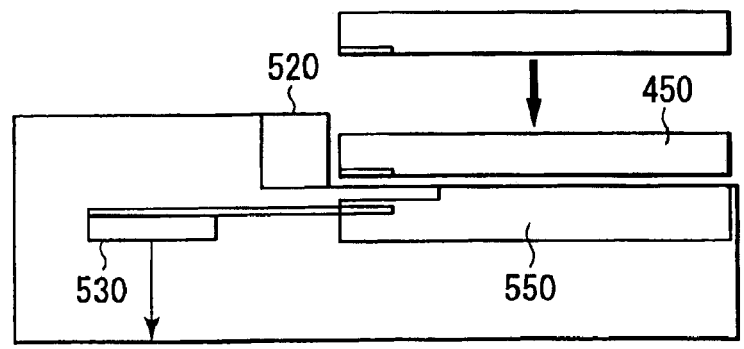
FIG. 57 is a sectional view showing a fit-in type data transfer apparatus as another example of the electronic apparatus that uses the MRAM card in FIG. 54.

FIG. 57 is a side view of a fit-in type transfer apparatus. With this type of transfer apparatus, the second MRAM card 450 is fitted over the first MRAM card 550 so as to abut the stopper 520 as shown by the arrow in the figure. A transfer method used by this type is similar to that for the card insertion type. Accordingly, its description is omitted.

FIG. 58 is a side view of a slide type transfer apparatus. As in the case with a CD-ROM drive or a DVD drive, a sliding tray 560 is provided in the transfer apparatus 500. The sliding tray 560 slides as shown by the horizontal arrow in the figure. When the sliding tray 560 moves as shown by the broken lines in the figure, the second MRAM card 450 is placed on the sliding tray 560. Subsequently, the sliding tray 560 conveys the second MRAM card 450 to the interior of the transfer apparatus 500. This type is the same as the card insertion type in terms of the point that the second MRAM card is conveyed so that its tip abuts the stopper 520 and in terms of the transfer method. Accordingly, the description of these points is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory device comprising:
    a first memory cell array in which a plurality of memory cells two-dimensionally arranged in a row direction and a column direction and each composed of a magnetoresistive effect element;
    a write circuit that writes data in the memory cells, by causing a first current to flow along the row direction of the first memory cell array to generate magnetic fields in the row direction and causing a second current to flow along the column direction of the first memory cell array to generate magnetic fields in the column direction; and
    a control circuit connected to the write circuit to control the write circuit so that, one of a plurality of set values for the first current flowing along the row direction and one of a plurality of set values for the second current flowing along the column direction are selected so as to allow the first and second currents to flow in accordance with the selected set values, respectively.

2. The magnetic random access memory device according to claim 1, wherein the write circuit includes:
    a first write line which is extended along the row direction of the first memory cell array and through which the first current flows to generate magnetic fields in the column direction; and
    a second write line which is extended along the column direction of the first memory cell array and through which the second current flows to generate magnetic fields in the column direction.

3. The magnetic random access memory device according to claim 2, wherein the write circuit further includes:
    a first drive circuit that drives the first current;
    a first sinker circuit that sinks the first current;
    a second drive circuit that drives the second current;
    a second sinker circuit that sinks the second current; and
    monitor circuit that monitor the first current and second current.

4. The magnetic random access memory device according to claim 3, wherein the first drive circuit and the second drive circuit each have a plurality of current sources and switch the plurality of current sources to vary the value of the first or second current, respectively.

5. The magnetic random access memory device according to claim 3, wherein the first drive circuit and the second drive circuit each have a current source transistor and control a gate bias of the current source transistor to vary the value of the first or second current, respectively.

6. The magnetic random access memory device according to claim 3, wherein the first drive circuit ends a drive operation before the first sinker circuit ends a sinker operation, and
    the second drive circuit ends a drive operation before the second sinker circuit ends a sinker operation.

7. The magnetic random access memory device according to claim 3, wherein the monitor circuit includes:
    at least one monitor row line;
    at least one monitor column line;
    a third drive circuit composed of a replica circuit of the first drive circuit and connected to the at least one monitor row line;
    a third sinker circuit composed of a replica circuit of the first sinker circuit and connected to the at least one monitor row line;
    a fourth drive circuit composed of a replica circuit of the second drive circuit and connected to the at least one monitor column line;
    a fourth sinker circuit composed of a replica circuit of the second sinker circuit and connected to the at least one monitor column line.

8. The magnetic random access memory device according to claim 7, wherein the at least one monitor row line and the at least monitor column line are provided on the first memory cell array,
    the third drive circuit is arranged adjacent to the first drive circuit,
    the third sinker circuit is arranged adjacent to the first sinker circuit, the fourth drive circuit is arranged adjacent to the second drive circuit, and the fourth sinker circuit is arranged adjacent to the second sinker circuit.

9. The magnetic random access memory device according to claim 7, wherein the at least one monitor row line and the at least one monitor column line are provided on a second memory cell array exclusively used for monitoring, the second memory cell array being separate from the first memory cell array, and the third drive circuit, the third sinker circuit, the fourth drive circuit, and the fourth sinker circuit are arranged adjacent to the second memory cell array exclusively.

10. The magnetic random access memory device according to claim 7, further comprising:

a first monitor terminal exclusively used to monitor a current and connected to the third sinker circuit; and a second monitor terminal exclusively used to monitor a current and connected to the fourth sinker circuit.

11. The magnetic random access memory device according to claim 10, wherein the third sinker circuit has a first MOS transistor having one end connected to the at least one monitor row line and the other end connected to the first monitor terminal, and the fourth sinker circuit has a second MOS transistor having one end connected to the at least one monitor column line and the other end connected to the second monitor terminal.

12. The magnetic random access memory device according to claim 10, wherein the third sinker circuit includes:

a third MOS transistor connected between the at least one monitor row line and a ground node;

a first voltage follower circuit connected to the at least monitor row line to output the same potential as that across the at least one monitor row line and having an output node connected to the first monitor terminal; and a fourth MOS transistor connected between an output node of the first voltage follower circuit and the ground node.

13. The magnetic random access memory device according to claim 10, wherein the fourth sinker circuit includes:

a fifth MOS transistor connected between the at least one monitor column line and the ground node;

a second voltage follower circuit connected to the at least monitor column line to output the same potential as that across the at least one monitor column line and having an output node connected to the second monitor terminal; and a sixth MOS transistor connected between an output node of the second voltage follower circuit and the ground node.

14. The magnetic random access memory device according to claim 7, further comprising:

a third monitor terminal exclusively used to monitor a current and connected to the third drive circuit; and a fourth monitor terminal exclusively used to monitor a current and connected to the fourth driver circuit.

15. The magnetic random access memory device according to claim 14, wherein the at least one monitor row line and the at least one monitor column line are composed of a plurality of monitor row lines and a plurality of monitor column lines, respectively, the third drive circuit has a plurality of first PMOS transistors each having one end connected to a corresponding one of the plurality of monitor row lines and the other end, the other ends of all the first PMOS transistors being connected to the third monitor terminal, and the fourth drive circuit has a plurality of second PMOS transistors each having one end connected to a corresponding one of the plurality of monitor column lines and the other end, the other ends of all the second PMOS transistors being connected to the fourth monitor terminal.

16. The magnetic random access memory device according to claim 14, wherein the third drive circuit has a third PMOS transistor and a fourth PMOS transistor connected in series between the at least one monitor row line and the third monitor terminal, the third PMOS transistor being used to select the at least one monitor row line, and the fourth PMOS transistor which controls a current.

17. The magnetic random access memory device according to claim 14, wherein the fourth drive circuit has a fifth PMOS transistor and sixth PMOS transistor connected in series between the at least one monitor column line and the fourth monitor terminal, the fifth PMOS transistor being used to select the at least one monitor column line, and the sixth PMOS transistor which controls a current.

18. The magnetic random access memory device according to claim 1, wherein the plurality of set values are assumed to be used for the same semiconductor chip in the same operating environment.

19. The magnetic random access memory device according to claim 1, wherein the plurality of set values for the first current are such that at least one of the set values is provided above and below a set value for a first current flowing in the row direction during a normal operation, and the plurality of set values for the second current are such that at least one of the set values is provided above and below a set value for a first current flowing in the row direction during a normal operation.

20. A magnetic random access memory device comprising:

a first write line and a second write line provided to cross each other;

a magnetoresistive element arranged at a position at which the first write line and the second write line cross each other;

a first driver circuit connected to the first write line to supply a first write current to the first write line;

a second driver circuit connected to the second write line to supply a second write current to the second write line;

a setting circuit which holds first setting data used to control the amount of first write current and second setting data used to control the amount of second write current; and a control circuit connected to the first and second driver circuits and to the setting circuit to control the first and second driver circuit so as to switch, the amounts of first and second write currents between at least two levels on the basis of the first and second setting data, respectively, held by the setting circuit.

21. The magnetic random access memory device according to claim 20, wherein the control circuit controls the first and second driver circuits to switch each of the amounts of first and second write currents among at least three values so that at least one current set value is provided both above and below a current set value for normal operations.

22. The magnetic random access memory device according to claim 20, further comprising:

a first sinker circuit that sinks the first write current; and a second sinker circuit that sinks the second write current.

23. The magnetic random access memory device according to claim 22, wherein the first sinker circuit ends a sinker operation a specified period after the first driver circuit has ended a drive operation.

24. The magnetic random access memory device according to claim 22, wherein the second sinker circuit ends a sinker operation a specified period after the second driver circuit has ended a drive operation.

25. The magnetic random access memory device according to claim 20, wherein the first driver circuit has a plurality of first current sources, and the first setting data is used to control operations of some of the plurality of first current sources, and the control circuit controls operations of others of the plurality of first current sources on the basis of the first setting data to switch the amount of first write current.

26. The magnetic random access memory device according to claim 25, wherein the plurality of first current sources to be controlled by the control circuit have an equal current supply capability.

27. The magnetic random access memory device according to claim 25, wherein the plurality of first current sources to be controlled by the control circuit have different current supply capabilities.

28. The magnetic random access memory device according to claim 20, wherein the second driver circuit has a plurality of second current sources, and the second setting data is used to control operations of some of the plurality of second current sources, and the control circuit controls operations of others of the plurality of second current sources on the basis of the second setting data to switch the amount of second write current.

29. The magnetic random access memory device according to claim 28, wherein the plurality of second current sources to be controlled by the control circuit have an equal current supply capability.

30. The magnetic random access memory device according to claim 28, wherein the plurality of second current sources to be controlled by the control circuit have different current supply capabilities.

* * * * *